(12) United States Patent
Benedict et al.

(10) Patent No.: US 10,763,422 B2
(45) Date of Patent: Sep. 1, 2020

(54) COMPOSITE ARTICLE WITH CO-PLANAR ELECTRODES

(71) Applicant: Eastman Kodak Company, Rochester, NY (US)

(72) Inventors: Roberta Dileo Benedict, Rochester, NY (US); Kurt D. Sieber, Rochester, NY (US); J. Lanny Tucker, Scottsville, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 378 days.

(21) Appl. No.: 15/841,628

(22) Filed: Dec. 14, 2017

(65) Prior Publication Data

US 2019/0189892 A1 Jun. 20, 2019

(51) Int. Cl.
| | |
|---|---|
| *H01L 41/18* | (2006.01) |
| *H01L 41/193* | (2006.01) |
| *H01L 41/047* | (2006.01) |
| *C08K 7/18* | (2006.01) |
| *C08K 3/34* | (2006.01) |
| *C08K 3/08* | (2006.01) |
| *C08L 75/04* | (2006.01) |
| *C08K 7/06* | (2006.01) |
| *C08K 7/00* | (2006.01) |

(Continued)

(52) U.S. Cl.
CPC ............ *H01L 41/0478* (2013.01); *C08K 3/08* (2013.01); *C08K 3/34* (2013.01); *C08K 7/00* (2013.01); *C08K 7/06* (2013.01); *C08K 7/18* (2013.01); *C08L 29/14* (2013.01); *C08L 35/02* (2013.01); *C08L 39/06* (2013.01); *C08L 65/00* (2013.01); *C08L 75/04* (2013.01); *H01L 41/0471* (2013.01); *H01L 41/0477* (2013.01); *C08G 2261/1424* (2013.01); *C08G 2261/3223* (2013.01); *C08G 2261/794* (2013.01); *C08K 2003/0806* (2013.01); *C08K 2003/0862* (2013.01); *C08K 2201/001* (2013.01); *C08K 2201/011* (2013.01); *C08L 25/08* (2013.01); *C08L 2203/20* (2013.01); *C08L 2205/18* (2013.01)

(58) Field of Classification Search
CPC .. H01L 41/193; H01L 41/0477; H01L 41/183
USPC ........................................................ 310/365
See application file for complete search history.

(56) References Cited

U.S. PATENT DOCUMENTS

| | | |
|---|---|---|
| 5,478,705 A | 12/1995 | Czekai et al. |
| 6,469,421 B1 | 10/2002 | Wakabayashi et al. |

(Continued)

OTHER PUBLICATIONS

Sana Krichen and Pradeep Sharma, "Flexoelectricity: A Perspective on an Unusual Electromechanical Coupling," Journal of Applied Mechanics, Mar. 2016, vol. 83/030801, pp. 1-5.

(Continued)

*Primary Examiner* — Derek J Rosenau
(74) *Attorney, Agent, or Firm* — J. Lanny Tucker

(57) ABSTRACT

A composite article has 1) a dry piezoelectric layer, and 2) a pair of non-electrically-connected co-planar patterned electrodes that are arranged contiguously with an opposing surface of the dry piezoelectric layer. Each electrode essentially has (a) an electrically-conductive material; and (b) particles having a Young's modulus that is different from the Young's modulus of the (a) electrically-conductive material by at least 10%.

19 Claims, 43 Drawing Sheets

(51) Int. Cl.
  *C08L 39/06* (2006.01)
  *C08L 65/00* (2006.01)
  *C08L 29/14* (2006.01)
  *C08L 35/02* (2006.01)
  *C08L 25/08* (2006.01)

(56) References Cited

U.S. PATENT DOCUMENTS

| | | |
|---|---|---|
| 7,441,717 B1 | 10/2008 | Majka et al. |
| 7,791,248 B2 | 9/2010 | Cross et al. |
| 7,850,814 B2 | 12/2010 | Majumdar et al. |
| 8,828,275 B2 | 9/2014 | Wang et al. |
| 9,085,699 B2 | 7/2015 | Wang et al. |
| 2009/0162706 A1* | 6/2009 | Okamura ........... G01N 27/4073 429/468 |
| 2010/0288849 A1* | 11/2010 | Okamura ........... F02M 51/0603 239/102.2 |
| 2010/0320876 A1* | 12/2010 | Dernovsek ........... H01L 41/0477 310/364 |
| 2013/0127299 A1* | 5/2013 | Kim ........... H01L 41/183 310/364 |

OTHER PUBLICATIONS

D. Faust and R. S. Lakes, "Reciprocity failure in piezoelectric polymer composite," Department of Materials Science, Department of Engineering Physics, University of Wisconsin, Sep. 9, 2015.

Vincent A. Hackley and Chiara F. Ferraris, "The Use of Nomenclature in Dispersion Science and Technology," National Institute of Standards and Technology, Technology Administration U.S. Department of Commerce, Special Publication 960-3, Aug. 2001.

Ajit Jillavenkatesa, et al., "Particle Size Characterization," National Institute of Standards and Technology, Technology Administration U.S. Department of Commerce, Special Publication 960-1, Jan. 2001.

* cited by examiner

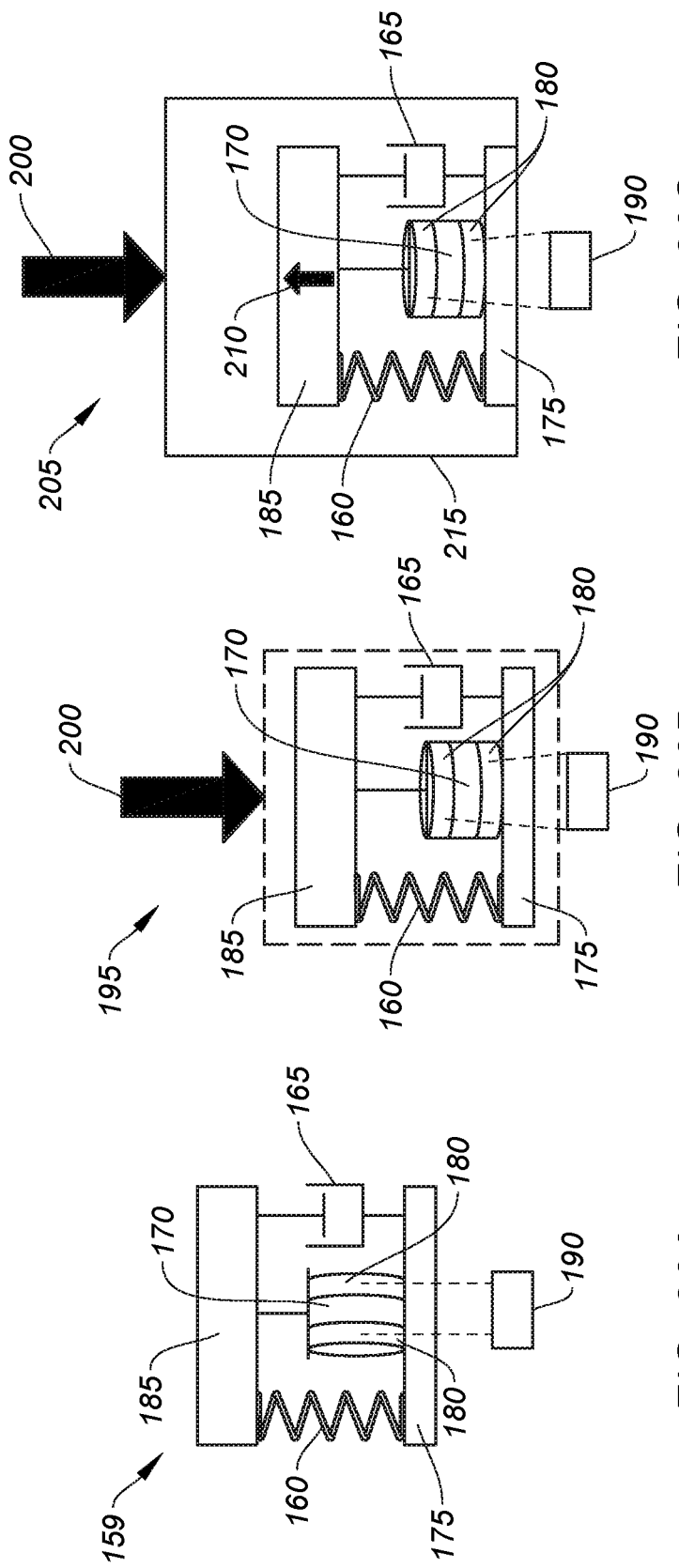

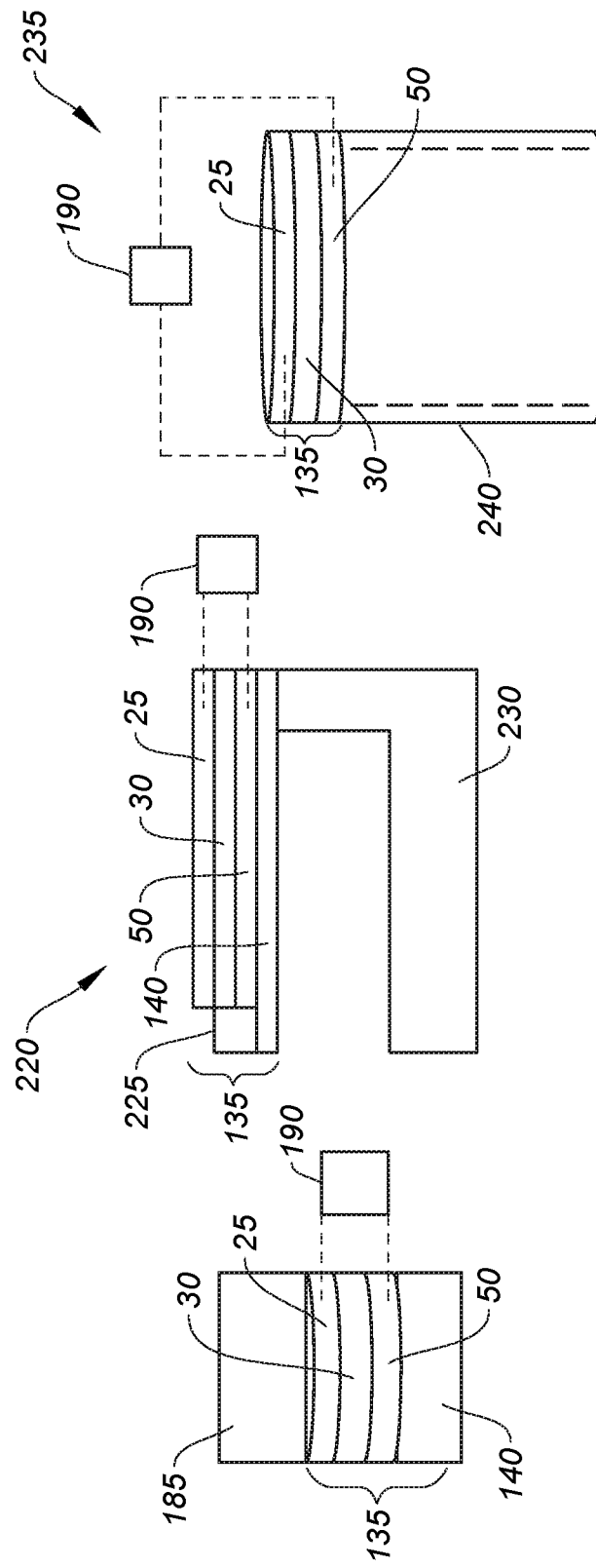

COMPOSITE ARTICLE WITH CO-PLANAR ELECTRODES

RELATED APPLICATIONS

Reference is made to the following commonly assigned and co-filed patent applications:

U.S. Ser. No. 15/841,459, filed on Dec. 14, 2017, by Benedict and Sieber, and entitled "Electrically-conductive Compositions";

U.S. Ser. No. 15/841,483, filed on Dec. 14, 2017, by Benedict and Sieber, and entitled "Silver-containing Electrically-conductive Compositions";

U.S. Ser. No. 15/841,519, filed on Dec. 14, 2017, by Benedict and Sieber, and entitled "Piezoelectric Composite Articles";

U.S. Ser. No. 15/841,583, filed on Dec. 14, 2017, by Benedict and Sieber, and entitled "Composite Article with Dielectric Layer";

U.S. Ser. No. 15/841,610, filed on Dec. 14, 2017, by Benedict, Sieber, and Tucker, and entitled "Piezoelectric Article with Dielectric Layer and Co-Planar Electrodes";

U.S. Ser. No. 15/841,655, filed on Dec. 14, 2017, by Sieber and Benedict, and entitled "Piezoelectric Capacitor";

U.S. Ser. No. 15/841,677, filed on Dec. 14, 2017, by Sieber and Benedict, and entitled "Piezoelectric Capacitor with Co-Planar Patterned Electrodes";

U.S. Ser. No. 15/841,706, filed on Dec. 14, 2017, by Sieber and Benedict, and entitled "Kinetic Piezoelectric Capacitor with Co-Planar Patterned Electrodes";

U.S. Ser. No. 15/841,731, filed on Dec. 14, 2017, by Sieber and Benedict, and entitled "Inertial Piezoelectric Capacitor with Co-Planar Patterned Electrodes";

U.S. Ser. No. 15/841,761, filed on Dec. 14, 2017, by Sieber and Benedict, and entitled "Kinetic Piezoelectric Device";

U.S. Ser. No. 15/841,796, filed on Dec. 14, 2017, by Sieber and Benedict, and entitled "Inertial Piezoelectric Device"; and U.S. Ser. No. 15/841,827, filed on Dec. 14, 2017, by Benedict and Sieber, and entitled "Method for Providing Piezoelectric Devices."

FIELD OF THE INVENTION

This invention relates to a composite article that can be used to provide improved piezoelectric effects. This composite article has a piezoelectric layer and a pair of non-electrically-connected co-planar patterned electrodes arranged contiguously with an opposing surface of the piezoelectric layer. One or more of the electrodes contains unique (b) particles to provide the improve piezoelectric effect.

BACKGROUND OF THE INVENTION

Piezoelectric materials are materials that can generate charge and provide voltage when placed under mechanical stress ("piezoelectric effect"), and conversely can be deformed under an applied electrical field (the "converse piezoelectric effect"). In general, piezoelectric materials exhibit these two reciprocal effects characterized by the piezoelectric constants "d" and "g", respectively. Commonly made piezoelectric constant measurements include the "$D_{33}$" piezoelectric charge coefficient (or "$d_{33}$", in units of picocoulombs per Newton, pC/N) and the "$G_{33}$" piezoelectric voltage coefficient (or "$g_{33}$", in units of pm/V). These piezoelectric coefficients express the piezoelectric response of a material when stress or voltage is applied parallel to the crystallographic c-axis of the piezoelectric material or parallel to the poling direction of the piezoelectric layer and the material response is also measured along to the crystallographic c-axis of the piezoelectric material or along the poling direction of the piezoelectric layer.

Piezoelectric devices have many applications such as for high voltage generation (for example, as gas lighters producing a spark), microactuators, microbalances, acoustic generators (including ultrasound generators), vibration sensors, and other devices known in the art.

A common piezoelectric material is lead zirconate titanate (PZT) but as one might suspect, such material raises both environmental and public health concerns relating to both production and use because of the presence of lead. U.S. Pat. No. 6,469,421 (Wakabayashi et al.) describes the use of a layer of ultra-fine particles of the same material in a PZT piezoelectric layer. While lead zirconate titanate performs well, it has proven difficult in recent years to find materials with comparable performance so that PZT can be replaced. It is also difficult to make either thick or thin film piezoelectric devices of high sensitivity, and thus, efforts are being undertaken to find improved materials without the presence of lead.

A study of reciprocity effects using a layer of loose tin particles on the surface of a piezoelectric device (transducer) comprised of poly (vinylidene fluoride) (PVDF) that is a piezoelectric material is reported by Faust and Lakes in *Physica Scripta* 90 085807 (2015). While the work of these investigators suggests that non-uniform stress fields may change the piezoelectric charge constant $d_{33}$, their approach was to use a loose powder on the surface of the piezoelectric material. This loose powder can be readily dislodged from the piezoelectric layer and any change in $d_{33}$ is thereby diminished or lost entirely. Thus, the transducer they proposed is mechanically unstable and impractical for any industrial use.

Flexoelectric piezoelectric composites are described in U.S. Pat. No. 7,791,248 (Cross et al.) as having unique shapes in order to modify the electrical signals obtained from applied forces. The materials described in this patent are rigid bodies and the teaching does not lead itself to using flexible materials. In addition, flexoelectric effects are generally smaller than piezoelectric effects, as noted by Krichen and Sharma in the *J. Appl. Mech.* 83, 030801-1 to 030801-5 (2016).

It is recognized by those skilled in the art of piezoelectric materials that piezoelectric polymers (such as PVDF), in general, have lower piezoelectric coefficients than crystalline inorganic piezoelectric materials such as PZT and that the lower piezoelectric coefficients of piezoelectric polymers have hampered the development of uses for these materials. Many uses of piezoelectric materials will benefit from any method for improving the piezoelectric constants (for example, the $d_{33}$ piezoelectric charge coefficients) of the material. Thus, there is a need for improved piezoelectric materials, methods of improving the piezoelectric coefficient of piezoelectric materials, improved methods of packaging piezoelectric materials to enhance the piezoelectric coefficients of the piezoelectric materials, and improved devices containing piezoelectric materials with enhanced piezoelectric coefficients.

Particularly, it is desirable to increase the magnitude of the fundamental piezoelectric coefficients $d_{33}$, $d_{31}$, or any other piezoelectric coefficients in order to improve the overall performance of devices that utilize this piezoelectric coefficient for operation.

SUMMARY OF THE INVENTION

The present invention provides a composite article comprising:

1) a first dry piezoelectric layer (first dry PL) comprising a piezoelectric material and having first and second opposing surfaces, and 2) a pair of non-electrically-connected co-planar patterned electrodes that are arranged contiguously with at least one of the first and second opposing surfaces of the first dry PL, each of the pair of non-electrically-connected co-planar patterned electrodes consisting essentially of:

(a) an electrically-conductive material; and
(b) particles distributed within the (a) electrically-conductive material, the (b) particles having a Young's modulus that is different from the Young's modulus of the (a) electrically-conductive material by at least 10%, and which (b) particles have a d50 of at least 500 nm and up to and including 500 μm and a polydispersity coefficient of less than or equal to 3, provided that the weight ratio of the (b) particles to the (a) electrically-conductive material is at least 0.01:1 and up to and including 10:1, provided that the weight ratio of the (b) particles to the (a) electrically-conductive material is at least 0.01:1 and up to and including 10:1;

provided that:

when each of the pair of non-electrically-connected co-planar patterned electrodes is arranged adjacent to an insulating substrate, it exhibits a resistivity of less than 10,000 ohms-cm, and optionally, each of the pair of non-electrically-connected co-planar patterned electrodes further includes (c) a binder material that is non-electrically-conductive and has a weight average molecular weight of at least 5,000.

The electrically-conductive (EC-P) compositions prepared according to the present invention enable inventive methods to prepare inventive composite articles (or composite electrodes) and devices having an improved piezoelectric charge coefficient $d_{33}$. Particularly, the inventive compositions, composite articles, and methods of use provide a simple means for improving the $d_{33}$ piezoelectric charge coefficient of both piezoelectric polymers and piezoelectric ceramics for use in various devices. Thus, the present invention can provide piezoelectric devices such as energy harvesters, capacitors, and sensors comprised of piezoelectric materials and electrodes that exhibit improved responses.

Approaches in the prior art to improve the performance of piezoelectric devices concentrate on collecting charge from the direction of the largest piezoelectric coefficient that is accessible given the geometry of a device (meaning the actual architecture of the device and how it is poled). This is exemplified in the use of interdigitated electrode architectures in many known piezoelectric devices. These specialized electrode architectures as currently practiced in the art do not affect the fundamental piezoelectric coefficients of the piezoelectric materials used in device construction. An advantage of the present invention, particularly the composite article structure, is the ability to directly manipulate and improve the piezoelectric charge coefficient $d_{33}$ of a device without depending upon its structure. This is fundamentally different from articles of the prior art that have been reduced to practice by direct measurement of the fundamental piezoelectric charge coefficient $d_{33}$ for different composite electrode structures.

Specifically, it has been discovered that an inventive composite article (or electrode) design including a dry piezoelectric layer (PL) and one or more layers or co-planar electrodes containing (b) particles (described below), and devices prepared from such composite articles can enhance the piezoelectric response of piezoelectric materials measured in terms of $d_{33}$. In some embodiments, the inventive composite article design comprises one or more dry electrically-conductive layers (dry ECL-P's) containing a novel electrically-conductive EC-P composition comprising required (b) particles of certain characteristics and having a different Young's modulus different from the one or more (a) electrically-conductive materials that are used in the dry ECL-P (electrode) to collect the charge generated by the dry piezoelectric layer (dry PL).

In other embodiments, a dry PL is used with at least one dry dielectric layer (dry DL-P) containing (b) particles as described below.

In many embodiments, the EC-P compositions are used to provide uniform layers, but in some embodiments, non-electrically-connected co-planar patterned electrodes can be prepared from an EC-P composition and such electrodes are not uniform layers and are not electrically connected to each other. Yet, these non-electrically-connected co-planar patterned electrodes also contain the (b) particles as defined below.

Details of the noted (b) particles are provided below. In some embodiments, the (b) particles are non-compressible but in other embodiments, they are elastic and compressible. Moreover, the (b) particles can be either insulating or electrically-conductive. In embodiments using silver nanoparticles as the electrically-conductive material, the d50 of the (b) particles is greater than the d50 of those silver nanoparticles.

Without being limited to a particular mechanism or theory, it is believed that the function of the (b) particles is to affect the distribution of stress within the dry piezoelectric layer (dry PL) upon application of force to a dry ECL-P or dry DL-P surface or to the surface of non-electrically-connected co-planar patterned electrodes containing (b) particles, thereby affecting the magnitude of the piezoelectric effect as measured as $d_{33}$. It is believed that when the dry ECL-P, dry DL-P, or non-electrically-connected co-planar patterned electrode network is flexible and deformable during application of stress (force), the stress distribution propagated throughout that network to the dry PL is primarily determined by the nature of the (b) particles and their distribution within the dry ECL-P, dry DL-P, or non-electrically-connected co-planar patterned electrodes.

While it is possible for the outermost composite article surface to be "rough" and textured, it is not necessary for this to be the case from the presence of the (b) particles themselves. Rather, the change in the piezoelectric charge coefficient $d_{33}$ of the dry PL is brought about mainly by the stress localization caused by the non-uniform mechanical properties of the dry ECL-P, dry DL-P, or non-electrically-connected co-planar patterned electrodes (one or more pairs) within the composite article.

Those skilled in the art of piezoelectric materials recognize that the models used to describe the piezoelectric response of a piezoelectric material are based on the thermodynamic conditions where the application of physical force to the PL results in the creation of uniform stress in the dry PL. The presence of (b) particles in a layer adjacent the dry PL provides the potential of non-uniform stress fields in the dry PL during force application and this condition is outside of the scope of the conventional thermodynamic models. Since the conditions where the dry PL is under non-uniform stress fall outside of those described by accepted thermodynamic based models that are familiar to those skilled in the art of piezoelectric materials, the response of a given dry PL with a given dry ECL-P, dry DL-P, or non-electrically-connected co-planar patterned electrodes that are used to produce non-uniform stress in the dry PL is, therefore, unpredictable by accepted theory and cannot be suggested in any known art.

The unique embodiments of the present invention were ably demonstrated by disposing either an electrically-conductive EC-P composition or dielectric layer composition (D-P composition) containing (b) particles over one or both supporting surfaces of a dry PL comprised of a suitable piezoelectric material. It is believed that other methods can be used to create the inventive composite articles but the use of an electrically-conductive EC-P or D-P composition described herein can be especially useful for simple manufacturing methods.

BRIEF DESCRIPTION OF THE DRAWINGS

FIGS. 30a, 30b, and 30c are schematic diagrams of electromechanical models for devices containing a composite article according to the present invention.

FIGS. 31a, 31b, and 31c are schematic diagrams of kinetic and inertial piezoelectric devices.

DETAILED DESCRIPTION OF THE INVENTION

Figure 1:
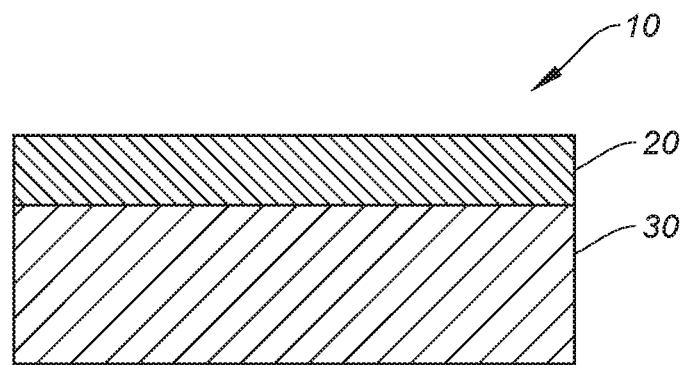
FIG. 1 is a schematic cross-sectional representation, not to scale, of a prior art composite article comprising a dry PL and a dry ECL.

The following discussion is directed to various embodiments of the present invention and while some embodiments can be desirable for specific uses, the disclosed embodiments should not be interpreted or otherwise considered to limit the scope of the present invention, as claimed below. In addition, one skilled in the art will understand that the following disclosure has broader application than is explicitly described for the discussion of any embodiment.

Definitions

As used herein to define various components of each EC-P composition, D-P composition, dry piezoelectric layer (PL), dry electrically-conductive layer (ECL or ECL-P), dry dielectric layer (DL-P), discontinuous coplanar patterned electrodes, and other materials used in the practice of this invention, unless otherwise indicated, the singular forms "a," "an," and "the" are intended to include one or more of the components (that is, including plurality referents).

Unless otherwise indicated, the piezoelectric layers, electrically-conductive layers (with or without (b) particles), dielectric layers (with or without (b) particles), non-electrically-connected co-planar patterned electrodes (with or without (b) particles), are meant to reference the "dry" form of such layers or electrodes, meaning that any solvents in their formation have been substantially (at least 95% of original solvent weight) removed. It is understood that for some features of such layers or electrodes, the "wet" form can be the same as the "dry" form, but in practice, it is the dry form of such layers or electrodes that demonstrate the advantages of the present invention. Thus, identifiers of such layers, such as PL, ECL-P, and others, are meant to be the same as PL, ECL-P, and others, respectively.

Each term that is not explicitly defined in the present application is to be understood to have a meaning that is commonly accepted by those skilled in the art. If the construction of a term would render it meaningless or essentially meaningless in its context, the term should be interpreted to have a standard dictionary meaning.

The use of numerical values in the various ranges specified herein, unless expressly indicated otherwise, are considered approximations as though the minimum and maximum values within the stated ranges were both preceded by the word "about." In this manner, slight variations above and below the stated ranges may be useful to achieve substantially the same results as the values within the ranges. In addition, the disclosure of these ranges is intended as a continuous range including every value between the minimum and maximum values as well as the end points of the ranges.

As used herein to define the (b) particles, "non-compressible" means each (b) particle has a Young's modulus equal to or greater than the Young's modulus of the electrically conductive layer without particles (ECL).

As used herein, "dry ECL" refers to a dry electrically-conductive layer that does not contain (b) particles as are defined herein below. Such dry ECL's are prepared from electrically-conductive compositions that are outside the scope of the present invention but which comprise at least an (a) electrically-conductive material and optionally a (d) binder material as described below.

As used herein, "dry ECL-P" refers to a dry electrically-conductive layer prepared according to the present invention comprising the essential (b) particles described below. Such dry ECL-P must also comprise an (a) electrically-conductive material, and optionally a (d) binder material as described below.

As used herein, "dry DL-P" refers to a dry dielectric layer prepared from a dielectric (D-P) composition according to the present invention comprising the essential (b) particles described below, and at least one dielectric material.

As used herein, the term "non-electrically-connected co-planar patterned electrodes" refers to two or more (a pair) dry electrically-conductive electrodes that are arranged in the same plane in a patternwise fashion, and which comprise at least an (a) electrically-conductive material, and optionally (b) particles or (d) binder material, as described below. Such "dry electrodes" are thus arranged in a predetermined pattern as opposed to a uniform layer as is the case for the dry ECL and dry ECL-P described herein. Certain embodiments of such non-electrically-connected co-planar patterned electrodes are described below in reference to FIGS. 39-42.

As used herein to describe the relationship of various layers the term "contiguously with" means that such layers are arranged in a relationship so that they are adjacent. The term does not mean that they are necessarily directly adjacent or in physical contact with each other, although such physical contact can be present.

Young's modulus is a well-known physical parameter that is also known as the elastic modulus, and is a measure of the stiffness of a solid material. It is a mechanical property of solid materials, and defines the relationship between stress (force per unit area) and strain in the elastic deformation region of such solid materials. It can be measured as the ratio of stress along an axis to the strain (ratio of deformation over initial length) along that axis in the range in which elastic behavior is observed and where Hooke's law holds. It can be measured using known equipment and mathematical calculations.

As used herein, particle size is defined using the terms "d50" and "d90" that refer to equivalent spherical volume diameter of particles at the 50% frequency and 90% frequency point of the volume weighted frequency distribution of the particle size, respectively, and can be determined using a commercially available Horiba Ltd. LA-920 particle size analyzer and instructions. Particle sizing methods and terminology are discussed in NIST special Publication 960-1 entitled "*Particle Size Characterization: NIST Recommended Practice Guide*" and in NIST special Publication 960-3 entitled "*The Use of Nomenclature in Dispersion Science and Technology—NIST Recommended Practice Guide.*" All data presented below is based on volume weighted frequency distributions and the equivalent spherical diameter model. The differences in the particle size distributions of particles will be discussed herein using the median spherical volume diameter of the typical particle size distributions shown in FIGS. 21-24 described below. The median equivalent spherical volume diameter, Dv50, of the particle size distribution has units of length (for example, nanometers or micrometers). The median equivalent spherical volume diameter, Dv50, of the particle size distribution measured and described herein is used interchangeably with the notation "d50" or "d50". The median spherical volume diameter, d50, also has units of length and in the volume weighted frequency distributions measured has interchangeable units of micrometers, or μm.

As used herein, the term "polydispersity coefficient" refers to a numerical quantity describing the relative breadth of a particle size distribution that is calculated from the mean and the standard deviation of a particle size distribution. Polydisperse systems are described on page 3 of NIST Special Publication 960-3 titled "The Use of Nomenclature in Dispersion Science and Technology". This publication defines a polydispersed system that is not monomodal and contains many different particle sizes as follows: "a system may be considered polydisperse if less than 90% of the size distribution (that equals 1.645 σ, where σ is the standard deviation of the size distribution) lies within 5% of the average or mean size of the particles, <d>". The polydispersity coefficient employed here is identical to the metric for polydispersity described in NIST SP960-3 and is calculated using the following formula:

$$\frac{1.645\sigma}{\langle d \rangle}$$

wherein <d> is taken as the mean value spherical equivalent volume diameter of the particle size distribution as determined by instrument employed for the particle size distribution measurement.

Unless otherwise indicated, "N" refers to Newtons.

Uses

There are various uses of the composite articles prepared according to the present invention and their incorporation into piezoelectric devices including but not limited to, ignitors for various burners; energy harvesters including those that harvest energy from animal or human bodies or from vibrating machines; piezoelectric transformers; sensors such as for piezoelectric microphones and ultrasonic transducers; actuators; elements for detection and generation of sonar waves; devices for monitoring power; pressure sensors; and tactile sensor applications.

The following TABLE I presents a non-exhaustive list of sensors and applications for the composite articles according to this invention.

TABLE I

| Sensor type and application | Comments |
|---|---|
| Acoustic wave detection sensor | Sensor element for construction of microphones, particularly microphones that detect contact with a surface |
| Ultrasonic detector sensor | Frequency response as low as 1 Hz and greater than 100 kHz; pick-up sensor for non-destructive testing with acoustic waves |
| Hydrophone sensor | Underwater acoustic sensing with sensitive flexible transducers for example, tsunami detection, excellent acoustic impedance match to water |
| Sonar sensor | Underwater imaging using mechanically flexible transducers with excellent acoustic impedance match to water |
| Medical instrumentation sensors | Enhanced sensitivity of for example, pressure sensitive catheters, CPAP machines, and others |
| Pedobarography sensor | Force sensors with enhanced sensitivity for biomechanical analysis of gait, posture, and foot contours |
| Medical echography sensor | Enhanced sensitivity for diagnostic imaging with ultrasound devices |
| Blood pressure sensor | High force sensitivity with potential for miniaturization |
| Robotics sensor | Artificial sensitive skin and force sensors |
| Pressure sensor | Direct and indirect sensing of pressure and distribution of pressure on surfaces |
| Security devices | Intruder detection using vibration and impact; and for example, keypads for keyless locks |
| Vibration sensors | Direct and indirect detection of vibrations with optional frequency selectivity |
| Strain sensors | Direct and indirect detection of sudden strain with optional frequency selectivity |
| Detection of localization of impacts sensor | Failure analysis and impact imaging |
| Accelerometer sensor | Miniaturized inertial and kinetic devices for sensing acceleration and acceleration direction |
| Keyboard key touch sensor | Enhanced human touch sensitivity |
| Human touch force sensors/human tactile sensors | Enhanced human touch sensitivity |
| Force sensing in capacitive touch sensors | Enhanced human touch sensitivity in 3D capacitive touch sensor applications |
| Sport and leisure contact sensor | For example, a tennis court boundary line to detect the impact location of tennis ball |
| Electrical switches | Force sensitive piezoelectric voltage is used to as a switch signal for electrical circuitry |
| Force sensitive transistors | Force sensitive piezoelectric voltage is used to open and close the transistor gate |
| Microgenerator | Electrical power generated and stored is proportional to time integrated force |

EC and EC-P Compositions

Chemical formulations or compositions used to design both dry ECL's and dry ECL-P's are now described. One or more of each or both types of electrically-conductive layers can be present in a composite article according to the present invention. An electrically-conductive composition without (b) particles is known herein as an EC composition, while an electrically-conductive composition containing (b) particles is known herein as an EC-P composition. Thus, an EC composition and an EC-P composition, as well as dry ECL and dry ECL-P, differ at least in that the EC-P composition and dry ECL-P contain one or more types of (b) particles as described below, and the EC and dry ECL contain none of such (b) particles. However, all other components and features of compositions and layers can be the same or different.

Such EC compositions and EC-P compositions can also be used to provide discontinuous co-planar patterned electrodes that are described in more detail below.

Electrical conductivity of an EC composition or EC-P composition is necessary for effective use with a piezoelectric material and in such device. In other words, each composite article is designed to function with one or more dry "electrodes" derived from an EC composition or EC-P composition.

In general, each type of electrically-conductive composition exhibits an electrical resistivity, when applied and dried (or contiguously arranged) on an insulating substrate (such as glass reinforced epoxy laminate sheets (PCB)), of less than 10,000 ohms-cm, or less than 500 ohms-cm, or even less than or equal to 150 ohms-cm.

According to the present invention, each useful EC-P composition consists essentially of the following three essential components for the purposes of the invention: (a) one or more electrically-conductive materials as defined below; one or more types of (b) particles as defined below; and (c) one or more binders as defined below; and optionally, (d) a solvent medium as defined below, all in the defined amounts to provide desired formulations of the inventive EC-P compositions. The definitions below will make clear that (a) and (c) could be the same material and that some precursors to (c) could act also as (d).

In general, the EC-P compositions typically have a viscosity that is designed for an intended use or means of application to form a composite article. Such a viscosity can be readily determined for a given combination of composition components and intended use by one skilled in the art using the teaching provided herein. For example, the EC-P composition viscosity can be designed for its optimal application to a dry PL, as either a uniform layer or in a predetermined pattern, using suitable printing or coating means and apparatus including but not limited to, inkjet printing, screen printing, gravure printing of any type, precision fluid dispensing, or electrostatic spraying, using equipment and procedures that would be readily apparent to one skilled in the art.

(a) Electrically-Conductive Materials:

The essential (a) electrically-conductive materials are generally materials with high charge mobility. They can be particulate or non-particulate, polymeric or non-polymeric, organic or inorganic, solid or liquid, and mixtures of any or multiple types of these materials can be present in a composition used to prepare an EC or EC-P composition.

In general, such (a) electrically-conductive materials exhibits an electrical conductivity of at least $2 \times 10^{-4}$ S/m as measured using standard techniques known in the art of electrical measurement. The electrical conductivity is the reciprocal of the electrical resistivity for a material. When an electrically conductive material is coated on a substrate as a film then the electrical resistance of the film can be measured using a 4-probe method to determine the sheet resistance of the film. Suitable 4 probe methods for measuring sheet resistance include linear 4 probe methods where the current is passed between two outer contacts and the voltage generated by the current passing through the sample is measured by two additional contacts located between the outer contacts. The well-known Van der Pauw 4 probe method was used herein. The Van der Pauw 4 probe method can be used to measure the sheet resistance of uniform electrically conducting films where the area covered by the film can have an arbitrary shape. The electrical resistivity of the film can be determined by dividing the sheet resistance by the thickness of the film. The film thickness can be measured by any suitable method including optical methods such as interferometry or microscopy, or by other methods such as contact profilometry. If mixtures of different types of (a) electrically-conductive materials are used in the composition, the cumulative mixture can exhibit the desired electrical conductivity.

For example, useful particulate (a) electrically-conductive materials include but are not limited to, electrically-conductive metallic particles, alloys, inorganic or organic metal complexes, or composite materials, such as those comprising silver, gold, titanium, platinum, palladium, copper, nickel, iron, silver coated copper, silver coated nickel, indium, gallium and its alloys, and aluminum, various types or forms of electrically-conductive carbon including graphite, graphene, buckyballs, and single- or multi-walled nanotubes, which can be supplied as dispersions, pastes, or colloidal suspensions of the electrically-conductive metal or electrically-conductive metal-containing particles. Pure metal flakes, fibers, or particles can be used. Such particulate electrically-conductive metallic materials can be of any desired shape or particle size but in most instances, they have a median equivalent spherical volume diameter of at least 1 nm and up to and including 1000 µm or of at least 1 µm and up to and including 100 µm, or a median largest dimension of less than 100 µm.

In general, when the (a) electrically-conductive materials are in particulate form as noted above, they have a polydispersity coefficient of less than or equal to 3, or less than or equal to 2, or even less than or equal to 1.2. For example, silver nanoparticles (described below) that are useful as (a) electrically-conductive materials can have a polydispersity coefficient that is less than 1.2.

Electrically-conductive organic materials such as electrically-conductive organic polymers can also be used, individually or in mixtures, as (a) electrically-conductive materials. Examples of such electrically-conductive organic polymers include but are not limited to, substituted or unsubstituted pyrrole-containing polymers, substituted or unsubstituted thiophene-containing polymers, and substituted or unsubstituted aniline-containing polymers such as those described in Cols. 9-10 of U.S. Pat. No. 7,850,814 (Majumdar et al.) and references noted therein, the disclosure of which patent is hereby incorporated herein by reference. One or more of these electrically-conductive organic polymers can also serve as a (d) binder material as that is defined below so that in such embodiments, a separate (d) binder material can be present or absent from the EC or EC-P composition when one or more electrically-conductive organic polymers are present.

Another class of useful (a) electrically conducting materials are polyelectrolytes that can be solids or liquids at ambient conditions and where the electrical conduction is primarily by anion and cation transport. Polyelectrolyte electrically-conductive materials can easily be combined with other (a) electrically-conductive materials described herein.

Particularly useful (a) electrically-conductive materials include metallic nanoparticles such as silver nanoparticles that can be prepared or purchased and used as aqueous dispersions. For example, U.S. Pat. No. 8,828,275 (Wang et al.) and U.S. Pat. No. 9,085,699 (Wang et al.) describe procedures for preparing dispersions of silver nanoparticles, the disclosures of both of which are hereby incorporated herein by reference. A representative method for preparing a dispersion of silver nanoparticles for use as an (a) electrically-conductive material according to the present invention is described below in Comparative Example 1.

Other useful particulate (a) electrically-conductive materials include electrically conductive inks such as the silver nanoparticle-containing "inks" that are commercially available from NovaCentrix that were incorporated into the EC compositions used below in Comparative Examples 2-4.

Silver nanoparticles are useful in the practice of this invention as (a) electrically-conductive materials, and they can have a d50 of less than or equal to 60 µm or of at least 1 nm and up to and including 230 nm, and a d90 of less than or equal to 500 µm or of less than or equal to 300 µm.

As one skilled in the art would recognize, a mixture of (a) electrically-conductive materials can comprise one or more electrically-conductive organic polymers as well as one or more types of electrically-conductive metallic particles. For example, a useful mixture can comprise a polythiophene material with silver nanoparticles, in suitable weight proportions. In such embodiments, the polythiophene material can also serve as a (d) binder material as such materials are described below.

The amount of one or more (a) electrically-conductive materials in the EC or EC-P composition can be at least 2 weight % and up to and including 99 weight %, or at least 5 weight % and up to and including 80 weight %, or more likely at least 60 weight % and up to and including 75 weight %, based on the total weight of the composition (including both solids and liquids). The amount of (a) electrically-conductive materials in an EC-P composition can be the same or different as in an EC composition due to the presence of the (b) particles in the EC-P composition.

(b) Particles:

The essential (b) particles used in the practice of the present invention can be composed of various materials and have various shapes and size distribution. A critical feature is that the Young's modulus of the (b) particles used in the EC-P composition must be different from the Young's modulus of the (a) electrically-conductive materials by at least 10% (±10% of this value), or more particularly by at least 20% (±20%). Typically, this means that the chemical composition of the (b) particles is also different from that of the (a) electrically-conductive materials in the EC-P composition.

The (b) particles generally have a d50 of at least 500 nm and up to and including 500 or more typically of at least 1000 nm and up to and including 250 µm. The d50 value for spherical particles is of course their median equivalent spherical volume diameter, but in most instances, the (b) particles are not perfectly spherical, even though the d50 can be measured as described above. In many instances, the true d50 is not always known from commercial product information (such as physical dimensions of various shaped materials). The (b) particle d50 can be the same as or different from the d50 of particulate (a) electrically-conductive materials. In most embodiments, the respective d50 of particulate (a) electrically-conductive material and (b) particles differ by at least an order of magnitude and the d50 of particulate (a) electrically-conductive material can be significantly smaller than the d50 of the (b) particle.

Moreover, the (b) particles used in the practice of this invention generally have a polydispersity coefficient of less than or equal to 3, less than or equal to 1.5, or even less than or equal to 1.25.

The (b) particles can be composed of one or more polymeric materials (homopolymers or copolymers) and mixtures of different polymeric particles can be used if desired. Particles composed of elastomeric (compressible) polymers are useful as well as solid non-elastic (non-compressible) particles. They can be crosslinked or non-crosslinked. In some embodiments, the (b) particles are cores-shell particles that have a core that is comprised of a material (such as a polymer) that is different from the material (such as a polymer) comprising the shell.

Hollow polymeric particles are also useful. For example, microspheres (or "hollow beads") can comprise a thermoplastic shell that is either hollow inside or encloses a hydrocarbon or low boiling liquid such as isopentane or isobutane. Particles of this type are available as EXPANCE® microspheres from Akzo Noble Industries. In addition, Dualite and Micropearl polymeric microspheres are commercially available from Pierce and Stevens Corporation. Hollow plastic pigments can also be used.

The (b) particles can be completely solid (non-porous) or they can be porous with micropores or nanopores scattered throughout the particle volume, including the particle surface. The pores can be discrete (non-connected) or interconnected to form a porous network. Useful porous particles having discrete pores essentially within the particle and methods for making them are described for example in U.S. Pat. No. 8,110,628 (Nair et al.), the disclosure of which is hereby incorporated by reference.

In addition, the (b) particles can have the same or different chemical composition or Young's modulus as the PL as described below.

The (b) particles can be electrically-conductive, semiconductive, or insulating (dielectric) as those terms are known in the art. Thus, the (b) particles can have the same or different electrical conductivity as the (a) electrically-conductive materials present in the EC-P composition as long as the respective Young's moduli are different.

Representative (b) particles are described in the various Invention Examples shown below and many useful (b) particles can be purchased from a variety of commercial sources or they can be prepared using known procedures and starting materials especially where the (b) particles are polymeric in content.

The amount of (b) particles in an EC-P composition is generally greater than 0 volume % and up to and including 88 volume %, or more likely at least 8 volume % and up to and including 50 volume %, all based on the total wet volume of the EC-P composition. The amount of (b) particles can also be defined in a dry weight ratio with the (a) electrically-conductive materials, and this weight ratio of (b) particles to (a) electrically-conductive material is generally at least 0.01:1 and up to and including 10:1 or more likely at least 0.05:1 and up to and including 7:1. It is to be understood that any of such particles or materials can have other incorporated materials that are included in this weight ratio, for example, when the (a) electrically-conductive materials are silver nanoparticles having dispersing material attached to the nanoparticles.

In addition, the (b) particles can be surface modified using polymer brushes or other means to facilitate use of the particles in the EC-P compositions. Graded modulus particles can be used where the particle has a surface coating with a modulus that is different from the bulk of the particle to tune the mechanical properties of the particle under compressive stress.

(c) Binder Materials:

Composite articles can be prepared according to the present invention to comprise a dry ECL-P that can comprise one or more (c) binder materials that are typically soluble or dispersible in a (d) solvent medium described below. Without wishing to be bound by theory, it is thought that the (c) binder materials are generally present to help film-forming capability of the (a) electrically-conductive material in a dry ECL-P. Suitable (c) binder materials can also be added to the EC-P or EC compositions to adjust the rheological properties for a given use. Additionally, (c) binder materials allow improvement of the mechanical and electrical continuity of a friable ECL-P that otherwise would exhibit compromised electrical properties, poor mechanical robustness, and insufficient adhesion. Due to the minimal volume or weight percent of the included (c) binder, it is thought to have negligible effect on $d_{33}$.

Useful (c) binder materials are generally polymeric in nature, meaning that they have a weight average molecule weight of at least 5,000 or even at least 10,000. In most instances, the (c) binder material is a preformed polymeric material, meaning that it was purchased as a polymeric material or manufactured as such before incorporation into the EC-P composition. In many embodiments, the (c) binder materials are "non-electrically conductive" (or insulative), having a volume electrical conductivity, in dry form, of less than $10^{-4}$ S/m as measured by 4 probe conductivity measurements.

While useful EC-P and EC compositions often include one or more (c) binder materials as described above, it also possible for composite articles to be prepared to have a dry ECL-P from which the (c) binder material is absent. Such dry ECL-P would thus be prepared from an EC-P composition consisting essentially of an (a) electrically-conductive material, (b) particles, and a (d) solvent medium.

In other embodiments, as described above, certain (a) electrically-conductive materials can also serve as (c) a binder material so that a separate non-electrically-conductive (c) binder material is not included. The EC-P composition of Invention Example 21 and the composite article of Invention Example 43 described below illustrate such embodiments.

In yet other embodiments, the (c) non-electrically conductive binder material is not a preformed polymer but comprises polymer precursor materials added to the EC-P composition, and the EC-P composition can be treated in such a way that the polymer precursor materials are converted, for example by polymerization, into a suitable polymeric (c) binder material. For example, monomeric materials (such as one or more polyacrylate precursors or monomers) and polymerization initiators can be incorporated into the EC-P composition to form a dry ECL-P, and polymerization is carried out to form a polymeric (c) binder material. The precursor monomeric materials can be polymerized using heat or UV or visible irradiation. The EC-P composition of Invention Example 20 and the composite article of Invention Example 41 described below illustrate such embodiments.

Useful polymeric materials that can be present as preformed (c) non-electrically conductive binder materials can be chosen from many classes of polymeric materials, and mixtures of polymeric materials of different classes can be used if desired. Representative polymeric materials include but are not limited to, polyurethanes (including but not limited to polyether polyurethanes, polyester polyurethanes, and polycarbonate polyurethanes); acrylate polymers (including methacrylate polymers) that typically are derived from one or more ethylenically unsaturated polymerizable (meth)acrylate monomers including esters of acrylic or methacrylic acid, which can be homopolymers or copolymers derived using multiple monomers; polyvinyl acetals such as poly(vinyl butyral); vinylidene fluoride polymers and their copolymers; chlorinated polymers; polyethylene oxide; and radiation curable polymer systems, ionizing or otherwise, including but not limited to polymer precursors to acrylate polymers and free radical initiators.

As one skilled in the art would appreciate, the (c) binder materials or polymeric precursors can be thermally or photochemically curable materials and curing can be achieved after the EC-P composition has been applied.

In general, one or more (c) non-electrically conductive binder materials (polymeric or non-polymeric) can be present in the EC-P composition in an amount of at least 0.05 weight % and up to and including 5 weight %, or at least 0.25 weight % and up to and including 3 weight %, based on the total weight of the EC-P composition.

(d) Solvent Medium:

A solvent medium can be used to formulate the EC or EC-P compositions and typically comprise one or more miscible solvents that do not adversely affect any of the other essential components provided therein, and in which those components can be readily dissolved or dispersed, with the exception of dissolving the (b) particles. In addition, the solvent medium must be useful for the desired viscosity and application means to form a composite article. The solvent medium must be chosen so that it can be removed (for example, evaporated) in a suitable manner in the provision of a dry ECL, dry ECL-P, or dry DL-P. When a (d) solvent medium is present and one or more (c) binder materials are also present, the one or more (c) binder materials are generally dispersible or soluble in the (d) solvent medium. As noted above, some precursors to polymeric (c) binder materials can be monomeric and polymerizable and they can also be in liquid form and can serve as a (d) solvent medium for the EC-P (or EC) composition.

However, as would be readily apparent to a skilled worker who understands the teaching herein about the (b) particles, the (d) solvent medium and (b) particles must be chosen so that the (b) particles are not dissolved to any appreciable extent in the (d) solvent medium. Otherwise, the inventive effect from the presence of the (b) particles would be severely diminished or absent.

In some embodiments, the (d) solvent medium can comprise predominantly water, or even all water, with the possible presence of one or more water-miscible organic solvents. By "predominant," it is meant that at least 70 weight % of the total weight of all solvents is water in such embodiments, for example, where the (a) electrically-conductive material are insoluble in water. In other embodiments, the (d) solvent medium can comprise one or more organic solvents, with or without the presence of water, and such useful organic solvents include but are not limited to, dimethyl formamide (DMF), dimethyl acetamide, isopropyl alcohol, toluene, dipropylene glycol methyl ether, ketones, alcohols, and ethers.

In the ECL-P compositions according to this invention, the amount of the (d) solvent medium can be less than 98 weight %, and more likely at least 4 weight % and up to and including 90 weight %, or up to and including 40 weight %, all based on the total weight of the EC-P composition (or EC composition).

Those skilled in the art of formulations will recognize that the weight percent of (d) solvent medium is often used to adjust a formulation for a particular use. For example, the amount or type of aqueous or organic solvents in the (d) solvent medium can be used to adjust the rheological properties of the composition according to the present invention.

However, it would also be recognized by those skilled in the art of formulation that the amount of (d) solvent medium can also affect the physical properties of the final EC-P composition (or EC composition). For example, the amount or type of (d) solvent medium can also be used to promote adhesion as well as wetting if the EC-P composition (or EC composition) is coated onto a substrate to make a composite article.

In some embodiments, it has been found that the (d) solvent medium can be predominantly non-aqueous in nature and comprise, for example, a polar organic solvent that improves substrate wettability like dimethyl formamide (DMF).

Optional Addenda:

The EC-P compositions according to this invention can optionally include addenda that may help with keeping materials in solution or dispersion, with application operations (such as coating or printing operations), or with adhesion, and substrate wettability. Such materials can include but are not limited to surfactants, biocides, fungicides, viscosity modifiers, defoamers, humectants, anti-corrosion agents, anti-oxidants, radical scavengers, UV stabilizers, co-solvents, chelating agents, plasticizer, dehydration agents, and ionic strength control agents, each in a suitable amount that would be readily determined from routine experimentation or as recommended by commercial vendors. These optional addenda would be included at the minimum effective amounts to provide the necessary function but insufficient to negatively disrupt the necessary electrical continuity of the dry ECL-P. As such optional materials are optional, they could be left out as not being essential to the performance of the essential (a), (b), and (c) binder materials (and in some embodiments, the (d) solvent medium) described above.

Making EC-P and EC Compositions:

To make suitable EC-P compositions according to the present invention, the (a) electrically-conductive material, (b) particles, and optional (c) binder material, can be mixed or dispersed within a suitable (d) solvent medium (or liquid precursors to (c) binder materials) using effective dispersion or stirring techniques and typically at room temperature. As noted above, it is essential that the (b) particles are not dissolved in the (d) solvent medium of choice so the (b) particles provide their inventive effect in the resulting dried layers or patterns. Representative details for making these compositions are provided below in the working examples.

The (a) electrically-conductive material, (b) particles, and (c) binder material if present, and suitable (d) solvent medium can be mixed using any method familiar to those skilled in the art of mixing. In general, the EC-P compositions are prepared by first measuring out the appropriate amount of the (a) electrically-conductive material, (b) particles, and (c) binder material if present, and suitable (d) solvent medium if present. Measuring appropriate amounts of the (a), (b), (c), and (d) components can be accomplished by known methods in the art including measuring by volume or measuring by weight. The measured amounts are mixed so that the (a) electrically-conductive material, (b) particles, and (c) binder material if present, and suitable (d) solvent medium are comingled. Mixing methods include the use of planetary mixers, paddle mixers, centrifugal mixers, stator-rotator mixers, sonication, static mixers, roller mills, 3 roll mills, or any other type of mixer used for preparing mixed compositions. Those skilled in the art of mixing will recognize that composition formulations are frequently adjusted to optimize the uniformity of the mixed composition. The comingled (a) electrically-conductive material, (b) particles, (c) binder material, and (d) solvent medium if present, is contained in a suitable container before use. This container may or may not be the same container used to mix or form the composition.

In the case of EC-P compositions where the (c) binder material is not a preformed polymer, but include precursor materials that are reacted after deposition by any means of radiation curing known to those skilled in the art of radiation cured polymer systems, the factors of heat and radiation exposure must be considered during the composition preparation. It is critical to avoid premature initiation of cross-linking, photocuring, or thermal curing, whether by controlling the temperature of the composition for thermally initiated processes or avoiding electromagnetic radiation exposure until the appropriate and desired time to form the dry ECL-P.

As one skilled in the art would understand and as demonstrated below with the Comparative Examples, an EC composition can be prepared in the same fashion as an EC-P composition but the (b) particles are omitted. The amounts and types of (a) electrically-conductive materials, (d) solvent medium, and (c) binder material, if present, can be determined using routine experimentation and the teaching about such materials provided herein.

In some embodiments, a dry dielectric layer (dry DL-P) containing (b) particles can be used in place of or in addition to a dry ECL-P to achieve the desired improved piezoelectric effect according to the present invention. To obtain a suitable dry DL-P, a D-P composition is formulated similarly to an EC-P composition. In such D-P compositions and dry DL-P's, the (a) electrically-conductive materials described above are not present, and the resulting dry DL-P has a volume conductivity that is less than $10^{-4}$ S/m, or even less than $10^{-10}$ S/m, as measured by 4 probe resistance methods.

Thus, a D-P composition consists essentially of one or more (a') dielectric materials, (b) particles as described above for the EC-P compositions, and a (d) solvent medium as described above for the EC-P compositions.

In such embodiments, the (b) particles used in a D-P composition also have a Young's modulus that is different from the Young's modulus of the (a') dielectric material(s) by at least 10%, or even at least 20%.

(a') Dielectric materials can be used singly or in combination, and can be particulate in form or film-forming polymers. For example, the essential (a') dielectric materials can include, but are not limited to, both organic and inorganic polymers, sol-gel formulations, metal oxide framework solids, siloxanes, silicones, elastomeric materials of all types, including natural rubber, and Alcryn® polymer alloys, polyurethane polymers, engineering polyimide containing polymers such as PEEK and Kapton, and interpenetrating networks, as well as inorganic materials like talc and micaceous materials. It may be useful in many embodiments, for at least some of the dielectric material to be polymeric in nature to provide a "binder" or matrix for the (b) particles.

The amount of one or more (a') dielectric materials in the D-P composition is generally at least 5 weight % and up to and including 99 weight %, or even at least 1 weight % and up to and including 95 weight %, based on the total D-P composition weight.

The amount of (b) particles in the D-P composition is generally greater than 0 volume % and up to and including 88 volume %, or more likely at least 8 volume % and up to and including 50 volume %, all based on the total wet volume of the D-P composition. The amount of (b) particles can also be defined in a dry weight ratio with the (a') dielectric materials, and this weight ratio of (b) particles to (a') dielectric material is generally at least 0.01:1 and up to and including 10:1 or more likely at least 0.05:1 and up to and including 7:1.

The (d) solvent medium used in the D-P composition can comprise one or more suitable solvents in which the (a') dielectric materials and any additional (c) binder material can be dissolved or dispersed and applied to a suitable substrate (described below). As noted, the (d) solvent medium must be chosen so that the (b) particles are not dissolved, and an appropriate choice of one or more solvents would be readily apparent to a skilled worker in the art using routine experimentation and a knowledge of the solubility of various materials in water or organic solvents, or mixture thereof. For example, some useful organic solvents that can be used in a (d) solvent medium for a D-P composition include but are not limited to, isopropyl alcohol, toluene, n-methyl pyrrolidinone, dimethyl formamide (DMF), alcohols, ketones, and ethers.

In the D-P compositions according to this invention, the amount of the (d) solvent medium is generally less than 90 weight %, and more likely at least 4 weight % and up to and including 90 weight %, or up to and including 40 weight %, all based on the total weight of the D-P composition.

Those skilled in the art of formulations would recognize that the weight percent of (d) solvent medium is often used to adjust a formulation for a particular use. For example, the amount or type of aqueous or organic solvents in the (d) solvent medium can be used to adjust the rheological properties of the D-P composition according to the present invention.

However, it would also be recognized by those skilled in the art of formulation that the amount of (d) solvent medium can also affect the physical properties of the final D-P composition or dry DL-P. For example, the amount or type of (d) solvent medium can also be used to promote adhesion as well as wetting if the D-P composition is coated onto a substrate to make a composite article.

Piezoelectric Materials

All known piezoelectric materials are dielectric materials. Dielectric materials have low electrical conductivity ($<10^{-6}$ S/m) and their conductivity remains low even at elevated voltages until the reduced electric field provided by the voltage is sufficient to cause electrical arcing through the material, at which point the material becomes electrically conducting. Thus, dielectric materials have the characteristic of becoming electrically conducting at what is known in the art as a "breakdown voltage." Within the class of materials that are piezoelectric in nature there is a subset of materials that also exhibit pyroelectricity. A pyroelectric material will exhibit temperature induced polarization that can be measured as a voltage and the degree of polarization varies with temperature. Within the subset of materials that exhibit pyroelectricity there is another subset of materials that also exhibit ferroelectricity. Ferroelectric materials also exhibit polarization that can be measured as a voltage and additionally the polarization that is reversibly affected by application of an electric field. All ferroelectric materials are also piezoelectric and all pyroelectric materials are also piezoelectric. The present invention is applicable to piezoelectric materials and all pyroelectric and all ferroelectric, and such materials can be provided in a dry PL as described herein.

Piezoelectric materials that can be used in the practice of the present invention are generally known in the art and include known single crystalline ceramics, polycrystalline ceramics, polymer-polycrystalline, polymer-nanocrystalline composites, and polymeric materials having piezoelectric properties, that is, they exhibit a measurable piezoelectric effect as that property is known in the art. Some piezoelectric materials are found in nature, but for most industrial applications, synthetic ceramics or polymers are formed into suitable piezoelectric materials such as blocks, machined shapes, sheets, and films.

Many useful synthetic piezoelectric ceramic materials are polycrystalline materials whose crystal structure is associated with non-centrosymmetric space groups. Such piezoelectric materials include, but are not limited to, lead zirconate titanate (PZT), barium titanate, potassium niobate, sodium tungstate, sodium potassium niobate, bismuth titanate, sodium bismuth titanate, bismuth ferrite, materials possessing wurtzite structures like ZnO, GaN, InN, and AlN. Non-crystalline dielectrics as well as non-centrosymmetric and centrosymmetric crystalline materials can also exhibit polarization effects upon application of external force. Ceramics often exhibit higher $d_{33}$ piezoelectric charge coefficients than polymer systems. However, these materials tend to be brittle.

It would also be apparent to one skilled in the art that composite articles and devices could be prepared using the teaching provided to include flexoelectric materials.

Synthetic polymeric materials are well known in the art of piezoelectric materials and include but are not limited to poly(vinylidene fluoride) (PVDF); copolymers derived in part from PVDF; blends of PVDF with other polymers; polyamides; polyureas; polyethylene oxide; polylactic acid; polyhydroxybutyrate; parylene-C; liquid crystalline polymers; and others described in Khaled S Ramadan et al 2014 *Smart Mater. Struct.* 23 033001. The piezoelectric behavior of these materials is often associated with specific phases of the polymer matrix. The beta phase of PVDF is a particularly useful phase of PVDF for observing the piezoelectric effect. Moreover, the beta phase of PVDF is both pyroelectric and ferroelectric. These materials tend to be flexible and exhibit a lower $d_{33}$ piezoelectric charge coefficient than polycrystalline or crystalline piezoelectric materials.

Both crystalline materials and polymeric materials exhibiting piezoelectric, pyroelectric, and ferroelectric behavior can be formed or shaped into any particularly useful form as part of the composite articles according to the present invention. Such materials can be used in the form of sheets or films, or they can be applied or otherwise disposed on a substrate of some type and secured using an adhesive if desired, for example as described and illustrated in FIGS. 14 and 15 of U.S. Pat. No. 6,469,421 (noted above), the disclosure of which is incorporated herein by reference.

Composite Articles (with Either Dry ECL-P or Dry DL-P)

In their simplest form (or structure), composite articles according to the present invention can have only two essential components: (1) a dry piezoelectric layer (dry PL) comprising a piezoelectric material as described above, and having first and second opposing surfaces; and either (2) one or more dry electrically-conductive layers (dry ECL-P's) or one or more dry dielectric layers (dry DL-P's), arranged contiguously with at least one of the first and second opposing surfaces of the dry PL. Each of the dry ECL-P's is prepared from an EC-P composition as described above, each of the dry ECUs can be prepared from an EC composition as described above, and each of the dry DL-P's is prepared from a D-P composition as described above. Unless otherwise specified, the discussion herein about dry PL, dry ECL, dry ECL-P, dry DL-P, and non-electrically-connected co-planar patterned electrodes is meant to refer to respective dry layers or patterned electrodes containing limited solvent(s), or less than 5 weight %, based on the total weight of the respective layer or patterned electrode.

Each dry ECL-P consists essentially of one or more (a) electrically-conductive materials, one or more types of (b) particles, and optionally, one or more (c) binder materials, all as described above. Each dry DL-P consists essentially of one or more (a') dielectric materials, one or more types of (b) particles, and optionally, one or more (c) binder materials, all as described above.

A composite article can also include a dry electrically-conductive layer (dry ECL) formed from an electrically-conductive composition (EC) that does not contain (b) particles as described above. Like the dry ECL-P, a dry ECL can serve as an electrode in a composite article, or within a device containing a composite article.

The opposing surfaces of a piezoelectric layer can be planar or non-planar.

In some embodiments, multiple electrodes prepared from an EC composition or EC-P composition are in contact with and adjacent to the same planar or curved surface but they are not in electrical communication with each other. These electrodes (usually in the form of one or more pairs of electrodes) are considered co-planar in that they are adjacent to the same single surface (single planar or curved surface), for example of a single surface of a dry PL, but they are not electrically (or physically) connected or in contact with each other. For example, a dry ECL or dry ECL-P can be used to provide non-electrically-connected co-planar patterned electrodes contiguous with the same surface wherein one or more of such electrodes is derived from an EC-P. In other embodiments, a dry ECL and dry ECL-P that are in contact with and overlaying the same single planar or curved surface can be in electrical communication with each other.

A dry ECL can also be formed from an electrically-conductive metallic film that has been deposited by any method readily apparent to those skilled in the art. For example, such metallic films can be deposited by electrochemical deposition, electroless deposition, or deposition from the vapor phase by means of physical vapor deposition, sputtering, or atomic layer deposition. Representative electrically-conductive materials include, but are not limited to, alloys, inorganic or organic metal complexes, or composite materials, such as those comprising silver, gold, nickel, platinum, palladium, copper, nickel, iron, titanium, silver coated copper, silver coated nickel, indium, gallium and its alloys, and aluminum as well as various electrically-conductive forms of carbon including graphite, graphene, buckyballs, and single-walled or multi-walled nanotubes, any of which can be deposited as electrically-conductive materials to form a dry ECL.

The (a) electrically-conductive materials useful in the dry ECL or dry ECL-P can be crystalline, polycrystalline, or amorphous, and they can be ordered or disordered. Further examples of such electrically-conductive materials are described above.

The amounts of essential and optional components in the dry ECL-P or dry DL-P can differ from the respective weight percentages described above for the wet EC-P composition or D-P composition, respectively.

For example, the one or more (a) electrically-conductive materials can be present in the dry ECL-P in an amount of at least 2 weight % and up to and including 99 weight %, or at least 20 weight % and up to and including 97 weight %, all based on the total dry weight of the dry ECL-P. The amount of the (b) particles in the dry ECL-P can be determined as a dry weight ratio to the one or more (a) electrically-conductive materials of at least 0.01:1 and up to and including 10:1, or more typically of at least 0.03:1 and up to and including 7:1.

As noted above, some (a) electrically-conductive materials can act as (c) binder materials. However, where a separate (c) binder material is used, it can be present in the dry ECL-P in an amount of at least 0.05 weight % and up to and including 20 weight %, or at least 0.1 weight % and up to and including 5 weight %, based on the total weight of the dry ECL-P. The dry ECL-P can also include any optional addenda incorporated into the EC-P composition as described above.

Moreover, each dry ECL-P is designed so that when it is arranged in direct contact with or adjacent to an insulating substrate (such as a dielectric layer on a support), it can exhibit an electrical resistivity of less than 10,000 ohms-cm or of less than 500 ohms-cm, or even of less than 150 ohms-cm.

For a dry DL-P, the amount of one or more (a') dielectric materials is generally at least 5 weight % and up to and including 99 weight %, or at least 10 weight % and up to and including 95 weight %, all based on the total dry weight of the dry DL-P. The amount of the (b) particles in the dry DL-P can be determined as a dry weight ratio to the one or more (a') dielectric materials of at least 0.01:1 and up to and including 10:1, or more typically of at least 0.03:1 and up to and including 7:1. The optional (c) binder material can be present in the DL-P in an amount of at least 0.1 weight % and up to and including 10 weight %, or at least 0.1 weight % and up to and including 5 weight %, based on the total dry weight of the dry DL-P. The dry DL-P can also include any optional addenda incorporated into the dry ECL-P as described above.

A composite article according to the present invention can be provided in any desirable and practical form or shape including flat structures, continuous webs, molded or cast shapes, shapes containing concave surfaces, shapes containing convex surfaces, as well as spherical shapes as long as there is at least one dry ECL-P or dry DL-P can be contiguously arranged or disposed on (generally directly adjacent to) a surface of a dry PL. In some embodiments, the composite article has a flat or planar structure or shape. In other embodiments, the composite article has a non-planar structure or shape and can be in the form of a cylindrical rod, a cone-like shape, a shape containing one or more polyhedral figures, or other complex shapes containing one or more curved surfaces.

Optional components of a composite article that are not a dry ECL-P, dry ECL, dry DL-P or dry PL include but are not limited to substrates, protective dry overcoat layers, and adhesive layers that help maintain structural integrity during manufacture or use.

A composite article according to the present invention can be composed of a single dry ECL-P disposed on or arranged contiguously to one opposing surface of a dry PL, and that opposing surface can be planar or non-planar. Alternatively, two individual dry ECL-P's can be disposed on and arranged contiguously with both opposing surfaces of the dry PL. In other embodiments, two individual non-electrically-connected co-planar patterned electrodes (described below) that are not in electrical communication with each other can be disposed on or arranged contiguously to same one or both opposing surfaces of a dry PL.

In the previous and following discussion of composite articles comprising a dry PL and at least one dry ECL-P, unless otherwise specified, it is to be understood that similar embodiments according to the present invention can be designed in which a dry DL-P is used in place of one or more dry ECL-P's that are present. Thus, it is contemplated that composite articles according to this invention can have at least one dry DL-P and no dry ECL-P's (but perhaps at least one dry ECL), at least one dry ECL-P and no dry DL-P's (with or without a dry ECL), or at least one dry DL-P and at least one dry ECL-P (with or without a dry ECL), along with the essential dry PL.

Without wishing to be bound by theory, the relationship between the size of the (b) particles in the dry ECL-P and the dry thickness of a dry ECL-P, is now described for the embodiment of a dry ECL-P with a uniform and random distribution of (b) particles throughout its volume. It is to be understood that random and uniform distribution of the (b) particles throughout the layer is thought to be desirable, but it is also possible that the (b) particle distribution is non-random or non-uniform.

A first dimensionless variable, $\kappa_{ECL-P}$, is defined as the ratio of the dry thickness of the dry ECL-P in units of micrometers to d50 (micrometers) of the (b) particles in the dry ECL-P. A second dimensionless variable, $\phi$, or volume fraction, is defined as the volume fraction of (b) particles and is related to the weight % of the components (a), (b), and (c) through the dry density of each component. A third dimensionless variable, $\Delta_M$, is defined as the ratio of the value of any mechanical property of the (a) electrically-conductive material to the value of the same mechanical property of the (b) particles in the dry ECL-P. The variable $\Delta_M$ can be the ratio of the Young's modulus for the (a) electrically-conductive material to the Young's modulus of the (b) particles in the dry ECL-P. Similarly, $\Delta_M$ can also be the ratio of the hardness of the (a) electrically-conductive material to the hardness of the (b) particles in the dry ECL-P. In general, $\Delta_M$ is not equal to 1 and more likely, $\Delta_M$ is less than 0.9 or greater than 1.10. Alternatively, it is desirable that at least one mechanical property of the (a) electrically-conductive material in the dry ECL-P differs from the same mechanical property of the (b) particles in the dry ECL-P by 5% or more. For example, the hardness of the ceramic microbeads used in Invention Examples 25 through 27 is reported by the manufacturer to be 6 on the MOHS scale, corresponding to roughly 9-10 GPa on the indentation Vicker's scale. The measured corresponding nanoindentation hardness of the electrically-conductive silver nanoparticles in the same Invention Examples is roughly 0.2+0.07 GPa. The modulus of the electrically-conductive silver nanoparticles is 2% of the modulus of the ceramic microbeads and therefore the modulus of the electrically-conductive silver nanoparticles is approximately 98% different from that of the ceramic microbeads. Thus, $\Delta_M$ in these embodiments is approximately 0.02, which is less than 0.9.

Also, without wishing to be bound by theory, the dimensionless variable $\kappa_{ECL\text{-}P}$, is now discussed with respect to the volume fraction of particles, $\phi$, in the dry ECL-P for embodiments where $\Delta_M$ is smaller than 0.8 or greater than 1.2 for the purpose of describing how the generation of non-uniform stress in the ECL-P is affected by both $\kappa_{ECL\text{-}P}$ and $\phi$ during application of uniform force onto the dry ECL-P. This non-uniform stress generated in the dry ECL-P is propagated into the PL and may be affected by the dry ECL-P itself and by any intermediate layers between the dry ECL-P and the dry PL such as an intermediate dry ECL. It is assumed that the (b) particles in dry ECL-P have different mechanical properties than the (a) electrically conductive material in the dry ECL-P and this difference is expressed by a third dimensionless variable $\Delta_M$. $\kappa_{ECL\text{-}P}$, $\phi$, and $\Delta_M$ are dimensionless variables that relate to non-uniform stress generation in the composite articles comprised of a dry ECL-P and a dry PL. The following TABLE II illustrates the qualitative relationship between $\kappa_{ECL\text{-}P}$, $\phi$, and creation of non-uniform stress in the dry PL during force application to the dry ECL-P for cases where the mechanical properties of the (a) electrically conducting material in the dry ECL-P and the same mechanical property for the (b) particles in the dry ECL-P are sufficiently mismatched such that $\Delta_M$ is smaller than 0.8 or greater than 1.2.

TABLE II

|  | $\phi$ is small | $\phi$ is large |
|---|---|---|
| $\kappa_{ECL\text{-}P}$ is small | Non-uniform stress is large | Non-uniform stress is small |
| $\kappa_{ECL\text{-}P}$ is large | Non-uniform stress is small | Non-uniform stress is small |

When $\kappa_{ECL\text{-}P}$ is large and the volume fraction of particles, $\phi$, in ECL-P is small, the (b) particles comprise a small part of the total volume of the ECL-P and the creation of non-uniform stress by application of force on the ECL-P is minimized. Similarly, when $\kappa_{ECL\text{-}P}$ is large, the volume fraction of (b) particles, $\phi$, in ECL-P approaches 1, then the (b) particles comprise a large part of the total volume of the ECL-P and the creation of non-uniform stress by application of force on the ECL-P is minimized. This effect is due to 3-dimensional (b) particle jamming.

When $\kappa_{ECL\text{-}P}$ is small, the volume fraction of (b) particles, $\phi$, in ECL-P is small, the (b) particles comprise a portion of the total volume of the ECL-P and the creation of non-uniform stress by application of force on the ECL-P is large.

When $\kappa_{ECL\text{-}P}$ is small, the volume fraction of (b) particles, $\phi$, in a dry ECL-P is large, the (b) particles comprise nearly all the volume of the dry ECL-P and the creation of non-uniform stress by application of force on the dry ECL-P is minimized because of two and three-dimensional (b) particle jamming. The generation of non-uniform stress in the dry ECL-P is best accomplished when the volume fraction of (b) particles in the dry ECL-P is below the volume fraction above which (b) particle jamming occurs. For (b) particles that are approximately spherical is shape, three-dimensional (b) particle jamming occurs approximately above 64 volume % (b) particles. Thus, for spherical (b) particles in the dry ECL-P, the volume fraction, $\phi$, of (b) particles in the dry ECL-P layer should be below 64% (or 0.64 of a total volume=1). The three-dimensional (b) particle jamming limit will change depending on the shape of the (b) particles in the dry ECL-P.

There are many different combinations of the three dimensionless variables $\kappa_{ECL\text{-}P}$, $\phi$, and $\Delta_M$ that can be used to produce non-uniform stress in the dry ECL-P during force application. Another dimensionless variable, $\kappa_{PL}$, can be defined as the ratio of the dry thickness of the dry PL in units of micrometers to d50 in micrometers of the (b) particles in the dry ECL-P. When $\kappa_{ECL\text{-}P}$ is very large, the non-uniformity of stress from the dry ECL-P that is applied to the dry PL in the presence of an applied force is minimized. Under these conditions, regardless of value of $\kappa_{PL}$, the piezoelectric response of the dry PL is not strongly affected by non-uniform stress and the dry thickness of the dry PL does not affect the piezoelectric response of the composite. $\kappa_{PL}$ is important when $\kappa_{ECL\text{-}P}$ is small. For a small value of $\kappa_{ECL\text{-}P}$ non-uniform stress is generated at the surface of the dry PL when a force is applied to the dry ECL-P largely by means of (b) particles proximate to the dry PL surface. When $\kappa_{PL}$ is small then a large portion the dry PL dry thickness or even the entire dry PL dry thickness is exposed to the non-uniform stress field. Comparison of the $d_{33}$ piezoelectric charge coefficients and calculated ratios of composite articles designed for, for example, Invention Example 26 and Invention Example 43, both of which were coated with the dry EC-P composition of Invention Example 5 suggest that a smaller $\kappa_{PL}$ gives rise to improved piezoelectric response for the same dry ECL-P. The comparison of the composite articles of Invention Examples 26 and 43 suggests that the stress giving rise to the piezoelectric response is affected by the dry PL dry thickness.

A useful range for the dry thickness of the dry ECL-P is at least 1 μm and up to and including 1500 μm, or at least 5 μm and up to and including 200 μm. A useful range for the dry thickness of the dry PL is at least 1 μm and up to and including 1500 μm, or at least 10 μm and up to and including 250 μm. Those skilled in the art will recognize that the dry PL can have a thickness much greater than 1500 μm when the piezoelectric material is a polycrystalline ceramic and particularly when the dry PL shape is complex. A suitable d50 for (b) particles in the dry ECL-P is at least 1 μm and up to and including 1500 μm, or at least 5 μm and up to and including 200 μm.

A dry DL-P can have the same or different dry dimensions as a dry ECL-P and the (b) particles can be of the same or different size as described for a dry ECL-P.

The present invention is now described by referring to various composite articles illustrated in FIGS. 1 to 19 in which FIG. 1 shows a typical prior art composite article while FIGS. 2-19 show various embodiments of composite articles that can be designed and used according to the present invention.

Thus, in FIG. 1, prior art composite article 10 comprises dry ECL 20 that is arranged contiguously with an opposing surface of dry PL 30.

Figure 2:
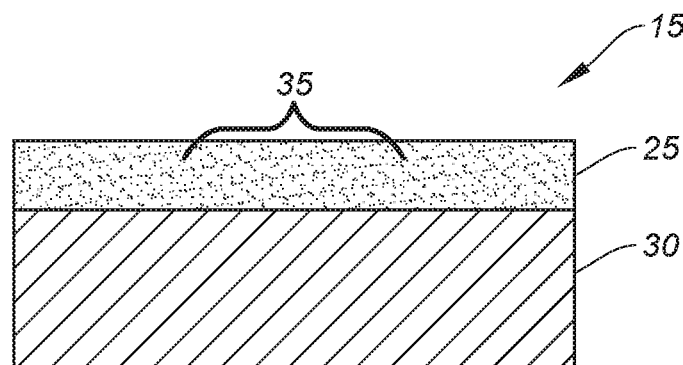
FIGS. 2-16 are schematic cross-sectional representations, not to scale, of various embodiments of composite articles according to the present invention, each composite article comprising a dry PL and at least one dry ECL-P.

In FIG. 2, composite article 15 comprises dry ECL-P 25 containing multiple (b) particles 35, which is arranged contiguously with an opposing surface of dry PL 30.

Figure 3:
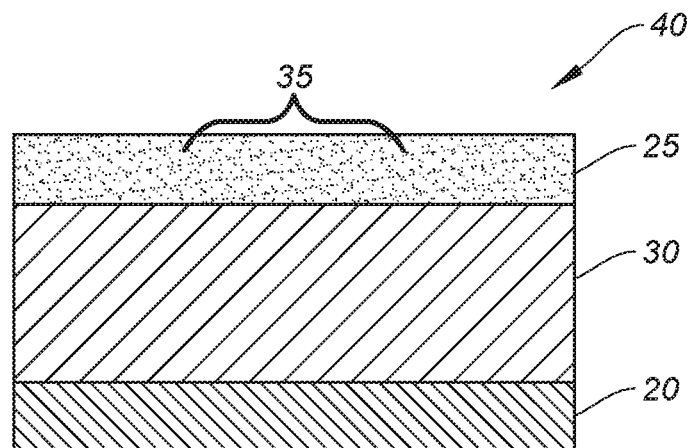

Another embodiment according to the present invention is illustrated in FIG. 3 in which composite article 40 comprises dry ECL-P 25 containing multiple (b) particles 35, which is arranged contiguously with a first opposing surface of dry PL 30; and dry ECL 20 that is arranged contiguously with a second opposing surface of dry PL 30.

Figure 4:
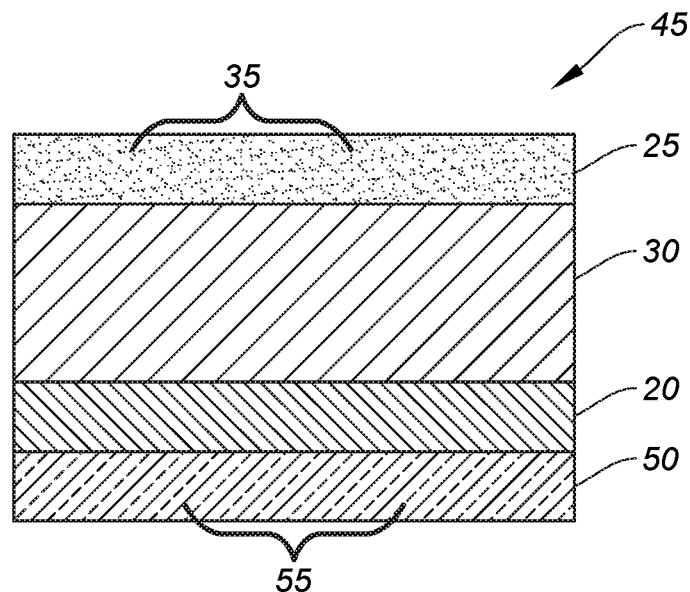

Still another useful embodiment according to the present invention is illustrated in FIG. 4 in which composite article 45 comprises first dry ECL-P 25 containing multiple (b) particles 35, which is arranged contiguously with a first opposing surface of dry PL 30; dry ECL 20 that is arranged contiguously with a second opposing surface of dry PL 30; and second dry ECL-P 50 containing multiple (b) particles 55 that can be the same or different from multiple (b) particles 35, and which second dry ECL-P 50 is arranged contiguously with a surface of dry ECL 20.

Figure 5:
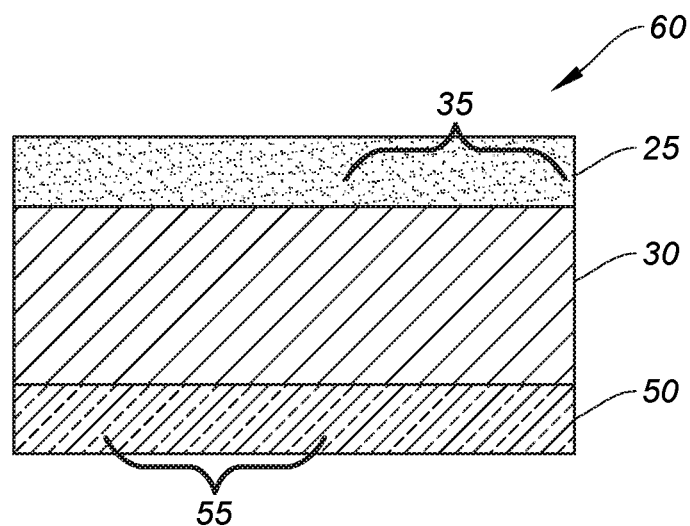

FIG. 5 describes composite article 60 that comprises first dry ECL-P 25 containing multiple (b) particles 35, which is arranged contiguously with a first opposing surface of dry PL 30; and second dry ECL-P 50 containing multiple (b) particles 55 that can be the same or different from multiple (b) particles 35, and which second dry ECL-P 50 is arranged contiguously with a second opposing surface of dry PL 30.

Figure 6:
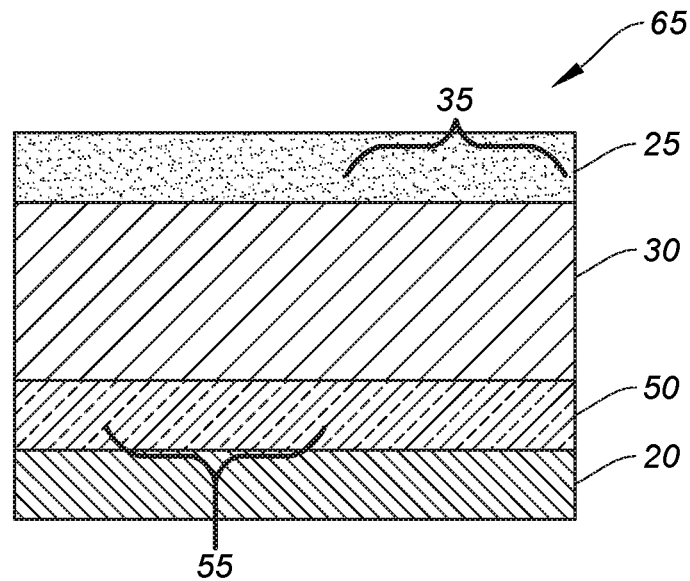

Moreover, in FIG. 6, composite article 65 comprises first dry ECL-P 25 containing multiple (b) particles 35, which is arranged contiguously with a first opposing surface of dry PL 30; second dry ECL-P 50 containing multiple (b) particles 55 that can be the same or different from multiple (b) particles 35, and which second dry ECL-P 50 is arranged contiguously with a second opposing surface of dry PL 30; and dry ECL 20 that is arranged contiguously with a surface of second dry ECL-P 50.

Figure 7:
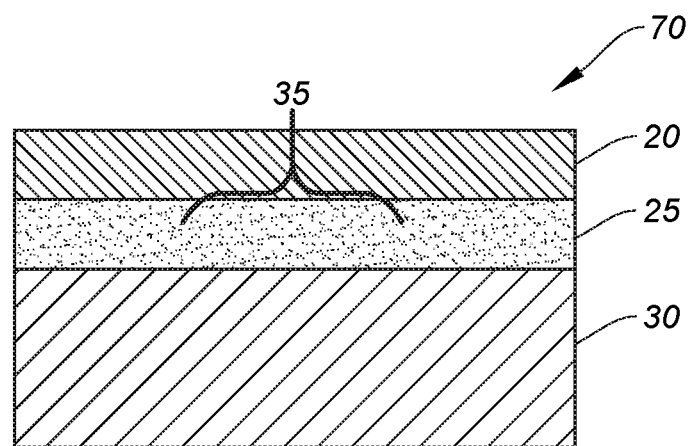

In FIG. 7, composite article 70 comprises dry ECL-P 25 containing multiple (b) particles 35, which is arranged contiguously with an opposing surface of dry PL 30; and dry ECL 20 that is arranged contiguously with a surface of dry ECL-P 25.

Figure 8:
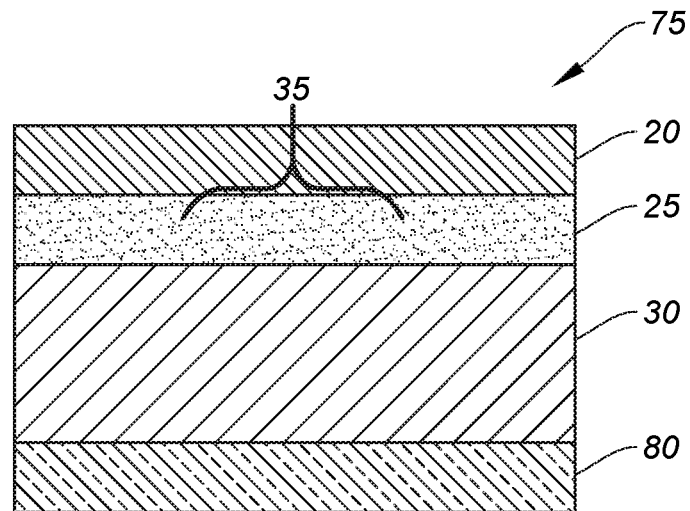

In FIG. 8, composite article 75 comprises dry ECL-P 25 containing multiple (b) particles 35, which is arranged contiguously with an opposing surface of dry PL 30; dry ECL 20 that is arranged contiguously with dry ECL-P 25; and second dry ECL 80 that is arranged contiguously with a second opposing surface of dry PL 30.

Figure 9:
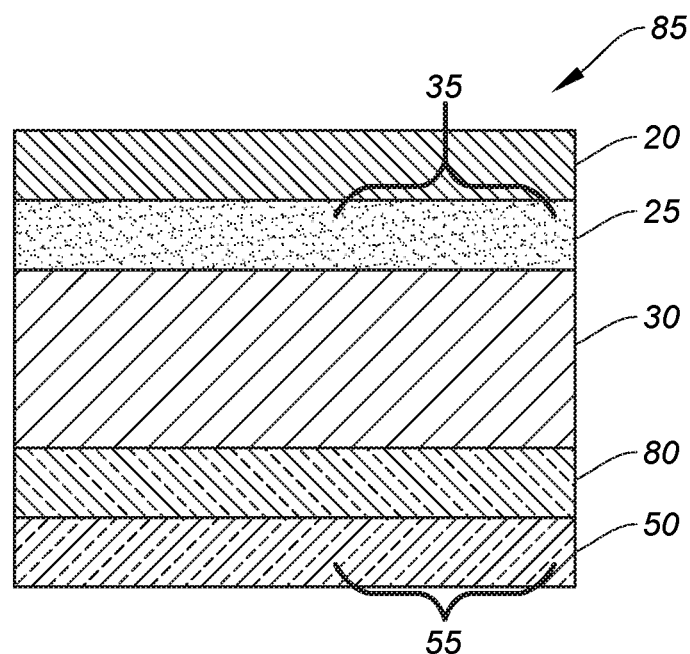

FIG. 9 illustrates composite article 85 that comprises dry ECL-P 25 containing multiple (b) particles 35, which is arranged contiguous to a planar surface of dry PL 30; dry ECL 20 that is arranged contiguous to dry ECL-P 25; second dry ECL 80 arranged contiguously with a second opposing surface of dry PL 30; and second dry ECL-P 50 containing multiple (b) particles 55 that can be the same or different from multiple (b) particles 35, which is arranged contiguously to a surface of second dry ECL 80.

Figure 10:
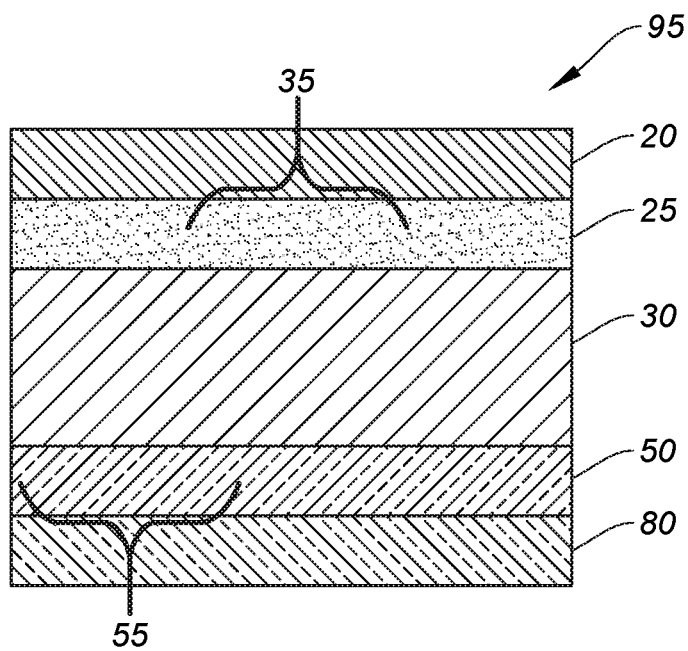

Another embodiment according to the present invention is illustrated in FIG. 10 in which composite article 95 comprises dry ECL-P 25 containing multiple (b) particles 35, which is arranged contiguously to an opposing surface of dry PL 30; dry ECL 20 that is arranged contiguously to a surface of dry ECL-P 25; second dry ECL-P 50 containing multiple (b) particles 55 that are the same or different from multiple (b) particles 35, which is arranged contiguously with a second opposing surface of dry PL 30; and second dry ECL 80 that is arranged contiguously with a surface of second dry ECL-P 50.

Figure 11:
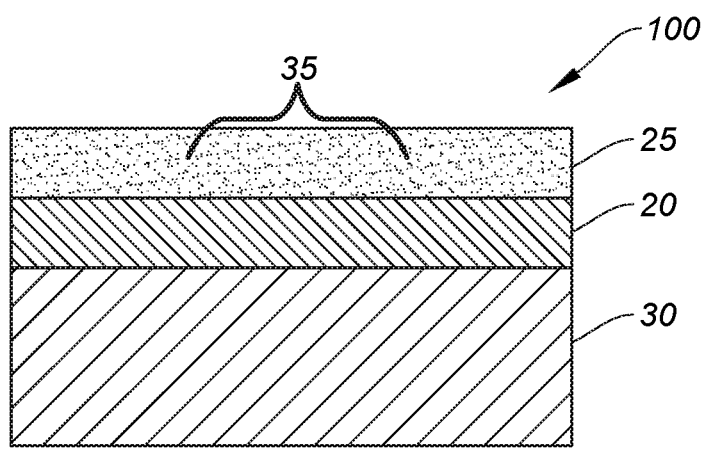

FIG. 11 illustrates yet another embodiment according to the present invention in which composite article 100 comprises dry ECL 20 that is arranged contiguously with an opposing surface of dry PL 30; and dry ECL-P 25 containing multiple (b) particles 35, which is arranged contiguously with a surface of dry ECL 20.

Figure 12:
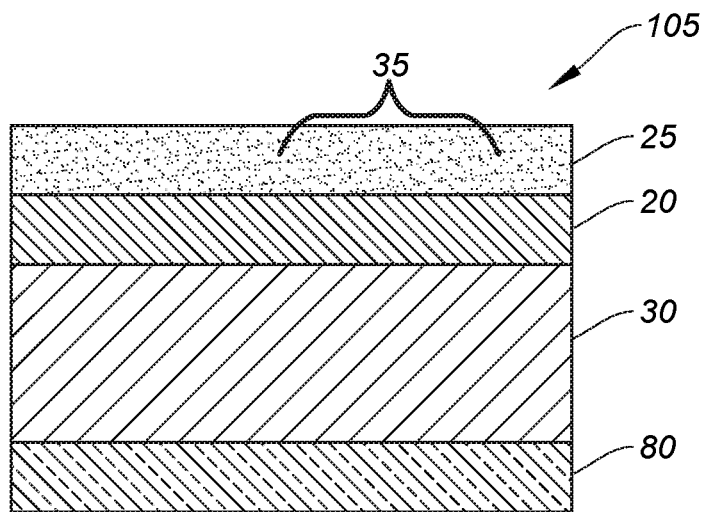

FIG. 12 illustrates composite article 105 that comprises dry ECL 20 that is arranged contiguously with an opposing surface of dry PL 30; dry ECL-P 25 containing multiple (b) particles 35, which is arranged contiguously with dry ECL 20; and second dry ECL 80 that is arranged contiguously with a second opposing surface of dry PL 30.

Figure 13:
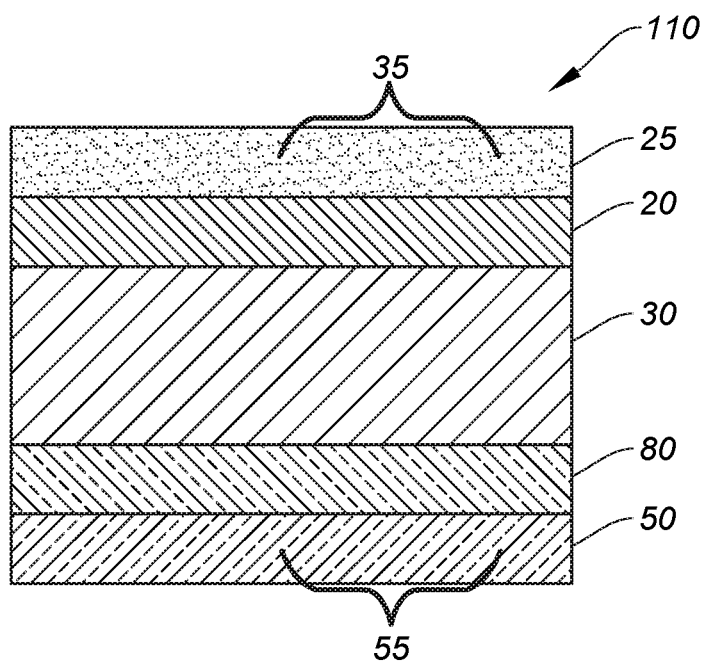

Composite article 110 illustrated in FIG. 13 is similar to that illustrated in FIG. 12 except that it further comprises second dry ECL-P 50 containing multiple (b) particles 55 that are the same or different from multiple (b) particles 35, which is arranged contiguously with a surface of second dry ECL 80.

Those skilled in the art of piezoelectric materials will appreciate that contiguously arranged dry ECL's and dry ECL-P's may or may not be in electrical communication with each other. Dry ECL's and dry ECL-P's on opposing surfaces of a dry PL are generally not in electrical communication with each other except by means of an external circuit used to collect charge or voltage from dry ECL's and dry ECL-P's on opposing surfaces of the dry PL.

Figure 14:
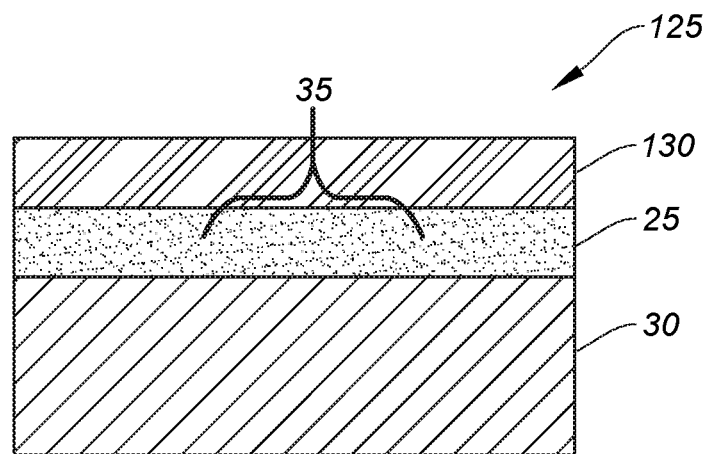

FIG. 14 illustrates composite article 125 that is like composite article 15 shown in FIG. 2, but which further comprises outermost dry protective layer 130 that is disposed over dry ECL-P 25 that is arranged contiguously with an opposing surface of dry PL 30. Outermost dry protective layer 130 can be opaque or transparent, and it can be electrically conductive or non-electrically conductive (thus, insulative or dielectric). In some embodiments, outermost dry protective layer 130 can be a polymeric protective layer. In other embodiments, outermost dry protective layer 130 can be comprised of essentially inorganic materials. In yet other embodiments, outermost dry protective layer 130 can be comprised of a mixture of inorganic and organic materials.

In general, an outermost dry protective layer can be arranged or disposed over any composite article according to the present invention including, but not limited to, those represented in FIGS. 2-13, 15, and 16.

Desirable characteristics of an outermost dry protective layer include, but are not limited to, flexibility, chemical inertness, mechanical durability, scuff resistance, providing a suitable form factor for the application, and manufacturability. Mechanical durability is a desirable characteristic of an outermost dry protective layer to prevent its cracking during use. Flexibility of the outermost dry protective layer is desirable to allow adequate propagation of stress through it to the dry ECL-P and the dry PL in the composite article. It is desirable that the outermost dry protective layer possess a certain amount of elasticity to ensure that enough stress is propagated through the various (b) particle-containing layer(s) to the dry PL so that charge can be generated from the externally applied force. In some embodiments, the outermost dry protective layer can be mechanically hard with a high modulus and brittle. In addition, chemical inertness is desirable to protect the underlying layers from corrosion and other forms of chemical attack of the composite article. It is additionally desirable that outermost dry protective layer possess a low water permeability to prevent excessive water absorption in the composite article because water absorption can interfere with the performance of the dry PL. It is further desirable that the outermost dry protective layer be scuff resistant and protect the composite article from scratches, fingerprints, and other damage that can occur during manufacture, transport, and use. The materials used to form an outermost dry protective layer are generally determined by its intended design and purpose.

The dry thickness of an outermost dry protective layer can be at least 5 nm and up to and including 5 mm. In some embodiments, the thickness of the outermost dry protective layer can be at least 5 nm and up to and including 25 nm as is common for self-assembled monolayer films. Self-assembled monolayers may be applied as an outermost dry protective layer by any means known to those skilled the art of fabrication of self-assembled monolayers. Such methods include, but are not limited to, deposition of self-assembled monolayers from both the liquid and vapor phase as well as slot coating, spin coating, atomic layer deposition, molecular beam epitaxy, physical vapor deposition, dip coating, and other methods readily apparent to those skilled in the art. Fluoropolymer self-assembled monolayers are often well suited for preparing hydrophobic surfaces and low surface energy surfaces with low coefficients of friction and stiction (static friction) that aids in the physical release of two surfaces after contact. Parylene monolayers are often well suited for preparing hydrophobic surfaces with low water permeability.

In other embodiments, the thickness of an outermost dry protective layer can be at least 500 nm and up to and including 5,000 µm as is common for polymer or composite layers. Useful polymeric materials for this purpose can include both organic polymers, inorganic polymers, organometallic polymers, and a mixture of such classes of polymers. Representative polymeric materials include, but are not limited to, resins, urethanes, polyesters, nylons, polyolefins including polypropylenes, polyethylenes and polybutylene polymers, polystyrenes, acrylates, polycarbonates, cellulose, imides, polyetherketones, fluoropolymers, chloropolymers, epoxides, vinyl chlorides, cross-linked polymers, interpenetrating polymer networks, and other types of polymers including elastomers such as neoprenes, nitrile butyl rubbers, chlorosulfonated polyethylenes, terpolymers and others. Useful inorganic polymer materials include, but are not limited to, organometallic polymers such as silicones, polysiloxanes, and polyphosphazenes. Useful addenda to include in an outermost dry protective layer include antioxidant compounds as well as UV absorbing substances and dyes like TINUVIN® light stabilizer compounds, organic and inorganic particulates and nanoparticulates useful for improving abrasion resistance and surface hydrophobicity.

Polymeric materials can be applied to form an outermost dry protective layer by any means known to those skilled the art of fabrication of polymeric material layers. Such methods include, but are not limited to, solvent casting, spin coating, dip coating, spray coating, brush coating, extrusion, slot coating, curtain coating, electrospraying, lamination, physical vapor deposition, in-situ chemical polymerization, photopolymerization, thermal polymerization, molding including injection molding, electrodeposition, precision liquid dispensing including heat and radiation curing methods, gravure and flexographic methods for forming continuous films, screen printing, drop-on-demand ink jet printing, continuous inkjet printing, and other methods familiar to those skilled in the art of fabrication of polymeric films.

In other embodiments, the dry thickness of an outermost dry protective layer can be at least 500 µm and up to and including 5,000 µm as is common for fabricated, laminated, or machined layers.

In still other embodiments, an outermost dry protective layer can be comprised of a hard, stiff material having a dry thickness of at least 50 µm and up to and including 5,000 µm with a high elastic modulus so that a non-uniform force impinging thereon is spread out over its surface area due to its high elastic modulus, thereby resulting in mechanical stimulation of a larger area of the underlying dry PL and minimizing the possibility that the dry PL is subjected to a localized force that exceeds its compressive strength. Examples of hard, stiff materials with high elastic modulus that are useful for this purpose include but are not limited to, metal alloys of all types including aluminum alloys and steel alloys, compressed graphite, metal nitrides, metal carbides, engineering plastics like nylons, liquid crystalline polymers, polyetherketone polymers and their copolymers, polyimide polymers and their copolymers, diamond, silicon and its alloys, engineering composites such as fiberglass and carbon fiber filled-epoxy composites of all types, inorganic and organic glasses, high modulus ceramics, glasses, and glass ceramics of all types including aluminum oxide based ceramics, alumino-silicate based ceramics, zirconium oxide based ceramics, aluminum nitride based ceramics, silicate based ceramics, and others readily apparent to one skilled in the art.

A high elastic modulus outermost dry protective layer can be fabricated by any method known in the art for fabricating high modulus materials. Such methods include metallurgical methods such as melting and forming, hydroforming, electrodeposition, electroforming, molding, injection molding, deposition methods of all types including those described above, polishing, grinding, machining, electropolishing, and slip casting. It is recognized that when a high modulus outermost dry protective layer is fabricated as a separate piece, it can be advantageous to employ an adhesive layer to attach it so that it is suitably disposed in a composite article. The adhesive layer used for this purpose is not shown in FIG. 14 but it could be located directly between outermost dry protective layer 130 and dry ECL-P 25.

It is also recognized that in an alternate embodiment, an outermost dry protective layer, regardless of the material of construction, can be advantageously disposed relative to the other layers without the requirements that it be contiguous with a dry ECL-P in the manner shown in FIG. 14. For example, an outermost dry protective layer can be advantageously disposed proximate to but not in physical contact with dry ECL-P 25 that is arranged contiguously with an opposing surface of dry PL 30 in FIG. 14.

A dry PL and at least one dry ECL-P can be disposed on a substrate in a composite article, which substrate does not participate in electrical activity, and such layers can be arranged on one or both supporting surfaces of such substrate, with or without an adhesive. Useful substrate materials include, but are not limited to, ceramics, polymers and plastics of all types, silicon, glasses of all types, metals of all types including metals and alloys of high elastic modulus, paper and cellulosic materials, composites of all types including fiberglass and carbon fiber composites, concrete compounds of all types, laminated structures, and corrugated structures. The substrate can be the same or different in size or dry thickness as one or all layers disposed thereon.

Figure 15:
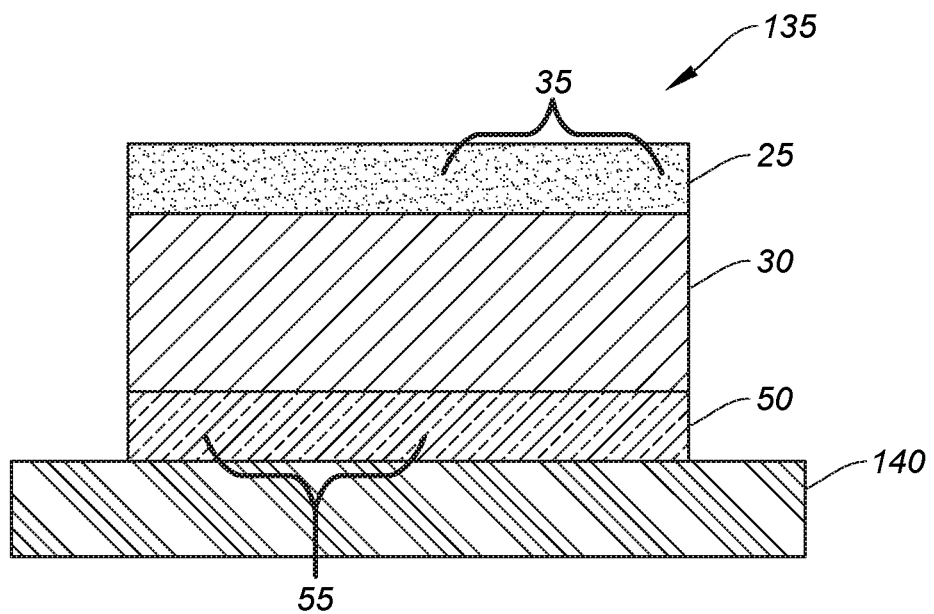

FIG. 15 illustrates composite article 135 in which dry PL 30 is arranged on substrate 140 and first dry ECL-P 25 containing multiple (b) particles 35 is arranged contiguously with an opposing surface of dry PL 30 and second dry ECL-P 50 containing multiple (b) particles 55 (that are the same or different from multiple (b) particles 35) is arranged contiguously with substrate 140 and to a second opposing surface of dry PL 30. In one embodiment of composite article 135, first dry ECL-P 25 and the second dry ECL-P 50 are optically transparent or substantially transparent, permitting 50% or more, at least 75%, or at least 90% of visible wavelengths of light. Dry PL 30 is a transparent or substantially transparent material, as in the case of PVDF and substrate 140 is transparent or substantially transparent. Substrate materials include but are not limited to glass, PET, PEN, and cellulose acetate. Materials in the dry ECL-P's are index matched to one another and to dry PL 30 in one embodiment. Index matching refers to two materials having the same index of refraction so when light passes through the materials reflection and refraction do not occur. In another embodiment, the pattern of the dry ECL-P allows for minimal light scattering and low absorption through dry ECL-P's 25 and 50. The pattern comprises an optically opaque material and is sufficiently thin in a direction perpendicular to the thickness direction of the dry ECL-P that it is not immediately noticeable to the human eye. In another embodiment, a dry ECL is substituted for one of the dry ECL-P's and this dry ECL is optically transparent. Optically transparent conductive materials include but are not limited to, indium tin oxide, indium zinc oxide, and thin films of poly(3,4-ethylenedioxythiophene) polystyrene sulfonate.

Figure 16:
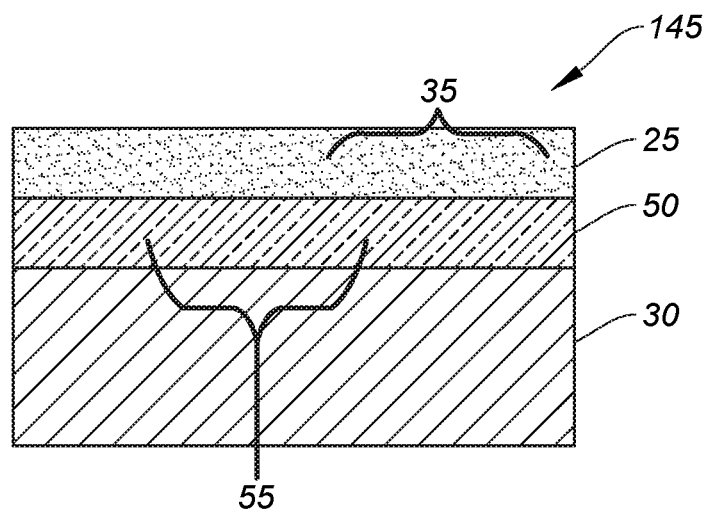

In composite article 145 illustrated in FIG. 16, dry ECL-P 25 containing multiple (b) particles 35 is arranged contiguously with a surface of second dry ECL-P 50 that contains multiple (b) particles 55, which is arranged contiguously with an opposing surface of dry PL 30. Multiple (b) particles 55 can be the same or different as multiple (b) particles 35, either in content (amount) or composition.

Composite article 145 in FIG. 16 can be further modified to provide a dry ECL in any suitable location, such as between dry ECL-P 25 and second dry ECL-P 50; arranged contiguously with the outer surface of dry ECL-P 25; between dry ECL-P 50 and dry PL 30; or arranged contiguously with the second opposing surface of dry PL 30.

Figure 17:
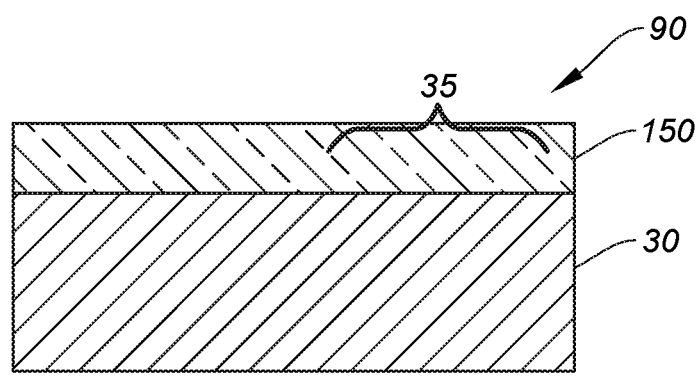
FIGS. 17-19 are schematic cross-sectional representations, not to scale, of various embodiments of composite articles according to this present invention, each composite article comprising a dry PL and at least one dry DL-P.
Figure 18:
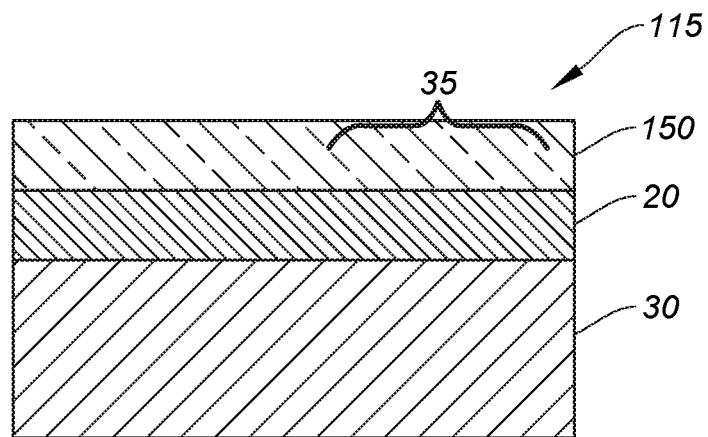
Figure 19:
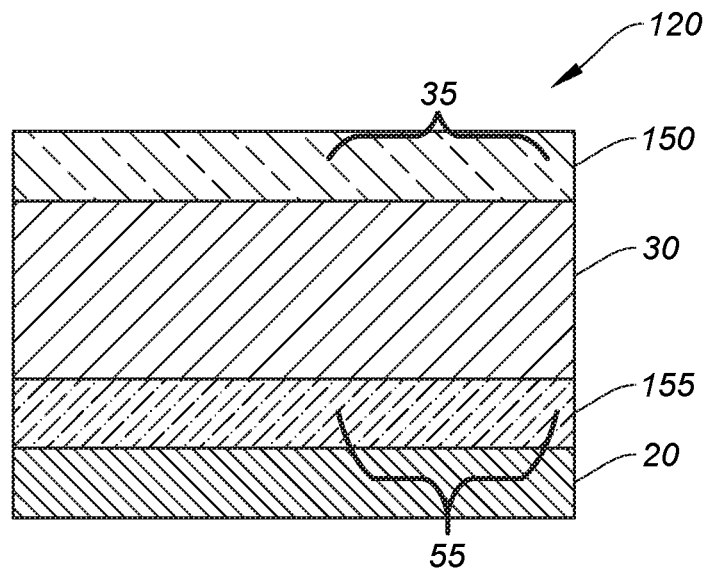

FIGS. 17-19 illustrate several embodiments of composite articles according to the present invention in which at least one dry DL-P is present. While FIGS. 17-19 are illustrative of only three specific embodiments, other embodiments would be readily apparent from discussion provided herein.

In FIG. 17, composite article 90 is similar to that shown in FIG. 2, but it has dry DL-P 150 containing a dielectric material and (b) particles 35, which is arranged contiguously with an opposing surface of dry PL 30.

FIG. 18 illustrates yet another embodiment in which composite article 115 has dry DL-P 150 containing a dielectric material and (b) particles 35, which is arranged contiguously with a surface of dry ECL 20 that in turn is arranged contiguously with an opposing surface of dry PL 30.

Still another embodiment is illustrated in FIG. 19 in which composite article 120 has dry DL-P 150 containing (b) particles 35 is arranged contiguously with one opposing surface of dry PL 30 and second dry DL-P 155 containing (b) particles 55 is arranged contiguously with a second opposing surface of dry PL 30. Dry ECL 20 is arranged contiguously with a surface of second dry DL-P 155.

Another embodiment using a DL-P composition is similar to FIG. 15 with a dry DL-P contiguously with one opposing surface of dry PL 30 and with a dry ECL or dry ECL-P arranged contiguously with a second opposing surface of dry PL 30. The dry DL-P is arranged contiguously with substrate 140 or the dry ECL or dry ECL-P is arranged contiguously with substrate 140. In this embodiment, the dry DL-P, the dry PL, the dry ECL or dry ECL-P, and the substrate are optically transparent or sufficiently transparent, that is transmitting at least 50%, or at least 75%, or still at least 90% of visible wavelengths of light. The dry DL-P is made using optically transparent materials and index matching a dielectric material to the (b) particles in the dry DL-P. The dielectric material and the (b) particles have the same index of refraction.

Inventive Devices Containing Composite Articles

The composite articles described according to the present invention can be incorporated into various useful devices as generally described above. There are many types of piezoelectric devices. Those skilled in the art of device design using piezoelectric materials for the purpose of employing the charge generating properties of the piezoelectric charge coefficient like $d_{33}$ are familiar with the two force-sensitive piezoelectric devices: 1) devices that are designed so that the piezoelectric material (or dry FL) is exposed directly to an applied force in order to generate a piezoelectric response; and 2) devices that are designed so that the piezoelectric material (or PL) is exposed indirectly to an applied force in order to generate a piezoelectric response. These two types of piezoelectric devices are also known as kinetic force devices (or kinetic piezoelectric devices) and inertial force devices (or inertial piezoelectric devices), respectively. For example, a piezoelectric crystal that is directly strained by force application to produce a voltage for spark formation is a kinetic piezoelectric device because the piezoelectric material (or dry PL) is directly exposed to an applied force. For example, a cantilever beam type energy harvester with a dry PL that is part of the beam is an inertial piezoelectric device because an inertial force is generated on the cantilever beam when an external force is applied to the beam support structure and the dry PL is stressed by the inertial force of the oscillating beam.

FIG. 30a illustrates electromechanical model 159 for devices containing piezoelectric materials. Spring 160, dashpot 165, and piezoelectric material 170 (such as a dry PL) are in common mechanical communication with support 175. Piezoelectric material 170 can be provided in a dry PL of a composite article according to the present invention that also comprises at least two electrodes 180. The assembly of piezoelectric material 170 with at least two electrodes 180 according to the present invention further comprises electrical communications means attached to both the first and second electrodes for electrical communication of the composite article with an external electrical circuit is a piezoelectric capacitor. Mass 185 is in mechanical communication with spring 160, dashpot 165, and piezoelectric material 170 such that they all experience the same applied force from mass 185 or when mass 185 has a force applied to it. In FIG. 30a, piezoelectric material 170 is contiguous to electrodes 180 that are connected to external electrical circuit load 190. According to the present invention, at least one of electrodes 180 is a dry ECL-P. If piezoelectric material 170 requires poling, it can be poled at any desired orientation relative to electrodes 180. External electrical circuit load 190 is desirably impedance matched to piezoelectric material 170 with electrodes 180 and can provide a variety of functions including but not limited to signal processing of the voltage, current, or charge produced by piezoelectric material 170 under applied stress or storage of charge produced by piezoelectric material 170 under applied stress. Those familiar with generalized electromechanical models will recognize and appreciate that spring 160 represents the lumped elastic behavior of all components having elastic behavior in a composite article according to the present invention (that can compose electrodes 180 and piezoelectric material 170); dashpot 165 represents the lumped viscous mechanical behavior of all materials having viscous behavior in the composite article that resist motion by means of viscous friction, and piezoelectric material 170 represents the lumped piezoelectric properties and response of all piezoelectric materials present in a PL of the composite article.

FIG. 30b is an electromechanical diagram of kinetic (or kinematic) piezoelectric device 195 in which a composite article according to the present invention containing piezoelectric material 170 in a dry PL and electrodes 180 is incorporated and at least one of electrodes 180 is a dry ECL-P according to this invention. FIG. 30b illustrates the use of electromechanical model 159 of FIG. 30a to describe a piezoelectric response of kinetic piezoelectric device 195 with the characteristics of electromechanical model 159 in the presence of direct applied force 200. Kinetic piezoelectric device 195, like all kinetic piezoelectric devices, is provided with a means to transmit all or a portion of an applied force directly to a piezoelectric material. The piezoelectric response of piezoelectric material 170 or of a composite article containing same to direct applied force 200 from mass 185 or applied to mass 185 is also known as the direct response, the kinetic response, or the kinematic response of kinetic piezoelectric device 195. Mass 185 is also called a proof mass. Mass 185 provides a means for transmitting all or a portion of applied force 200 to piezoelectric material 170. When an acceleration is applied to mass 185, the force as a function of time that is applied to piezoelectric material 170 is affected by the elastic properties represented by spring 160 and the viscous properties represented by dashpot 165 that are present, and piezoelectric material 170 is exposed to compressive or tensile stress depending on the orientation of direct applied force 200 relative to surfaces of piezoelectric material 170. The direct piezoelectric response produced by the piezoelectric material 170 from direct applied force 200 is measured as power, voltage, or current charge in coulombs by external electrical circuit load 190, is proportional to direct applied force 200, and follows the profile of direct applied force 200 as a function of time. In one embodiment, direct applied force 200 is compressive in nature. In another embodiment, direct applied force 200 is tensile in nature. Alternatively, direct applied force 200 can oscillate between tensile and compressive natures.

FIG. 30c is an electromechanical diagram of inertial piezoelectric device 205 and illustrates the use of electromechanical model 159 shown in FIG. 30a to describe a piezoelectric response of inertial piezoelectric device 205 with the characteristics of electromechanical model 159 in FIG. 30a in the presence of secondary inertial applied force 210. The inertial piezoelectric response of piezoelectric material 170 (such as a dry PL in a composite article) or of an inertial piezoelectric device containing piezoelectric material 170 to secondary inertial applied force 210 is also known as inertial response or indirect response. Inertial piezoelectric device 205, like all inertial piezoelectric devices, is provided with a means to convert all or a portion of an applied force to an inertial force that is transmitted to a piezoelectric material. FIG. 30c shows that electromechanical model 159 shown in FIG. 30a that includes mass 185, spring 160 representing the lumped elastic behavior present, dashpot 165 representing the lumped viscous behavior present, piezoelectric material 170 representing the lumped piezoelectric behavior and support 175 are in common mechanical communication with a mechanical assembly 215 in an inertial fashion so that direct applied force 200 exerted on mechanical assembly 215 produces secondary inertial applied force 210 on mass 185 and also on spring 160, dashpot 165, and piezoelectric material 170. Mechanical assembly 215 provides a means to convert all or a portion of direct applied force 200 to inertial applied force 210 that is transmitted to piezoelectric material 170. Mechanical assembly 215 is shown in FIG. 30c as a box-like enclosure to which support 175 shown in FIG. 30a is mechanically attached so that there is mechanical communication within mechanical assembly 215. When direct applied force 200 is applied to mechanical assembly 215, secondary inertial applied force 210 is applied to mass 185 in an opposite direction to direct applied force 200. Secondary inertial applied force 210 is applied to mass 185 as well as to spring 160, dashpot 165, and piezoelectric material 170, and the force as a function of time that is applied to piezoelectric material 170 is a function of the lumped elastic and lumped viscous properties present. The piezoelectric response of piezoelectric material 170 to secondary inertial applied force 210 is measured as power, voltage, current, or surface charge by the external load 190 and is proportional to secondary inertial applied force 210. The piezoelectric response is out of phase with the expected piezo response that would be produced by the profile of direct applied force 200 as a function of time because secondary inertial applied force 210 is roughly 180 degrees out of phase with direct applied force 200.

Those familiar with charge generating piezoelectric materials understand that piezoelectric materials (for example, in a dry PL) can have multiple piezoelectric charge coefficients that are directionally dependent and that the response contribution of each directional piezoelectric charge coefficient is dependent on the magnitude of the appropriate force vector component that is contributed by the applied force on the dry PL. Without wishing to be bound by theory, the descriptions of inventive devices provided herein are general descriptions of how the dry PL (for example, in a composite article) interacts with externally applied forces with respect to any given piezoelectric charge coefficient that contributes to the response of the dry PL. In general, the dry PL response is related to the magnitude of the individual contributions from each piezoelectric charge coefficient as well as the directional orientation of the externally applied force. Those skilled in the art of physics would recognize that the externally applied force on a kinematic or inertial piezoelectric device (as illustrated in FIGS. 30b and 30c, respectively) can be described in terms of the sum of all the vector components of the force in each direction of a defined reference frame. It is convenient to define one direction of a reference frame for describing applied force, kinematic or inertial, as the direction of the largest active piezoelectric charge coefficient of the dry PL. The externally applied force or inertial applied force can have any desired directional orientation relative to the orientation of the piezoelectric charge coefficients of the dry PL. In some kinematic piezoelectric devices, the applied force has a vector component that is parallel to the largest active piezoelectric charge coefficient of the dry PL. In other kinematic piezoelectric devices, the applied force has a vector component that is not parallel to the largest active piezoelectric charge coefficient of the dry PL. In some inertial piezoelectric devices, the inertial force has a vector component that is parallel to the largest active piezoelectric charge coefficient of the dry PL. In other inertial piezoelectric devices, the inertial force has a vector component that is not parallel to the largest active piezoelectric charge coefficient of the dry PL.

FIGS. 31a-31c illustrate three embodiments of the incorporation and use of an inventive composite article in both kinetic (or kinematic) and inertial piezoelectric devices. FIG. 31a shows composite article 135 according to the present invention and as illustrated in FIG. 15 (see for respective composite article components) with mass 185 arranged contiguously with one of electrodes that would be dry ECL-P 25. Composite article 135 can be arranged contiguously with and uniformly attached to mass 185 on the chosen opposing, contiguous attachment surfaces so that the kinetic force produced by an acceleration applied to mass 185 produces stress that is uniformly distributed over the contact area between the surface of mass 185 and the outer surface of dry ECL-P 25 of composite article 135.

The kinetic (or kinematic) piezoelectric device embodiment shown in FIG. 31a can function as a kinetic piezoelectric device when substrate 140 of composite article 135 is fixed and stationary and an acceleration towards or away from it is applied to mass 185. An example of an acceleration of mass 185 towards substrate 140 would be a finger pushing on the opposing outer surface of mass 185. The piezoelectric response of dry PL 30 in response to the applied force from mass 185 is measured by external electrical circuit load 190 as power, voltage, or current charge in coulombs, is proportional to the applied force, and follows the profile of the applied force as a function of time. Alternatively, an inertial device using composite article 135 shown in FIG. 31*a* can function as an inertial piezoelectric device when substrate 140 is non-stationary and not fixed and is accelerated towards or away from mass 185. In this case, mass 185 reacts in an inertial manner and produces an inertial force on dry PL 30 that is opposite the force and acceleration of substrate 140. The piezoelectric response of dry PL 30 in response to the applied force from mass 185 is measured by external electrical circuit load 190 as power, voltage, or current charge in coulombs, is proportional to the applied force, follows the profile of the applied force as a function of time, and is 180 degrees out of phase relative to the kinetic embodiment illustrated in FIG. 31*a*.

In another embodiment, in the kinetic (kinematic) piezoelectric device illustrated according to FIG. 31*a*, dry PL 30 responds directly to applied force and composite article 135 is uniformly attached to a surface of mass 185 that is accelerated for force generation in more than one location to enable the force application over the entire surface of composite article 135.

In yet another embodiment (not shown), an inertial device illustrated according to FIG. 31*a*, dry PL 30 responds to an inertial force, and composite article 135 is uniformly attached to a surface of mass 185 that is accelerated for force generation in more than one location thereby enabling the force application uniformly over the entire surface of composite article 135.

The inertial device embodiment of FIG. 31*a* where dry PL 30 responds to an inertial force, the composite article 135 according to the present invention and containing at least one dry ECL-P is uniformly attached in more than one location to surface substrate 140 that is accelerated to generate inertial force so that the force application over the sensing surface of composite article 135 is uniform.

FIG. 31*b* shows an embodiment of inertial piezoelectric device 220 wherein composite article 135 is used as a cantilever beam. Substrate 140 of composite article 135 is laterally extended so that substrate 140 extends beyond dry ECL-P/dry PL/dry ECL-P layer stack (25/30/50 in order) in both lateral directions. One laterally extended side of substrate 140 is in mechanical communication with a clamping mechanism (not shown) and is held in a stationary fashion. Tip mass 225 is attached to the opposing lateral extension of substrate 140 such that the dry ECL-P/dry PL/dry ECL-P layer stack (25/30/50 in order) is positioned between tip mass 225 and the clamping mechanism (not shown). Tip mass 225 is in mechanical communication with the clamping mechanism (not shown) by means of substrate 140 of composite article 135 and is held stationary on support means 230.

Alternately, substrate 140 can be laterally extended in one direction and clamped while tip mass 225 is attached directly to the opposing surface of dry ECL-P 25 of composite article 135 at a desired location that can be near the unclamped end of substrate 140. Tip mass 225 is in mechanical communication with the clamping mechanism (not shown) by means of composite article substrate 140. The application of a primary force to the clamping mechanism (not shown) results in the application of an opposing inertial force from tip mass 225 on composite article 135. Any means known in the art may be employed for application of a primary force to the clamping mechanism (not shown) to produce an opposing inertial force from tip mass 225 on composite article 135. Dry PL 30 of composite article 135 generates a piezoelectric response in the presence of the inertial force. The piezoelectric response is electrically communicated to external electrical load circuit 190. The piezoelectric response of dry PL 30 in response to the inertial force from tip mass 225 is measured by the external electrical load circuit 190 as power, voltage, or current charge in coulombs, and is proportional to the primary applied force. Those skilled in the art of inertial piezoelectric devices of the cantilever beam type would recognize that a variety of beam shapes and sizes are possible and that the inertial force response of the inertial piezoelectric device 220 increases as the primary force becomes periodic and the frequency of primary force oscillations drives the cantilever beam of the inertial piezoelectric device 220 into mechanical resonance. Those skilled in the art of cantilever beam design would know that to a first approximation, the frequency of mechanical resonance of a cantilever beam can be determined by variables including, but not exclusively limited to, the length of the beam, the cross-sectional area of the beam, the effective moment of inertia of the beam, the effective modulus of the beam, and the effective density of the material of construction of the beam.

The cantilever beam can have two or more dry piezoelectric layers (dry PL's) and two or more dry ECL-P's. The cantilever beam can be comprised of a composite article and the opposing side of a substrate. In another embodiment, the cantilever beam can be a unimorph beam. In yet another embodiment, the cantilever beam is a bimorph. For example, the cantilever beam can be comprised of a dry ECL or dry ECL-P, a dry PL, another dry ECL or dry ECL-P, a dry PL, and yet another dry ECL or dry ECL-P wherein the poling directions of the dry PL's are oriented so they are opposite.

FIG. 31*c* illustrates inertial piezoelectric device 235 wherein composite article 135 is in the shape of a plate or disc and is radially extended so that it extends the dry ECL-P/dry PL/dry ECL-P layer stack (25/30/50 in order) in a radial fashion uniformly in all radial lateral directions. Composite article 135 can be in mechanical communication with clamping mechanism support 240 and is held in a stationary fashion so that the edges of the disc shaped composite article 135 are clamped in at least one location around its circumference.

In another embodiment, the radially extended dry ECL-P/dry PL/dry ECL-P layer stack can be contiguous with a substrate (not shown) that is in mechanical communication with clamping mechanism support 240 and is held in a stationary fashion so that the edges of the disc-shaped composite article 135 are clamped to clamping mechanism support 240 in at least one location around its circumference.

Alternatively, the disc-shaped composite article 130 can be clamped at multiple locations around its circumference. Clamping mechanism support 240 can be any suitable mechanical means. Alternatively, clamping can be achieved by adhesive means. Still again, clamping can be achieved by both mechanical and adhesive means. Clamping mechanism support 240 in FIG. 31*c* can have a cylindrical hollow shape that allows composite article 135 to vibrate as a supported membrane in a drum-like fashion. For example, clamping mechanism support 240 can be closed at one end, closed at both ends, or open at both ends.

Clamping mechanism support 240 can be comprised of a piezoelectric material, or can be comprised of a dry PL and a dry ECL. In another embodiment, clamping mechanism support 240 can be comprised of a dry PL and a dry ECL-P. A tip mass (not shown in FIG. 31*c*) can be contiguous with and attached to an opposing surface of disc-shaped composite article 135. For example, it can be attached to an opposing surface of disc-shaped composite article 135 at its center. In yet another embodiment, the tip mass can be attached to an opposing surface of dry ECL-P 25 of a dry ECL-P/dry PL/dry ECL-P layer stack (25/30/50 in order). Moreover, the tip mass can be attached to the opposing surface of substrate (not shown) of composite article 135. The tip mass can also be in mechanical communication with a clamped disc shaped composite article (not shown). The application of a primary force to clamping mechanism support 240 results in the application of an opposing inertial force from an inertial tip mass on composite article 135. Dry PL 30 in composite article 135 generates a piezoelectric response in the presence of the opposing inertial force. The piezoelectric response is electrically communicated to external electrical load circuit 190. The piezoelectric response of dry PL 30 in response to the inertial force from an inertial tip mass is measured by external load circuit 190 as power, voltage, or current surface charge in coulombs, and is proportional to the primary applied force. Those skilled in the art of inertial piezoelectric devices of the plate type would recognize that a variety of plate shapes and sizes are possible and that the inertial force response of inertial piezoelectric device 235 can increase as the primary force becomes periodic and the frequency of primary force application drives the clamped composite article 135 into mechanical resonance. Those skilled in the art of plate design and plate resonance would know that to a first approximation, the frequency of mechanical resonance of a circular membrane or a circular plate is determined by variables including but not limited to the radius of the plate, the cross-sectional area of the plate, the effective modulus of the plate, and the effective density of the material of construction of the plate.

Thus, FIGS. 30*a*, 30*b*, and 30*c* show electromechanical models for both kinetic and inertial piezoelectric devices and FIGS. 31*a*, 31*b*, and 31*c* show exemplary device designs for both kinetic and inertial piezoelectric devices, all of which devices can comprise a composite article according to the present invention. These illustrations are exemplary and not limiting or restrictive in scope. Other device designs are possible and fall within the scope of kinetic and inertial piezoelectric devices according to the present invention. All the embodiments of piezoelectric device designs discussed herein employ the properties of the piezoelectric charge coefficients $d_{33}$ and $d_{31}$. However, it is recognized that kinetic and inertial piezoelectric devices that utilize additional piezoelectric charge coefficients are possible and, in some cases, desirable.

Those skilled in the art of device design utilizing piezoelectric charge coefficients of piezoelectric layers would understand that the response measured by an electrical measurement circuit in electrical communication with a dry PL is affected by the impedance matching of the electrical circuit load to the impedance of the dry PL. There are many equivalent circuit models in the art of piezoelectric materials that are used to represent piezoelectric elements for impedance matching of an external electrical circuit.

Without wishing to be bound by theory, it is thought that one of the simplest electrical models of a dry PL that is stressed by a force to generate surface charge is an adjustable voltage source, the voltage of which varies with applied force, that is in series with a capacitor. This can be most easily understood when it is considered that a piezoelectric material itself is a dielectric with a large dielectric constant that is positioned between two electrodes further comprising a means for electrically communicating to an external electrical circuit as is customary with the construction of a capacitor.

Figure 32A:
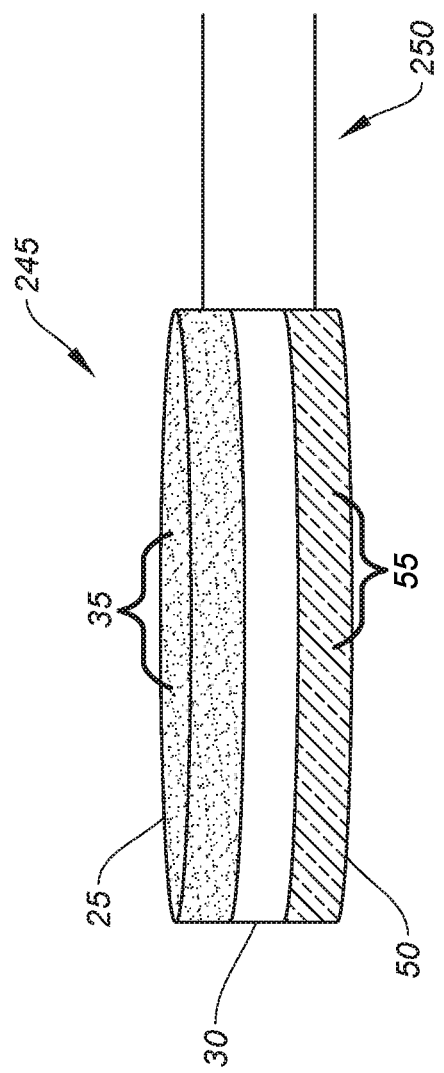
FIGS. 32a-32c are schematic cross-sectional representations of several embodiments of piezoelectric capacitors according to the present invention.

A piezoelectric capacitor according to the present invention is illustrated in FIG. 32*a* in which piezoelectric capacitor 245 comprises a composite article comprising dry PL 30, dry ECL-P 25 containing (b) particles 35 which acts as a first electrode and is contiguous with one surface of dry PL 30, and second dry ECL-P 50 containing (b) particles 55 which acts as a second electrode and is contiguous with the opposing surface of dry PL 30. Piezoelectric capacitor 245 is similar in construction as composite article 60 shown in FIG. 5. Piezoelectric capacitor 245 also comprises electrical communication means 250 for electrically communicating with an external circuit (not shown) for example that can be wire leads that are attached to dry ECL-P 25 and dry ECL-P 50 by any means known in the art of electrical connection. The (b) particles 35 can be the same or different from (b) particles 55 in density, distribution (amount), or composition.

Various other inventive piezoelectric capacitors can be designed as shown in FIGS. 4, 6, 9, 10, 13, 15, 16, 39-42, 45, and 46.

Figure 32B:
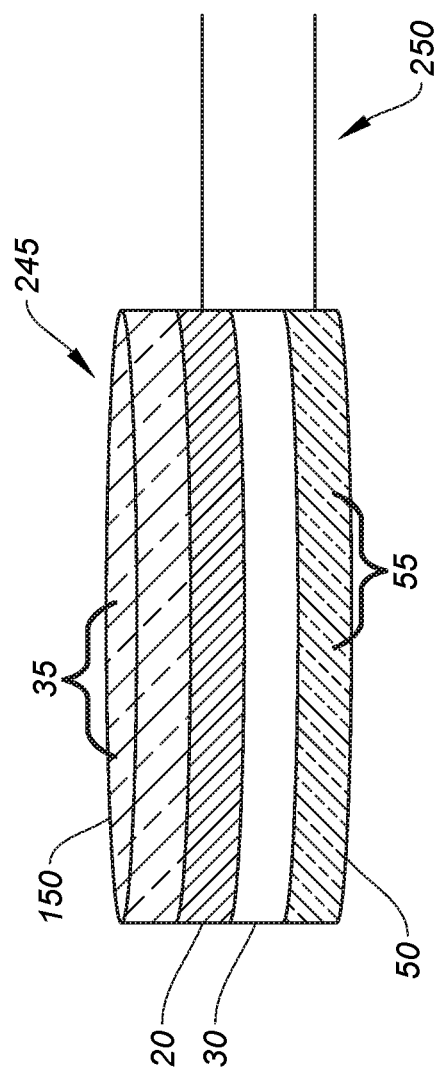

In another embodiment, piezoelectric capacitor 245 is shown in FIG. 32*b*, comprising dry DL-P 150 containing (b) particles 35 which is contiguous with dry ECL 20 that is contiguous with one surface of dry PL 30. Contiguous with the opposite surface of dry PL 30 is dry ECL-P 50 containing (b) particles 55. Alternatively, to this embodiment, a second dry ECL can be used in place of dry ECL-P 50. Piezoelectric capacitor 245 has electrical communication means 250 for electrically communicating with an external circuit (not shown) for example that can be wire leads or electrically-conductive ribbons that are attached to dry ECL 20 and dry ECL-P 50.

Figure 32C:
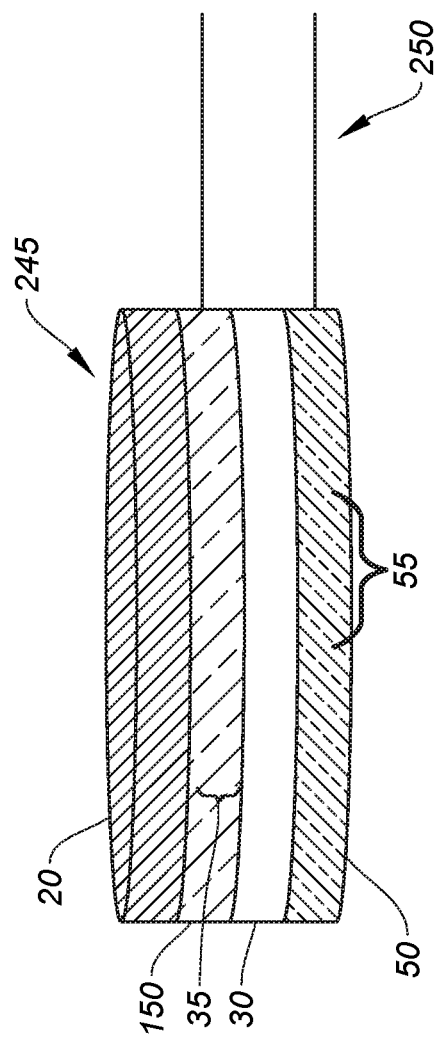

Still another embodiment shown in FIG. 32*c*, is piezoelectric capacitor 245 in which dry DL-P 150 comprising (b) particles 35 is contiguous with one surface of dry PL 30 and is also contiguous with dry ECL 20. Contiguous with the opposite surface of dry PL 30 is dry ECL-P 50 comprising (b) particles 55.

Those familiar with art of piezoelectric device design and electrical measurement know that the measurement of capacitance, resistance, voltage, and impedance are important for device application. The resistance across a piezoelectric capacitor can be measured by connecting a high impedance resistance measuring circuit between the two electrodes. The capacitance across a piezoelectric capacitor can be measured at a chosen frequency by connecting a capacitance measuring circuit between the two electrodes. The impedance across a piezoelectric capacitor can be measured by connecting an impedance measuring circuit between the two electrodes, and the impedance can be determined by the resistance of the layer and the capacitance of the layer. The voltage across a piezoelectric capacitor can be measured by connecting a high impedance voltage measuring device between the two electrodes. Those familiar with measuring piezoelectric devices know that in the absence of charge leakage, the voltage across a piezoelectric capacitor measured by a high impedance voltage measuring device is related to the force applied to the dry PL and the surface charge that is generated thereby. Charge leakage causes the piezo responsive voltage to degrade and disappear over time. Additionally, those skilled in the art of electrical design recognize that electrical power losses are minimized when impedances of the power source match the impedance of the load. The piezoelectric capacitor and the composite articles illustrated in FIGS. 3-6, 8, 9, 12, 13, and 15 can act as power sources when a force is applied to the piezoelectric capacitor or composite article when surface charge is generated thereby. Any external circuit in electrical communication with the electrodes of the piezoelectric capacitor can act as an electrical load. Thus, when the piezoelectric capacitor is in electrical communication with an external circuit, it can be advantageous to match the impedance of the external circuit to that of the piezoelectric device to maximize power transfer of the kinetic piezoelectric devices disclosed herein.

Impedance matching is useful to maximize power transfer of the inertial piezoelectric devices disclosed herein. Any of a piezoelectric capacitor, kinetic piezoelectric device, and inertial piezoelectric device, can be impedance matched to and in electrical communication with an external electrical circuit. Alternatively, any of a piezoelectric capacitor, kinetic piezoelectric device, and inertial piezoelectric device, can be impedance mismatched to and in electrical communication with an external electrical circuit.

A wide variety of external electrical circuits that are useful for measuring the electrical output of piezoelectric devices are known. When periodic, oscillating forces are applied to a piezoelectric capacitor, or to a kinetic or inertial piezoelectric device, according to the present invention, the electrical output from the piezoelectric capacitor is essentially bipolar, meaning that the voltage and current vary in a periodic fashion between positive and negative values as a function of time. Those skilled in the art of device design would recognize that it is useful to rectify the alternating voltage or current for storage of the generated energy or to produce a DC signal for further analysis. In one embodiment, the kinetic and inertial piezoelectric devices, or the piezoelectric capacitors, can be in electrical communication with a means of current and voltage rectification.

Figure 33:
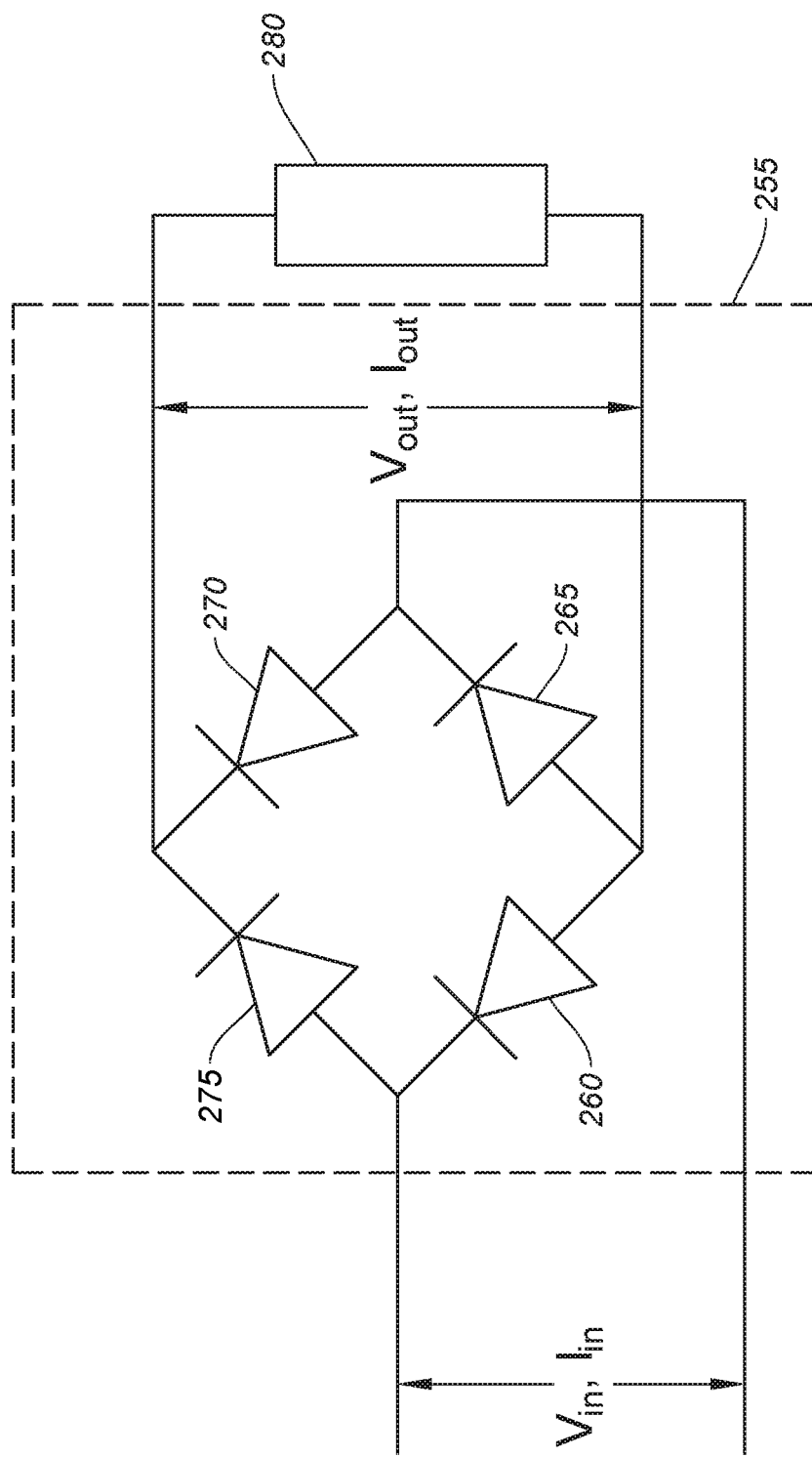
FIG. 33 is a schematic electrical diagram of a means of current and voltage rectification.

For example, a means of current and voltage rectification illustrated in FIG. 33 can be used to rectify current and voltage from AC to DC in the form of a well-known diode bridge 255 comprised of four diodes 260, 265, 270, and 275 that are arranged to produce a DC current or voltage. The operating principles of a diode bridge are well known and will not be discussed here. A kinetic and inertial piezoelectric device, or a piezoelectric capacitor, can be in electrical communication with a means of current and voltage rectification wherein the means of current and voltage rectification is diode bridge 255.

The means of current and voltage rectification can be in electrical communication with a means of storing the rectified electrical energy such as energy storage device 280 as shown in FIG. 33, that can be, for example, a capacitor, a battery, or a supercapacitor. For example, the rectified DC current or voltage from a rectifying circuit can be used to charge a capacitive energy storage device to store the energy produced by a kinetic or inertial piezoelectric device. More than four diodes can be used to construct the rectifying circuit that can include at least one energy storage device 280 providing a means of storing electrical energy, or that can include at least one means of releasing electrical energy stored by energy storage device 280. For example, the rectifying circuit can include at least one means of releasing stored electrical energy that is an electrical switch.

In another embodiment of a rectifying circuit, the use of diodes in the electric circuits that are in electrical communication with an inertial and kinetic piezoelectric device is not required and electric circuits that employ other types of switches, inductors, and capacitors are known in the art. The use of switchable capacitor banks to improve the impedance matching between the output from the PL in inertial or kinetic piezoelectric devices and the electrical circuit is known in the art. The rectifying circuit can include at least one capacitor, at least one resistor, at least one switch, or at least one inductor. The means of storing electrical energy can be in electrical communication with a means of liberating electrical energy for application to a second electrical circuit.

The kinetic or inertial piezoelectric devices, or piezoelectric capacitors according to this invention can be in electrical communication with a charge amplifier, the purpose of which is to measure the cumulative charge that is produced by the dry PL in a device. The kinetic piezoelectric devices, inertial piezoelectric devices, or piezoelectric capacitors, each having at least one dry ECL-P or dry DL-P according to the present invention, can be in electrical communication with a charge amplifier.

In another embodiment, a kinetic piezoelectric device, inertial piezoelectric device, or piezoelectric capacitor, each having a dry ECL-P or dry DL-P according to the present invention can be in electrical communication with a high impedance voltage measuring circuit whose purpose is to measure the voltage generated by surface charge that is produced by the piezoelectric layer in the device.

A piezoelectric capacitor and a kinetic or inertial piezoelectric device designed according to the present invention can have many practical uses as shown for example in TABLE III below that provides a non-exhaustive, non-limiting list of such uses. The first column of TABLE III indicates sensor type. The second column, titled "Kinetic," is labeled with an "X" in the row of the sensor type to indicate that sensors of the type indicated in column one can be designed using a kinetic piezoelectric device according to the present invention or a variant thereof. The third column, titled "Inertial", is labeled with an "X" in the row of the sensor type to indicate that sensors of the type indicated in column one can be designed using an inertial piezoelectric device of the present invention or a variant thereof.

TABLE III

| Sensor type and Use | Kinetic | Inertial | Comments |
| --- | --- | --- | --- |
| Acoustic wave detection sensor | X | X | Sensor element for construction of microphones, particularly microphones that detect contact with a surface |
| Ultrasonic detector sensor | X | | Frequency response as low as 1 Hz and greater than 100 kHz; Pick-up sensor for non-destructive testing with acoustic waves |
| Hydrophone sensor | X | | Underwater acoustic sensing with sensitive flexible transducers for example tsunami detection, excellent acoustic impedance match to water |
| Sonar sensor | X | | Underwater imaging using mechanically flexible transducers with excellent acoustic impedance match to water |

TABLE III-continued

| Sensor type and Use | Kinetic | Inertial | Comments |
|---|---|---|---|
| Medical instrumentation sensors | X | X | Devices with enhanced sensitivity such as pressure sensitive catheters, CPAP machines, and vibration sensors to detect patient movements |
| Pedobarography sensor | X | | Force sensors with enhanced sensitivity for biomechanical analysis of gait, posture, and foot contours |
| Medical echography sensor | X | | Enhanced sensitivity for diagnostic imaging with ultrasound devices |
| Blood pressure sensor | X | | High force sensitivity with potential for miniaturization |
| Robotics sensor | X | X | Artificial sensitive skin force sensors |
| Pressure sensor | X | X | Direct and indirect sensing of pressure and Distribution of pressure on surfaces |
| Security devices | X | X | Intruder detection using vibration and impact, for example, keypads for keyless locks or other interlocking security devices |
| Vibration sensors | X | X | Direct and indirect detection of vibrations with optional frequency selectivity |
| Strain sensors | X | X | Direct and indirect detection of sudden strain with optional frequency selectivity |
| Detection of localization of impacts sensor | X | X | Failure analysis and impact imaging |
| Accelerometer sensor | X | X | Miniaturized inertial and kinetic devices for sensing acceleration and acceleration direction |
| Keyboard key touch sensor | X | X | Enhanced human touch sensitivity |
| Human touch force sensors/human tactile sensors | X | X | Enhanced human touch sensitivity |
| Force sensing in capacitive touch sensors | X | X | Enhanced human touch sensitivity in 3D capacitive touch sensor applications |
| Sport and leisure contact sensor | X | | For example, a tennis court line to detect the impact of ball on court boundary line |
| Electrical switches | X | X | Force sensitive piezoelectric voltage is used to as a switch signal for electrical circuitry |
| Force sensitive transistors | X | X | Force sensitive piezoelectric voltage is used to open and close the transistor gate |
| Microgenerators for conversion of vibrational energy to electrical energy | X | X | Power generated and stored is proportional to time integrated force |

It is apparent from TABLE III that there are many different device uses for the compositions and composite articles according to the present invention utilizing a dry PL and at least one dry ECL-P or dry DL-P. Many different types of sensors can be constructed using an inventive piezoelectric capacitor, inventive kinetic piezoelectric device, inventive inertial piezoelectric device, and the composite articles described herein such as those illustrated in FIGS. 2-19. The different uses include both direct force sensing applications as well as inertial force applications using a dry PL and at least one dry ECL-P or dry DL-P. As has been previously discussed, sensors that are constructed using direct force application to the dry PL have designs in which the dry PL is directly exposed to an applied force and the detected piezoelectric response is thought to be proportional to the time integral of the applied force. Similarly, sensors that are constructed using inertial force that is generated in response to a direct force employ designs in which the direct applied force is converted to an inertial motion that produces a second applied force on the dry PL and the piezoelectric response is thought to be proportional to the time integral of the second applied force produced by the inertial motion.

The last row of TABLE III above refers to a sensor type called a microgenerator that is also called an energy harvesting device. There are many types of energy harvesting devices, utilizing the piezoelectric capacitors, the kinetic piezoelectric devices, and the inertial piezoelectric devices according to the present invention. Vibrational energy harvesting devices are energy harvesting devices wherein the applied force to the energy harvesting device is primarily provided by vibrations, acoustic or otherwise, whose transmission of energy into the device results in the application of a measurable applied force to the energy harvesting device, and thus an inertial or kinetic piezoelectric response results from such device. Four types of vibrational energy harvesting devices are known: electromagnetic, electrostative/capacitive, piezoelectric, and magnetostrictive. Vibrational energy harvesters utilizing a dry PL with a dry ECL-P or dry DL-P can be constructed using a variety of different designs. A non-exhaustive listing of vibrational energy harvester designs utilizing piezoelectric materials for converting vibrational energy into electrical energy suggests that piezoelectric material-based vibrational energy harvester device designs are of two basic types: 1) direct force conversion designs (also known as kinematic energy harvesting designs) in which the piezoelectric material is directly exposed and directly coupled to an applied force and the output signal from the piezoelectric transducer is thought to be proportional to the time integral of the applied force; and 2) inertial force conversion designs (also known as inertial energy harvesting designs) in which the applied force is indirectly coupled to the piezoelectric material so that the applied force is converted to an inertial motion that produces a second applied force on the piezoelectric material and the output signal from the piezoelectric transducer is thought to be proportional to the time integral of the second applied force produced by the inertial motion. Energy harvesting devices of the direct force conversion design or kinematic energy harvesting design are also called direct force energy harvester, direct force energy harvesting devices, kinematic energy harvesters, or kinematic energy harvesting devices. Energy harvesting devices of the inertial force conversion design are also called inertial energy harvesters, inertial energy harvesting devices, inertial piezoelectric energy harvesters, or inertial piezoelectric energy harvesting devices. Direct force conversion designs of kinematic energy harvesters utilize kinematic piezoelectric devices according to the present invention. Inertial energy harvesters utilize inertial piezoelectric devices according to the present invention.

Those skilled in the art of vibrational energy harvester design would recognize that direct force conversion designs are useful when large, high energy vibrational forces are available to excite the energy harvester while inertial force conversion designs and particularly resonant inertial force conversion designs are useful when lower energy vibrational forces are available to excite the energy harvester. Examples of electromechanical schematics of direct force and inertial force vibrational energy harvesters are illustrated in FIGS.

34 and 35. A resonant inertial force vibrational energy harvester comprised of a cantilever beam is illustrated in FIG. 36.

Figure 34:
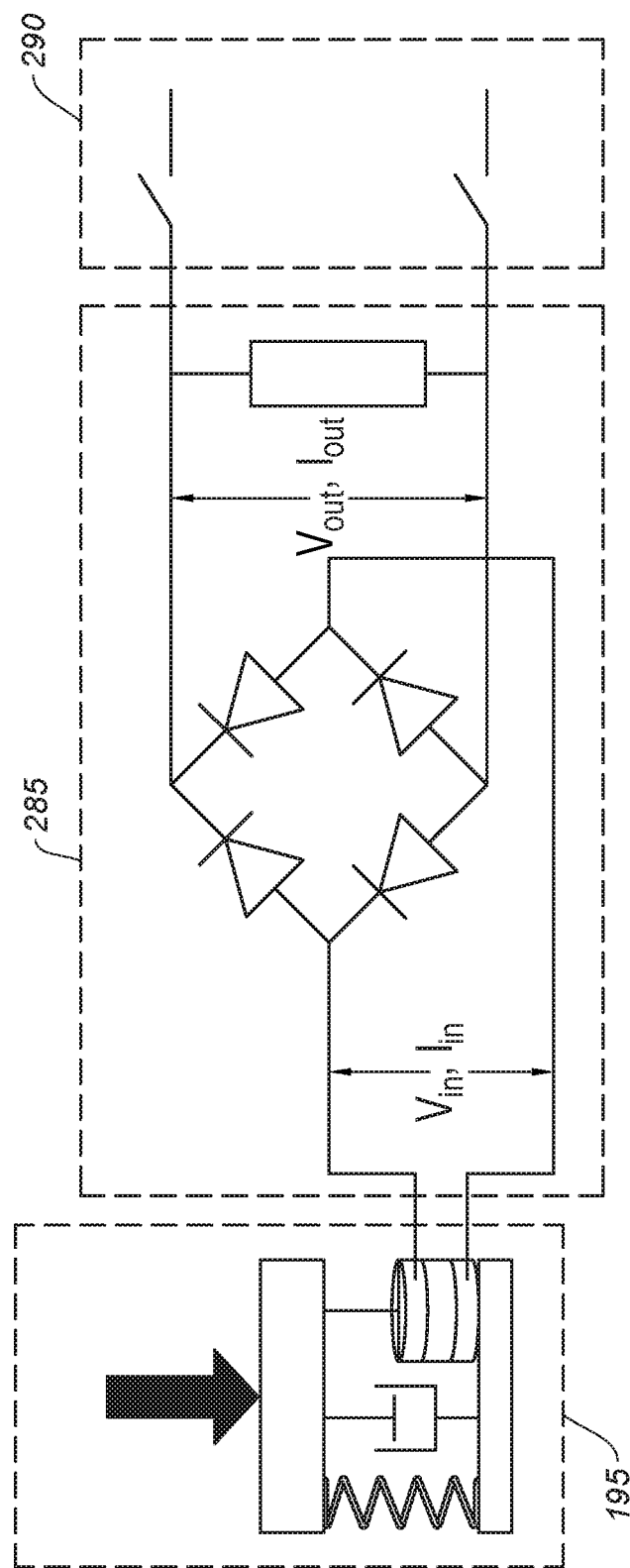
FIG. 34 is a schematic representation of a kinetic piezoelectric device according to the present invention.

More specifically, FIG. 34 shows a kinematic energy harvester schematic comprised of an electromechanical schematic of kinetic piezoelectric device 195 illustrated in FIG. 31a that is in electrical communication with energy storing rectifying circuit 285 that is in electrical communication with electrical switches 290 that provide a means for liberating the stored electrical energy. In one embodiment, the kinematic energy harvester illustrated in FIG. 34 can be a strain sensor or strain gauge. In another embodiment, the rectifying circuit of FIG. 34 need not include a means for storing electrical energy and kinematic piezoelectric device 195 functions as a strain sensor or strain gauge.

Figure 35:
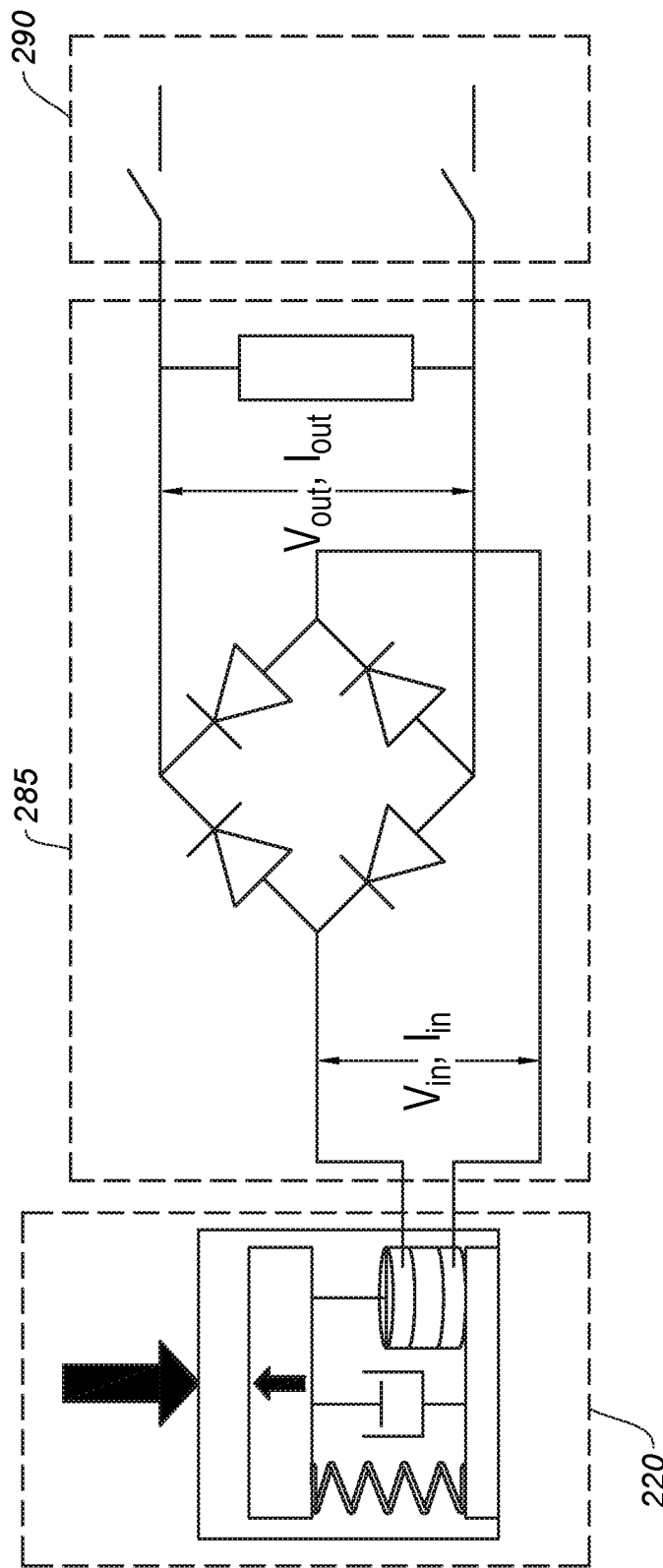
FIG. 35 is a schematic representation of an inertial piezoelectric device according to the present invention.

FIG. 35 illustrates an inertial energy harvester schematic comprised of an electromechanical schematic of inertial piezoelectric device 220 shown in FIGS. 31b and 31c that is in electrical communication with energy storing rectifying circuit 285 that is in electrical communication with electrical switches 290 that provide a means for liberating the stored electrical energy.

Figure 36:
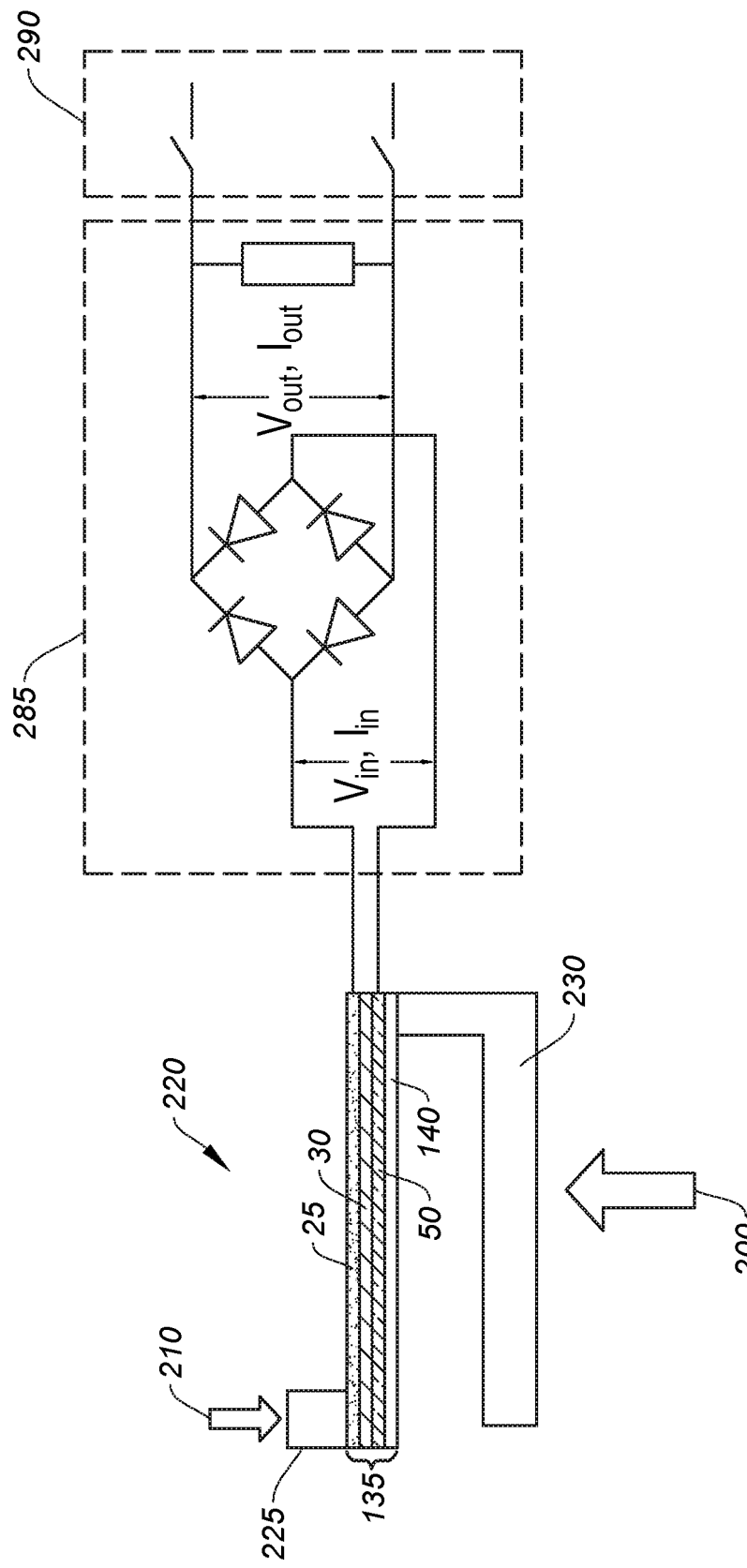
FIG. 36 is a schematic representation of an inertial energy harvester according to the present invention.

FIG. 36 illustrates an inertial energy harvester schematic comprised of inertial piezoelectric device 220 illustrated in FIG. 31b shown as a cantilever beam comprised of support 230, and composite article 135 with tip mass 225 that is in electrical communication with energy storing rectifying circuit 285 that is in electrical communication with electrical switches 290 that provide a means for liberating the stored electrical energy. Direct applied force 200 and inertial applied force 210 are also shown with this device. In an alternate embodiment, inertial piezoelectric device 220 can be the piezoelectric plate resonator illustrated in FIG. 31c.

It is intended that the representations of the kinematic and inertial energy harvesters are non-limiting with respect to the incorporation of a kinetic piezoelectric device, an inertial piezoelectric device, or piezoelectric capacitor, all according to the present invention.

For example, a vibrational energy harvester can be comprised of a piezoelectric capacitor with a dry PL and at least one dry ECL-P in electrical communication with an energy storing rectifying electrical circuit comprised of a diode bridge and a capacitor wherein the capacitor is in electrical communication with a means to liberate the energy stored in the capacitor. The piezoelectric capacitor can be impedance matched to the rectifying circuit, or not.

A vibrational energy harvester can be of a kinematic energy harvesting design and comprise a kinetic piezoelectric device further comprising a piezoelectric capacitor with a dry PL and at least one dry ECL-P in electrical communication with an energy storing rectifying electrical circuit further comprised of a capacitor and a means to liberate the energy stored in the capacitor. In other embodiments, the vibrational energy harvester can be of the inertial energy harvesting design as described above.

The design and use of capacitive touch sensors for tactile user interfaces in the design of electrical devices is well known and has been implemented in mobiles phones and computer displays. Those skilled in the art of capacitive touch sensors recognize that there are at least two types of capacitive touch sensors: (1) surface capacitance touch sensors and (2) projection capacitance touch sensors.

A surface capacitive touch sensor is comprised of a dielectric insulating layer with a conductive coating on the backside held at a fixed voltage and at least 4 electrical contact probes on the opposing front side. Physical contact of a conductor at virtual ground with the front side leads to changes in capacitance of the structure that can be read using the contact probes on the front side. The differences in capacitance measured at each of the 4 probes is then used to determine the location of the contact. Surface capacitance touch sensors require that the material contacting the sensor surface be electrically-conductive.

The simplest form of a projection capacitive touch sensor is comprised of a dielectric insulating layer with at least one X-Y addressable electrode array. The array can be on the same side of the dielectric layer or on opposing sides of the dielectric layer. The array is used to probe the capacitance either across the thickness of the dielectric layer or along the surface of the dielectric layer, depending on the type of X-Y addressable electrode array that is used. The X-Y addressable electrode array that is used to probe capacitance is scanned using a predetermined pattern that corresponds to specific positions on the surface area of the array. A change in the measured capacitance at specific positions correlates with touch screen contact at the same position and this acquired position sensitive touch information is used by the device to initiate certain actions like registering a keystroke on a keypad. In most common usage, the capacitive touch sensors used in electronic devices are employed to detect the presence or absence of a physical contact at a certain position on the touch sensor screen.

More recently, capacitive touch sensors have been designed to have an additional capability of determining how much force is associated with a contact at a certain position on the touch sensor. Capacitive touch sensors that include this capability are known as force-sensitive capacitive touch sensors. The information provided by a force-sensitive capacitive touch sensor includes the position where the contact to the sensor was initiated as well as the force that was applied during the contact with the touch sensor surface. The latter information is also used to initiate certain actions and responses by the device that are specifically associated with the degree of contact force associated with the physical contact to the touch sensor surface. Such actions can include tactile or auditory feedback as well as display of new information that allows the user to further direct the actions of the device. Although force-sensitive capacitive touch sensors can be opaque to visible light or even colored, it is often desirable that force-sensitive capacitive touch sensor be transparent so that they can be located over a light emitting display element that indicates where the positions of appropriate contact and force application are located on the touch screen surface. A compact, human-readable tactile electronic interface is thereby formed by combining a transparent force sensitive capacitive touch sensor with a light emitting display.

Composite articles according to the present invention can be designed as a useful means of contact force sensing in inventive force-sensitive capacitive touch sensors.

Figure 37:
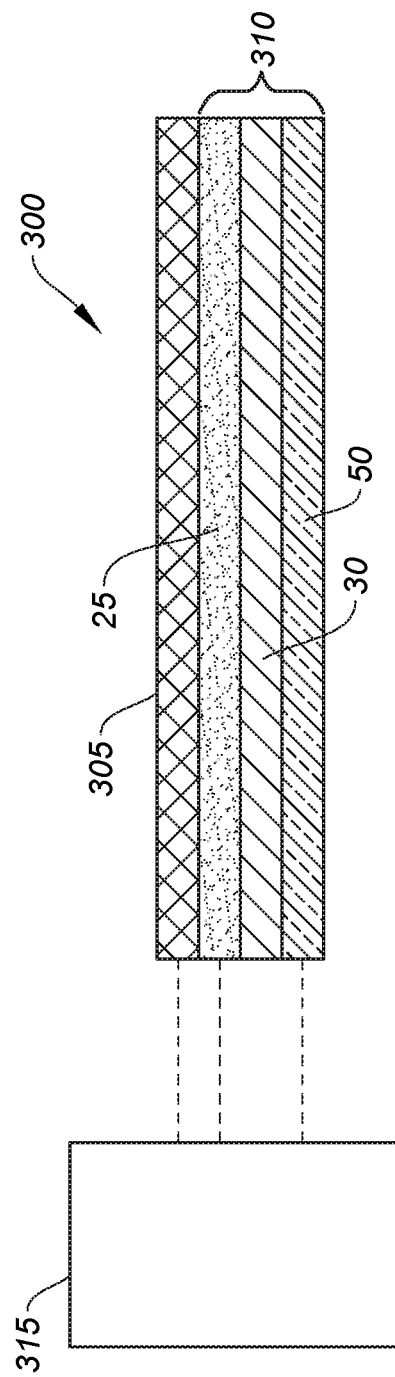
FIG. 37 is a schematic representation of a "force-sensitive" capacitive touch display according to the present invention.

FIG. 37 illustrates force-sensitive touch display 300 comprising capacitive touch sensor 305 that is designed to sense a grounded object and to determine the position of the grounded object in the plane of the sensor and to represent the position as a set of x and y coordinates on a Cartesian plane, further comprised of force sensing backplane 310 comprised of dry PL 30 contiguous with dry ECL-P 25 containing (b) particles and dry ECL-P 50 also containing (b) particles. Force sensing backplane 310 that is a piezoelectric capacitor, senses the z directional force exerted on capacitive touch sensor 305 x-y plane. Capacitive touch sensor 305 is in electrical communication (dotted lines) with signal processing electronics 315 and in mechanical communication with force sensing backplane 310 (that can also be called a "force-sensitive touch device") that is a composite article according to the present invention. In one embodiment, signal processing electronics 315 can comprise a rectifying circuit and a sample and hold circuit with a voltage output. In another embodiment, signal processing electronics 315 can comprise a means for storing electrical energy and a means for discharging electrical energy. For example, force sensing backplane 310 can be a kinetic piezoelectric device, an inertial piezoelectric device, or a piezoelectric capacitor.

In one embodiment of force-sensitive touch display 300, force sensing backplane 310 and capacitive touch sensor 305 are optically transparent or sufficiently transparent, that is, they are optically low light scattering and low light absorbing. By "optically transparent," we mean that the % optical transmissions for both the force-sensitive touch display and the capacitive touch sensor are independently greater than 50%, or even at least 80%, based on total impinging actinic radiation.

Another useful method for acquiring the position of physical contact on a touch screen surface is the use of a resistive contact touch sensor (also known as a resistive touch sensor). A simple 4-wire configuration for a resistive contact touch sensor can be comprised of two electrically-conducting surfaces that face each other and are separated by a gap. Each electrically-conducting surface has a pair of parallel electrical contacts at opposite edges of the surface making a total of 4 electrical contacts that require 4 wires. The opposing electrically-conducting surfaces can have their electrode pairs positioned perpendicular to each other. There is a first set of electrodes on the first electrically-conducting surface and a second set of electrodes on the second electrically-conducting surface that opposes and faces the first surface positioned perpendicular to the first set of electrodes. During use, signal processing electronics are used to apply a voltage to a set of electrodes on one of the electrically-conducting surfaces. During a contact event, the opposing electrically-conducting surfaces come into physical contact with each other when physically pressed together thereby bringing the two opposing electrically-conducting surfaces into electrical communication. The voltage at the contact point relative to ground is measured by the second set of electrodes and is used to calculate the contact position on the first electrically-conducting surface. The signal processing electronics then repeat the measurement by applying the voltage to the second set of electrodes while using the first set of electrodes on the first electrically-conductive surface to measure the voltage relative to ground at the contact point. The signal processing electronics use the measured voltages from the two electrically-conducting surfaces and internal calibration information to determine the x-y location of the contact position that resulted in electrical communication between the two electrically-conductive surfaces. This acquired position information of the physical contact location is fed by the signal processing electronics to a device used to initiate certain actions like registering a keystroke on a keypad. In most common usage, the resistive touch sensors used in electronic devices are employed to detect the presence or absence of a physical contact at a certain position on the sensor.

More recently, resistive touch sensors have been designed to have the additional capability of determining how much force is associated with a contact at as certain position on the sensor. Resistive touch sensors that include this capability are known as force-sensitive resistive touch sensors. The information provided by a force-sensitive resistive touch sensor includes the position where the contact to the touch sensor was initiated as well as the force that was applied during the contact to the touch sensor surface. The latter information is also used to initiate certain actions and responses that are specifically associated with the degree of contact force associated with the physical contact with the touch sensor surface. Such actions can include tactile or auditory feedback as well as display of new information on the device touch screen that allows the user to further direct the actions of the device. Although force-sensitive resistive touch sensors can be opaque to visible light or even colored, it is often desirable that force-sensitive resistive touch sensor be transparent so that they can be located over a light emitting display element that indicates where the positions of appropriate contact and force application are located on the touch screen surface. A compact, human-readable tactile electronic interface is thereby formed by combining a transparent force-sensitive resistive touch sensor with a light emitting display.

Composite articles according to the present invention can be designed for use as a means of contact force sensing in inventive force-sensitive resistive touch sensors.

Figure 38:
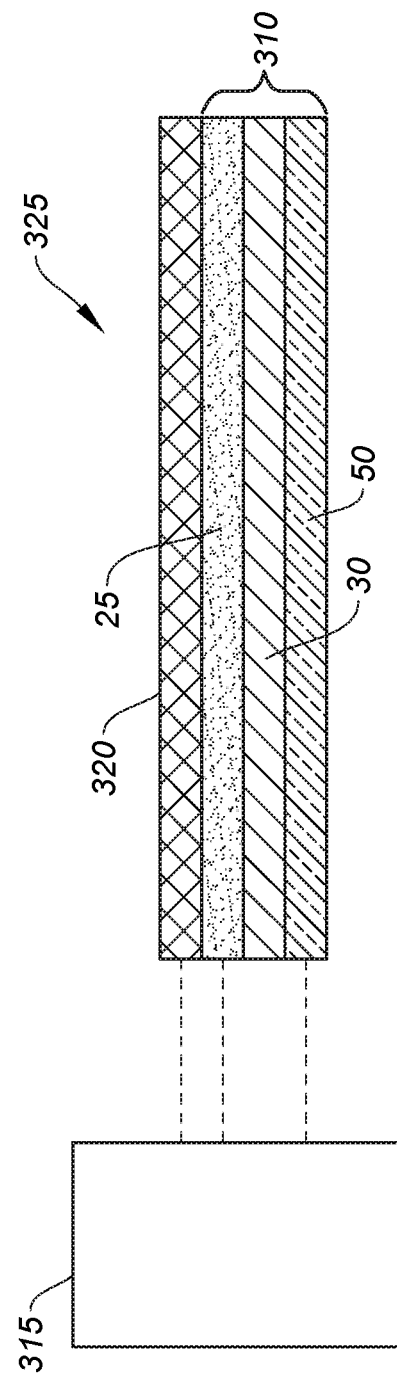
FIG. 38 is a schematic representation of a "force-sensitive" resistive touch display according to the present invention.

FIG. 38 illustrates force-sensitive touch display 325 comprising resistive touch sensor 320 according to the present invention that is designed to sense an object that is touching the sensor surface and to determine the position of the object in the plane of the sensor and represent the position as a set of x and y coordinates on a Cartesian plane, comprising force sensing backplane 310 (that can also be called a "force-sensitive touch device") that is a composite article according to the present invention comprised of dry PL 30 contiguous with both dry ECL-P 25 and dry ECL-P 50. Force sensing backplane 310 that is a piezoelectric capacitor, senses the z directional force exerted on the resistive touch sensor x-y plane. Resistive touch sensor 320 is in electrical communication (dotted lines) with signal processing electronics 315 and in mechanical communication with force sensing backplane 310. In one embodiment, signal processing electronics 315 can include a rectifying circuit and a sample and hold circuit with a voltage output. In another embodiment, signal processing electronics 315 can comprise a means for storing electrical energy and a means for discharging electrical energy. For example, force sensing backplane 310 can be a kinetic piezoelectric device, an inertial piezoelectric device, or a piezoelectric capacitor.

In one embodiment of force-sensitive touch display 325 force sensing backplane 310 and resistive touch sensor 320 are optically transparent or sufficiently transparent, that is they are optically low scattering and low light absorbing. By "optically transparent," we mean that the % optical transmissions for both the force-sensitive touch display and the resistive touch sensor are independently greater than 50%, or even at least 80%, based on total impinging actinic radiation.

Methods of Making Composite Articles and Devices

The composite articles according to the present invention can be prepared using the following conditions and equipment. For example, representative composite articles illustrated in FIGS. 2 through 19 can be fabricated using a variety of methods.

Those skilled in the art of piezoelectric materials would recognize that a dry PL can be comprised of one or more materials that have the characteristic of generating charge when a force is applied thereto. Such materials include but are not limited to inorganic and organic crystalline materials, inorganic and organic polycrystalline materials, inorganic and organic vitreous materials, inorganic and organic glass ceramic materials, as well as inorganic and organic polymers, glasses, and composites. Inorganic piezoelectric materials are prepared in a variety of formats including layers, films, templated films, single crystals, and complex three-dimensional shapes that are molded or machined. In the case of films, polycrystalline slabs, single crystal, and sintered shapes, a quantity of inorganic piezoelectric material is often prepared as a feedstock using a multistep process that will now be described.

This representative description is not meant to be exclusive and it is recognized that other methods of preparation are possible. Those familiar with the art of preparation of inorganic materials recognize that an initial step of preparation of a dry PL would be mixing one or more appropriate starting materials using various mixing methods that include coprecipitation, grinding, ball milling, dispersion milling, spray drying, or any powder mixing method known in the art of powder mixing. The starting materials can then be heated in an appropriate container to a predetermined temperature, often in a controlled atmosphere using any heating technique familiar to those skilled in the art of material preparation. The starting materials can be heated so that solid state diffusion occurs between any mixture of starting materials so that the desired inorganic compound with desired crystal structure is formed. Those skilled in the art of inorganic material preparation by solid state diffusion reactions appreciate that often-mixed starting materials must be remixed after each heating by grinding, ball milling, hammer milling or other mixing methods, and then reheated repeatedly until the desired inorganic compound with the desired crystal structure that is formed is present in sufficient purity to enable the use of the material for piezoelectric applications. The piezoelectric material purity is often assessed by multiple analytical techniques familiar to those skilled in the art of inorganic material preparation including, but not limited to, x-ray diffraction, infrared spectroscopy, density measurements, scanning and transmission electron spectroscopy, metallographic optical examination using microscopy, and elemental analysis. The polycrystalline single-phase inorganic material is then used to form polycrystalline or single crystalline forms and shapes by further high temperature processing. Single crystal inorganic materials are formed using any suitable crystal growth method known in the art of crystal growth including, but not limited to, methods such as the Czochralski method for crystal growth; crystal growth from vapor phase using such methods as chemical vapor transport; epitaxial methods for crystal growth to form single crystal layers; flux based methods for crystal growth, heat exchange methods for crystal growth, laser crystallization methods for crystal growth, and other methods known to those skilled in the art of crystal growth.

After a suitable phase of the piezoelectric material is formed as a bulk single crystal it can be cut and polished for the desired application. Alternatively, a polycrystalline inorganic material comprised of the desired crystalline phase can be further processed into polycrystalline shapes using any method known to those skilled in the art of forming ceramic shapes including, but not limited to, tape casting followed by thermal consolidation, slip casting followed by thermal consolidation, isostatic and non-isostatic pressing followed by thermal consolidation, and hot pressing. Those skilled in the art of ceramic material processing know that subsequent machining or finishing operations are often carried out on the thermally consolidated ceramic shape including, but not limited to, such finishing operations as dicing, machining, and polishing the ceramic, glass-ceramic, or vitreoceramic shape to the desired final dimensions. Those skilled in the art of ceramic material processing know that subsequent annealing can be used to remove or reduce stress induced by finishing operations performed on the ceramic part. Inorganic piezoelectric material films, both polycrystalline and single crystal, are alternatively prepared using any method familiar to those skilled in the art of thin film preparation, including, but not limited to, physical vapor deposition methods like vacuum evaporation, sputtering methods of all types, chemical vapor deposition, molecular beam epitaxy, atomic layer deposition, plasma enhanced vapor deposition methods of all types, and sol-gel coating by any method known in the art of sol-gel coating followed by thermal consolidation. Single crystal films of piezoelectric inorganic material are polished if necessary.

Polymeric piezoelectric materials can be prepared by polymerization of suitable monomer molecules of the same or different chemical composition to form a two or three-dimensional network of chemically bonded randomly or block recurring monomer units. Any suitable polymerization methods known to those skilled in the art of polymer preparation can be used to form piezoelectric polymers provided that the method includes a means of providing 1) initiation of chain growth from the desired monomer(s); 2) propagation of chain growth utilizing the desired monomer (s); and 3) termination of chain growth. A non-exhaustive listing of such polymerization methods includes photopolymerization, thermal polymerization, radical induced polymerization, reversible addition-fragmentation chain transfer, ring opening polymerization, and plasma polymerization. The desired piezoelectric polymer can be isolated as a solid from a polymerization reaction solution or dispersion by any method known in the art of polymer preparation. Representative means for post-processing polymers include, but are not limited to: 1) redispersion of the polymer into a suitable solvent followed by coating onto a substrate using any method known in the art, and drying to remove the residual solvent using any method known in the art of drying; and 2) thermally processing the polymer by any polymer processing method known to those skilled in the art of polymer processing to form a web of polymer of a desired length and thickness. Coating methods including, but are not limited to, vapor deposition of all types, slot coating, rod coating, curtain coating, spin coating, dip coating, spray coating, electrospray coating, brush coating, and roller coating.

Coating methods for forming a web of a desired thickness include, but are not limited to, extruding a heated polymer mass through a slot die followed by optionally drawing and tentering the extruded polymer web to desired length and thickness. When a polymer web is stretched in two different directions during fabrication as, for example, when an extruded polymer ribbon is both drawn and tentered, it is said to be biaxially oriented. Alternatively, a polymer web can be formed by coating a suitable solution of polymer onto a moving surface followed by drying and stripping the film off the surface to form a free-standing polymer ribbon. The moving surface can be a rotating drum. Alternatively, the moving surface is a flexible web that can be continuous.

Those skilled in the art of polymeric piezoelectric materials know that such materials often can have several crystalline phases with one crystalline phase being preferred for piezoelectric response. For example, it is well known that the beta phase of polyvinylidene fluoride ($\beta$-PVDF) is the best phase of this crystalline polymer for piezoelectric response. Those skilled in the art of polymer processing know that various operations can be carried out to promote the formation of a desired crystalline phase in a polymeric piezoelectric material. A non-exhaustive list of such operations includes drawing and tentering, thermal annealing, application of electric field and heat, and solvent treatment.

The presence of the desired crystalline phase in the polymer can be verified by any suitable means known in the art of polymer characterization including, but not exclusively limited to, x-ray diffraction, infrared spectroscopy, raman spectroscopy, differential thermal analysis and other forms of calorimetry including differential scanning calorimetry, dynamic mechanical analysis, rheological analysis, and microscopies of all types including scanning tunneling microscopy and kelvin probe microscopy.

Those skilled in the art of piezoelectric materials would know that only materials that crystallize with structures described by a certain subset of all crystalline classes show piezoelectric behavior. Only 20 point groups out of the 32 possible points that are used to describe crystal structures allow piezoelectric behavior. Piezoelectric behavior is not observed in materials whose crystal structure has a center of symmetry. Those skilled in the art would also recognize that the piezoelectric behavior of a piezoelectric material possessing a permanent dipole moment within the crystal structure—that is, a ferroelectric piezoelectric material—can be improved by the application of poling techniques. Initially, the dipoles in a piezoelectric material having permanent dipoles in the structure are randomly oriented within volume of the structure and no net macroscopic dipole moment is measurable. The poling of a piezoelectric material refers to the process by which the random three-dimensional orientation of the permanent dipoles present in a piezoelectric material that has a permanent dipole in each domain of the crystal structure can be aligned in order for the piezoelectric layer to show macroscopic polarization due to dipole alignment. The alignment of the dipoles to produce macroscopic polarization in the piezoelectric material layer enhances the piezoelectric response of the material. In particular, the force induced charge generated by the piezoelectric layer having permanent dipoles in the structure can be enhanced when the permanent dipoles are aligned by the poling process. The poling process is accomplished by the application of an electric field across the piezoelectric material. The material can be in the form of a layer or a preformed three-dimensional shape. The electric field can be applied by positioning the piezoelectric material so that a portion of the piezoelectric material is proximate to one electrode and a portion of the piezoelectric material is proximate to another electrode where one electrode is at high potential and the other electrode is at a different potential. The two electrodes are in any desired spatial relationship with the provision that they are sufficiently proximate to each other to generate the desired electric field when an external voltage is applied. Those skilled in the art of piezoelectric materials know that a common configuration for poling a piezoelectric layer has a piezoelectric layer with one surface contiguous to an electrode and the opposing surface of the piezoelectric layer contiguous to a second electrode. Poling occurs when a voltage sufficient to produce dipole alignment in the piezoelectric layer is applied between the two electrodes, with the optional application of heat to improve dipole mobility. It is understood by those skilled in the art that the voltage is controlled to minimize the possibility of dielectric breakdown of the piezoelectric layer or article itself. Those skilled in the art of poling also understand that there are other methods of poling piezoelectric materials. A frequently used method of poling piezoelectric polymers is corona charging where a plasma discharge in a gas is used to deposit positively or negatively charged species on the surface of the piezoelectric layer to induce dipole mobility within the piezoelectric layer and hence pole the layer. In one embodiment, the dry electrically-conductive layers ECL and ECL-P are used to pole the piezoelectric layer during the fabrication of the inventive composite article. In another embodiment, the piezoelectric layer is poled before application of any electrically-conductive layer in the inventive article. Corona poling may be used at any appropriate time as a poling procedure during the fabrication of the inventive composite article to promote poling of the piezoelectric layer in the inventive composite article.

A substrate such as substrate 140 shown in composite article 135 illustrated in FIG. 15 can be comprised of materials that are suitable for its intended use. For example, a substrate can be an electrical insulator and a dielectric in nature. Alternatively, a substrate can be electrically conductive and can be comprised essentially of one or more electrically-conductive metals or other electrically-conductive materials. Still again, a substrate can be comprised of a semiconductor material. A substrate material can also be thermally conductive or thermally insulating.

Moreover, a substrate can be a multilayer structure comprised of an electrically conductive layer with a contiguous dielectric layer, such as an electrically-conductive metallic layer with a contiguous dielectric layer. Alternatively, a substrate can be a multilayer structure comprised of: a semiconductor layer with a contiguous dielectric layer; a thermally conductive layer with a contiguous dielectric layer; a first thermally conductive layer with a second contiguous thermally conductive layer; or a first electrically insulating layer, a second contiguous dielectric layer disposed and overlaying thereupon, and a third dielectric layer contiguous with the second dielectric layer wherein the dielectric layers have the same or different thermal conductivity.

In still other embodiments of composite articles, a substrate can be a multilayer structure comprised of a first electrically insulating layer, a second contiguous dielectric layer disposed and overlaying thereupon, and a third dielectric layer contiguous with the second dielectric layer wherein the layers in the structure can have the same or different thermal conductivity.

In yet other embodiments, a substrate can be a multilayer structure comprised of an electrically conductive layer, a first contiguous dielectric layer disposed and overlaying thereupon, and a second dielectric layer contiguous with the first dielectric layer.

Another arrangement of layers in a substrate can be comprised of a dry electrically conductive layer, a first contiguous dry dielectric layer disposed and overlaying thereupon, and a second dry dielectric layer contiguous with the first dry dielectric layer wherein the first and second layers are thermally conductive. The substrate can also be a semiconductor with a contiguous dielectric layer.

For example, a substrate material can be comprised of any suitable electrically-insulating, dielectric materials including, but not limited to, non-electrically-conducting polymers and filled polymers wherein the polymer fill is non-conducting; engineering plastics such as nylons; liquid crystalline polymers; polyetherketone polymers and copolymers derived in part at least from an etherketone; polyimide polymers and their copolymers; imagewise patternable positive and negative photoresists such as polyimide photoresists and SU-8; inorganic polymers such as insulating silicones containing siloxane networks of all types; insulating oxides of all types such as aluminum oxide, silicon oxide and silicon oxide based glasses, titanium oxide, phosphate glasses, borate glasses, aluminosilicates, vitreoceramics including those containing alkali and alkaline earth metals cations, glassy ceramics including those containing alkali and alkaline earth metals cation, zirconium oxide, hafnium oxide, binary and ternary nitrides like aluminum nitride, gallium nitride; and any material with a resistivity greater than $10^7$ ohm-cm and a band gap greater than 1 eV. Electrically-insulating and thermally-conductive dielectric materials useful as substrate materials include, but are not limited to, diamond, boron nitride, aluminum nitride, and composites thereof. Useful semi-conducting materials for substrates include, but are not limited to, p-type and n-type silicon, p-type and n-type silicon carbide, p-type and n-type germanium, II-VI semiconductors such as GaAs and InP, III-V semiconductors such as CdS and CdTe, and thermoelectric materials such as $Bi_2Te_3$. Useful electrically-conductive materials for the fabrication of a substrate include, but are not limited to, metals, metal alloys, composites containing metals, and other types of electrically-conductive particles such as carbon, conductive forms of carbon including graphemes and carbon nanotubes of all types, and conductive polymers such as polyaniline based polymers.

A substrate used in a composite article according to the present invention can be optically transparent or optically non-transparent. For example, it can have an optical absorption in a specific region of the electromagnetic spectrum, an optical absorption in at least one wavelength, or optical absorption within two or more wavelength regions. In addition, a substrate can have an embedded thermoelectric element therein.

A substrate for any composite article according to this invention can be fabricated using any method familiar to those skilled in the art including machining, extruding, roll forming, hydroforming, bending, curling, decambering, deep drawing, expanding, hemming and seaming, sheet forming, ironing, laser cutting, photochemical machining, perforating, press brake forming, punching, roll forming, rolling, spinning, stamping, water jet cutting, and drawing and tentering to form a material with desired shape and dimensions. Although substrate 140 shown in FIG. 15 is shown as a planar layer, a substrate can have any shape, and it can be formed of multiple layers each of which can be fabricated by any method known in the art for fabricating contiguous layers. Thus, useful methods for fabricating contiguous layers include, but are not limited to, co-extrusion methods, cladding methods, lamination methods, injection molding methods, and deposition methods such as solvent casting, spin coating, dip coating, spray coating, brush coating, extrusion, slot coating, curtain coating, electrospraying, physical vapor deposition, in-situ chemical polymerization, photopolymerization, thermal polymerization, electrodeposition, precision liquid dispensing, layer formation utilizing heat or radiation curing methods, gravure and flexographic methods for forming continuous films, screen printing, drop-on-demand inkjet printing, and continuous inkjet printing.

Conformal surfaces are surfaces in which the angle between the two surfaces is invariant at every point. A characteristic of conformal layers is uniform thickness of one disposed layer on a second surface at every point on the second surface. In general, the layers of a composite article according to the present invention can be conformal. In other embodiments, the layers of a composite article according to the present invention are non-conformal. In still other embodiments, some layers of the composite article can be conformal while other layers are non-conformal.

As an illustration of how composite articles of the present invention can be prepared, the preparation of composite article 135 shown in FIG. 15 is used as an example, but is not considered exclusive of other ways to prepare such elements. Composite article 135 can be fabricated by disposing each illustrated layer in a suitable fashion so that contiguous layers are arranged properly. For example, the following steps can be carried out: dry ECL-P 50 can be disposed upon substrate 140; dry PL 30 can be disposed and arranged contiguously with an opposing surface of dry ECL-P 50; dry ECL-P 25 can be disposed and arranged contiguously with an opposing surface of dry PL 30. An outermost dry protective layer (not shown) can be optionally disposed and arranged contiguously with an opposing surface of dry ECL-P 25. The disposition and arrangement of the various layers can be accomplished using any method known to those skilled in the art of fabrication, disposition, and arrangement of material layers like dry ECL-P 25, dry ECL-P 50, dry PL 30, and the outermost dry protective layer (not shown). It is recognized that if dry PL 30 is heat sensitive, some fabrication methods may require that it be poled after fabrication to ensure piezoelectric response. While adhesive layers are not shown in FIG. 15, they can be present between opposing surfaces of any contiguous layers.

It is recognized that the order of the fabrication steps for assembling an inventive composite can be changed from that just described. For example, any combination of dry ECL-P's, dry ECL's, and dry PL's can be pre-fabricated to ensure that the desired layers are contiguous and pre-fabrication and pre-assembly steps can be followed by disposition and arrangement of the preassembled dry PL with dry ECL-P's and dry ECL's onto one surface of a support. In addition, an outermost dry protective layer can be applied to a dry ECL-P in a preassembled fashion, or it can be applied after a dry PL and dry ECL-P's and dry ECL's have been disposed onto a substrate. The order of various contiguous layers within a composite article according to the present invention can be determined by its desired utility.

Besides dry ECL's and ECL-P's containing the (a) electrically-conductive materials described above, a dry ECL or dry ECL-P according to this invention can also be formed from a metallic film that can be deposited by electrochemical deposition, electro-less deposition, electrospraying, or deposition from the vapor phase by means of such methods as chemical vapor deposition, plasma deposition, plasma enhanced vapor deposition or physical vapor deposition or sputtering, or atomic layer deposition optionally plasma-enhanced to mention a few. Other types of electrically-conductive layers can also be formed by slot coating, curtain coating, airbrush, screen printing, gravure, flexographic, solvent casting, spin coating, dip coating, spray coating, brush coating, extrusion, lamination, in-situ chemical polymerization, photopolymerization, thermal polymerization, molding including injection molding, precision liquid dispensing including heat and radiation curing methods, drop-on-demand inkjet printing, or continuous inkjet printing.

Dry ECL-P:

Dry ECL-P's can be prepared by similar methods to dry ECUs, with the difference being the addition of (b) particles to the electrically-conductive materials. The presence of (b) particles to the EC-P composition may or may not change the composition compatibility with a given deposition process. The conductive component of the dry ECL-P comprises any suitable material or composition that meets the resistivity requirement as described above and includes but is not limited to, silver, gold, nickel, platinum, palladium, copper, nickel, iron, titanium, silver coated copper, silver coated nickel, indium, gallium and its alloys, and aluminum; in addition to various types of carbon including graphite and graphene; organic and inorganic conducting polymers; and polyelectrolytes. Further examples of such materials are described above.

FIGS. 2 through 21 describe inventive composite articles wherein the (b) particles are shown to be randomly and uniformly dispersed in the dry ECL-P. However, it is recognized this is not a necessary requirement according to the present invention. The (h) particles can be distributed in a non-random or non-uniform manner in both two and three dimensions in the dry ECL-P. For example, (b) particles can be segregated at the top region of the thickness of the dry ECL-P with fewer particles being present in the remainder of the thickness. Alternatively, (b) particles can be segregated in the middle region of the thickness of the dry ECL-P with fewer particles being present in the remainder of the thickness. Still again, (b) particles can be segregated in the bottom region of the dry ECL-P with fewer particles being present in the remainder of the thickness. It is also possible that the (b) particles can be distributed in a gradient throughout the thickness of the dry ECL-P.

The dry ECL-P of the inventive composite articles illustrated in FIGS. 2-21 are readily fabricated by coating a wet EC-P composition comprised of a (d) solvent medium (if needed), (b) particles, (c) a binder material, and (a) an electrically-conductive material, all as described above so that the resulting dry ECL-P is arranged contiguously with the desired layer or substrate. Suitable coating methods have previously been disclosed above for providing a dry ECL.

In some embodiments, the (b) particles can be arranged at predetermined positions in both two and three dimensions within the dry ECL-P. This can provide an advantage of tailoring the non-uniformity of the applied stress on the dry PL for any given application to optimize the piezoelectric response from the composite article. Arranging the (b) particles at a predetermined position is also called "ordering" the (b) particles. It is possible to order the (b) particles so that they occupy predetermined positions by printing or depositing the (b) particles using known methods including, but not limited to, flexographic printing, gravure printing, screen printing, lithographic patterning techniques, lamination and etching techniques, seed-layer growth techniques where the particles are deposited in a patterned, regular, or aligned configuration or manner, at a desired location within the thickness of the dry ECL-P. This can be realized by multiple-step processing, whereby multiple layers of an EC-P composition or EC composition are deposited at the same or different thicknesses so that the (b) particles are residing at a desired location or position within the resulting composite dry ECL-P layer.

The (b) particles can be two-dimensional or three-dimensional. (b) Particles that have a flake-like shape are considered to have a "two-dimensional" structure even though there is a finite thickness of such (b) particles. (b) Particles that have a rod-like shape are called acicular (b) particles and these have a high aspect ratio (ratio of length to width) which is greater than 1.5 and can be 100 or more. Oriented (b) particles are those whose spatial position relative to one another is defined as being not statistically random. Methods for orienting (b) particles include, but are not limited to, the use of magnetic fields, electrical fields, or shear force often associated with solution coating methods so that the (b) particles are selectively oriented during the formation of the dry ECL-P.

Methods used to provide either two-dimensional or three-dimensional oriented (b) particles in composite articles according to the present invention include various printing and deposition techniques. Additional useful fabrication methods for providing oriented (b) particles in a dry ECL-P or dry DL-P include fabrication of oriented (b) particles that are anisotropically etched after deposition to create a non-spherical shape and a desired directional orientation.

Some composite articles according to the present invention can be prepared with multiple dry ECL's, dry ECL-P's, or both dry ECL's and dry ECL-P's. Such embodiments can be achieved by using multiple step processes for forming the layers, each layer being provided by the same or different methods, and each layer comprising the same or different compositions. For example, a dry ECL or dry ECL-P can be formed using a vacuum deposition technique, solution casting technique, a printing method including 3D printing, electrospraying method, lithographic patterning method, screen printing method, or any other method known in the art of deposition. A second dry ECL-P or dry ECL layer arranged contiguously with the first dry ECL or dry ECL-P can then be provided using the same or different method or technique. A third dry ECL or dry ECL-P can be provided similarly with the same or different method or technique. The EC or EC-P compositions used in the three layers can be the same or different, depending upon whether (b) particles are present.

It is known to those skilled in the art of electrical circuits that the reduction of contact resistance for metallic films is desirable and this is often achieved by creating layered electrically-conductive films with desired electrical properties. The (b) particles in each layered electrically-conductive layer can be the same or different. In addition, the type of (b) particles in various dry ECL-P's can be the same or different, depending upon individual dry ECL-P materials, design, and purpose. It is understood that the individual layers in a multilayer composite article according to this invention can interact with each other and that such interlayer interactions can be detrimental and unpredictable. As a result, the characteristics and behavior of an entire multi-layer structure of a composite article should be considered as a whole for any intended application.

The spatial position of a dry ECL or dry ECL-P can be varied in a desired construction of a composite article. For example, in embodiments having two electrically-conductive layers, one can be a dry ECL and the other a dry ECL-P, and they can be positioned on opposing surfaces of a dry PL. In other embodiments, a dry ECL and a dry ECL-P can be positioned on the same opposing surface of a dry PL, and such dry ECL and dry ECL-P can be in direct or non-direct electrical communication with each other.

Non-Electrically-Connected Co-Planar Patterned Electrodes

The electrodes described above (both dry ECL's or dry ECL-P's) are defined as essentially uniform dry layers in the composite articles.

However, it is also possible according to the present invention for one or more pairs of non-electrically-connected (or non-electrically communicating) co-planar patterned electrodes to be present in a composite article. Each of these pairs can be arranged as regular or irregular patterns in the same plane disposed contiguously with a surface of another layer such as a dry PL or dry DL-P, or on a substrate (such as an insulative substrate material). Each co-planar patterned electrode in each pair is arranged on or shares a single surface of a contiguous dry layer or support material. There can be two or more pairs of such non-electrically-connected co-planar patterned electrodes, all sharing the same single surface.

If the composite article contains an ECL-P or a DL-P, it is not necessary that any of the pairs of non-electrically-connected co-planar patterned electrodes contain (b) particles. However, if there is no ECL-P or DL-P in the composite article, at least one pair of non-electrically-connected co-planar patterned electrodes must Contain (b) particles.

Such non-electrically-connected co-planar patterned electrodes can be prepared from an EC-P or EC composition as described above. By design, each of the pair of non-electrically-connected co-planar patterned electrodes are in the same plane, but they are not electrically connected or in communication with each other, and can be separated from each other by gaps filled with air or with non-electrically-conductive materials (such as a dielectric or insulative materials). Each pair of such non-electrically-connected co-planar electrodes can be arranged within the same plane in predetermined regular or irregular patterns, for example as predetermined concentric circles (see for example, FIG. 45), interdigitated "fingers" (see for example, FIGS. 41 and 42), serpentine designs (see for example, FIG. 46), or they can be formed in a regular or irregular pattern of wires forming a mesh or grid, or be disposed as any desired shapes, convex or concave non-intersecting polygons, non-intersecting chaotic patterns, or any other pattern that a skilled worker could design.

Thus, in such embodiments according to the present invention, a composite article can comprise at least one pair (at least two) non-electrically-connected co-planar patterned electrodes that are in the same plane on a surface, but which are not directly electrically connected to (or in electrical communication with) each other. In some embodiments, one or both of a pair of non-electrically-connected co-planar patterned electrodes can be composed of an EC composition or EC-P composition according to this invention, which EC composition or EC-P composition can be arranged adjacent to an opposing surface of a dry PL, insulative substrate, or dry DL-P using any suitable deposition technique or process that would be readily apparent to one skilled in the art. For example, such non-electrically-connected co-planar patterned electrodes can be provided from an EC composition or EC-P composition using gravure printing, screen printing, inkjet printing, stenciling, airbrushing, or any other printing or deposition process that would be readily apparent to one skilled in the art.

In some embodiments, each non-electrically-connected co-planar electrode of a pair independently can have physical dimensions of at least 100 Angstroms and up to and including 5 mm dry width, and the dry thickness can be the same or different. Each electrode length can be any desired dimension suitable for a particular use and pattern design.

In some embodiments according to this invention, one or more pairs of non-electrically-connected co-planar patterned electrodes can be formed using an EC composition, and used in combination with a dry DL-P as described herein. Thus, each of these pairs can be disposed on the same or opposing sides of the dry DL-P.

In some embodiments, the composite articles described above can further comprise an insulating substrate (as described above) as well as one or more pairs of co-planar patterned electrodes, all of which are arranged contiguously between the insulating substrate and a dry PL.

In such embodiments, it is also possible for the composite article to comprise a first dry electrically-conductive layer containing no (b) particles (first ECL), which first ECL is arranged contiguously with the second opposing surface of the dry PL. Further, the composite article can comprise a first dry electrically-conductive layer containing (b) particles (first ECL-P) that is arranged contiguously with the first dry ECL that is arranged contiguously with the second opposing surface of the dry PL.

In other embodiments, a composite article according to the present invention can comprise a pair of co-planar patterned electrodes that are arranged contiguously with the first opposing surface of a dry PL, and at least one dry DL-P that is arranged contiguously over the pair of co-planar patterned electrodes.

In such embodiments, the composite article can further comprise a first dry electrically-conductive layer containing no (b) particles (first ECL), which first dry ECL is arranged contiguously with the second opposing surface of the dry PL. Moreover, a dry electrically-conductive layer containing (b) particles (dry ECL-P) can be arranged contiguously with the first dry ECL that is arranged contiguously with the second opposing surface of the dry PL.

FIGS. 39-42 illustrate some representative embodiments illustrating interdigitated non-electrically-connected co-planar patterned electrodes according to the present invention, but it is to be understood that these embodiments are not limiting to what composite articles may be possible within the present invention.

Figure 39:
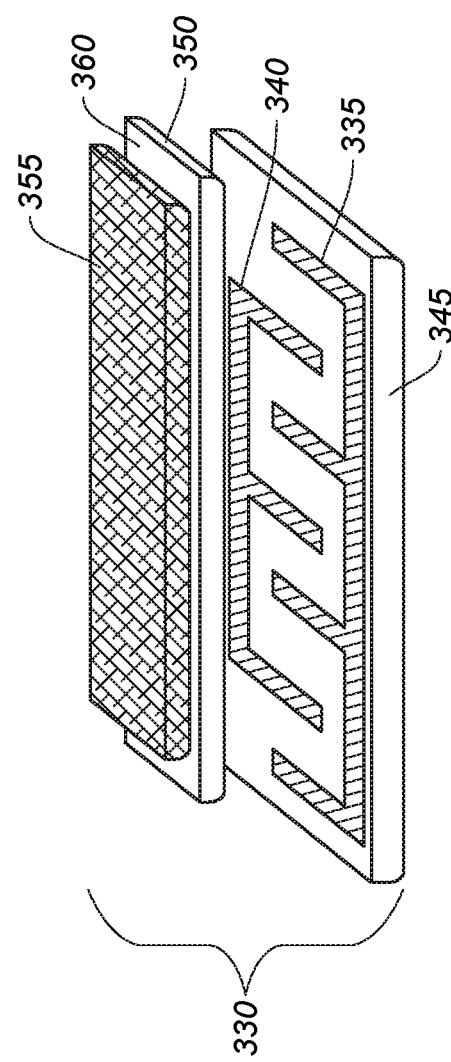
FIGS. 39 and 40 are exploded schematic perspective cross-sectional views of composite articles according to the present invention having co-planar patterned electrodes with a dielectric material containing (b) particles.

FIG. 39 shows composite article 330 wherein two non-electrically-connected (and interdigitated) co-planar patterned electrodes 335 and 340 (derived from the same or different EC compositions, described above) that are not electrically connected to each other, are disposed contiguously with a planar surface of substrate 345, as well as a first opposing surface (not shown) of dry PL 350 provided from one or more suitable piezoelectric materials (described above). Dry DL-P 355 having (b) particles (not shown) is arranged contiguously with and in direct contact with opposing surface 360 of dry PL 350. The first opposing surface (not shown) of dry PL 350 is arranged contiguously with and in direct contact with non-electrically-connected co-planar patterned electrodes 335 and 340 and constructed in such a manner that they are co-planar but not in electrical communication with each other. Composite article 330 can be prepared by arranging the dry DL-P 355 from a suitable D-P composition (described above) to be contiguous with and in direct contact with opposing surface 360 of dry PL 350, and non-electrically-connected co-planar patterned electrodes 335 and 340 can be formed from the same or different EC compositions in a desired co-planar pattern directly on an opposing surface (not shown) of dry PL 350. While it is not shown in FIG. 39, such a composite article can further comprise an outermost dry protective layer (as described above) disposed over dry DL-P 355.

Figure 40:
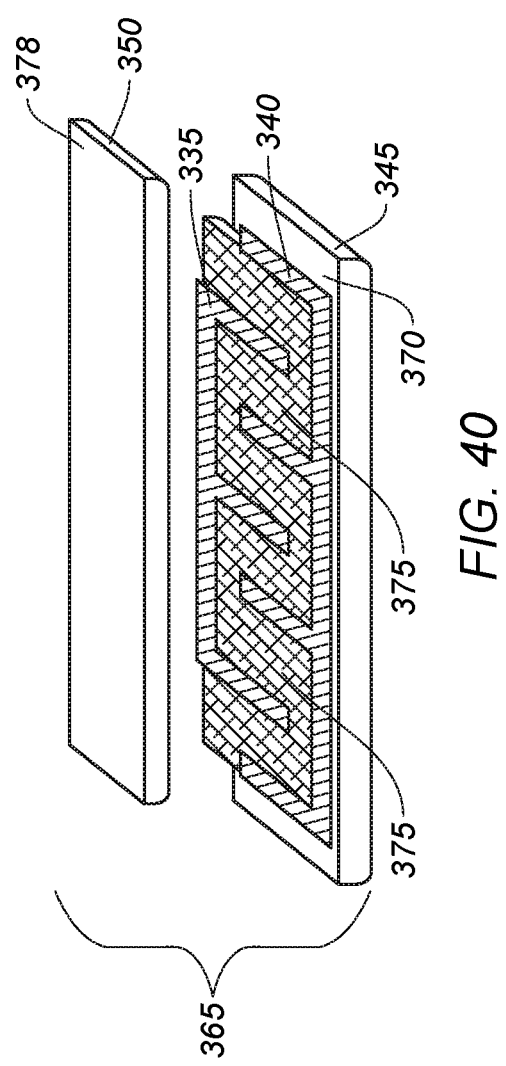

Still another embodiment according to the present invention is shown in FIG. 40. In composite article 365, non-electrically-connected (and interdigitated) co-planar patterned electrodes 335 and 340 (derived using the same or different EC compositions, as described above) are arranged contiguously with planar surface 370 of substrate 345. Within the same plane, at least some gaps or some surface area in the same plane, but between non-electrically-connected co-planar patterned electrodes 335 and 340 (thus, between the interdigitated "fingers") is filled with dielectric material 375 provided from a D-P composition (described above) containing (b) particles. An opposing surface (not shown) of dry PL 350 is arranged contiguously with and in direct contact to both dielectric material 375 and both non-electrically-connected co-planar patterned electrodes 335 and 340. While it is not shown in FIG. 40, an outermost dry protective layer (as described above) can be disposed over opposing surface 378 of dry PL 350.

In another embodiment (not illustrated), similar to that shown in FIG. 40, a continuous essentially uniform dry DL-P can be arranged to overlay two non-electrically-connected coplanar patterned electrodes (derived from the same or different EC compositions, as described above) that are not electrically connected but are arranged contiguously in the same plane on an opposing surface of a dry PL. This embodiment can be further modified by putting a substrate (as described above) underneath the structure (that is, underneath the two non-electrically-connected co-planar patterned electrodes). Also, an outermost dry protective layer (as described above) can be disposed over the continuous dry DL-P.

Figure 41:
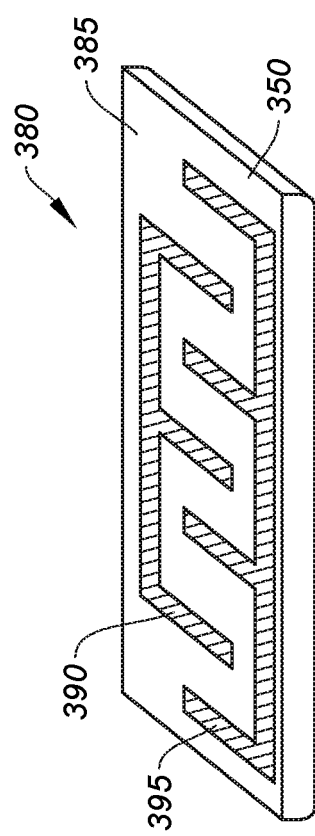
FIGS. 41 and 42 are exploded schematic perspective cross-sectional views of composite articles according to the present invention having co-planar patterned electrodes comprising (b) particles as described below.

In FIG. 41, composite article 380 comprises non-electrically-connected co-planar patterned electrodes 390 and 395 derived from the same or different EC-P compositions (for example, having the same or different (b) particles in the same or different amounts, as described above) that are formed on opposing planar surface 385 of dry PL 350, but they are not electrically connected, or in electrical communication, with each other. Such composite articles can comprise more than two of such non-electrically-connected co-planar patterned electrodes on opposing planar surface 385 of dry PL 350. Such composite articles can also include a substrate (not shown) under dry PL 350, an outermost dry protective layer (not shown) disposed over non-electrically-connected co-planar patterned electrodes 390 and 395, or both a substrate and an outermost dry protective layer.

Figure 42:
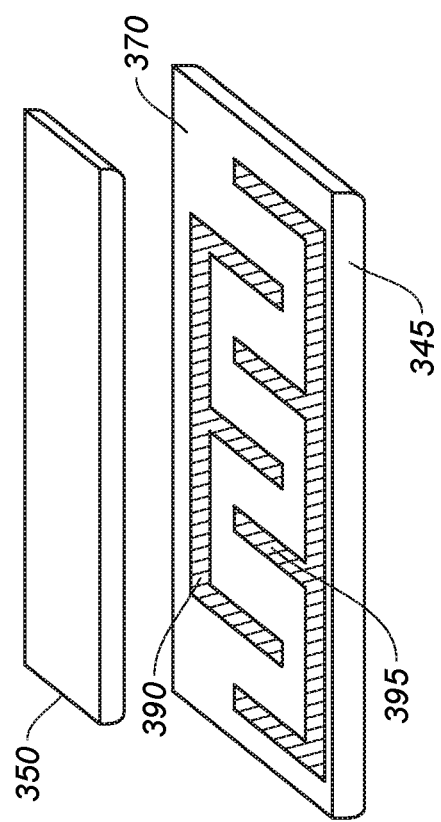

Yet another embodiment according to the present invention is shown in FIG. 42 wherein non-electrically-connected co-planar patterned electrodes 390 and 395 (derived from the same or different EC-P composition, as described above) are arranged contiguously with planar surface 370 of substrate 345 and are also arranged contiguously with and in direct contact with an opposing surface (not shown) of dry PL 350. No separate dry dielectric layer is shown for this embodiment. However, an outermost dry protective layer (not shown), that has dielectric properties, can be disposed over an opposing surface of dry PL 350 if desired.

Figure 45:
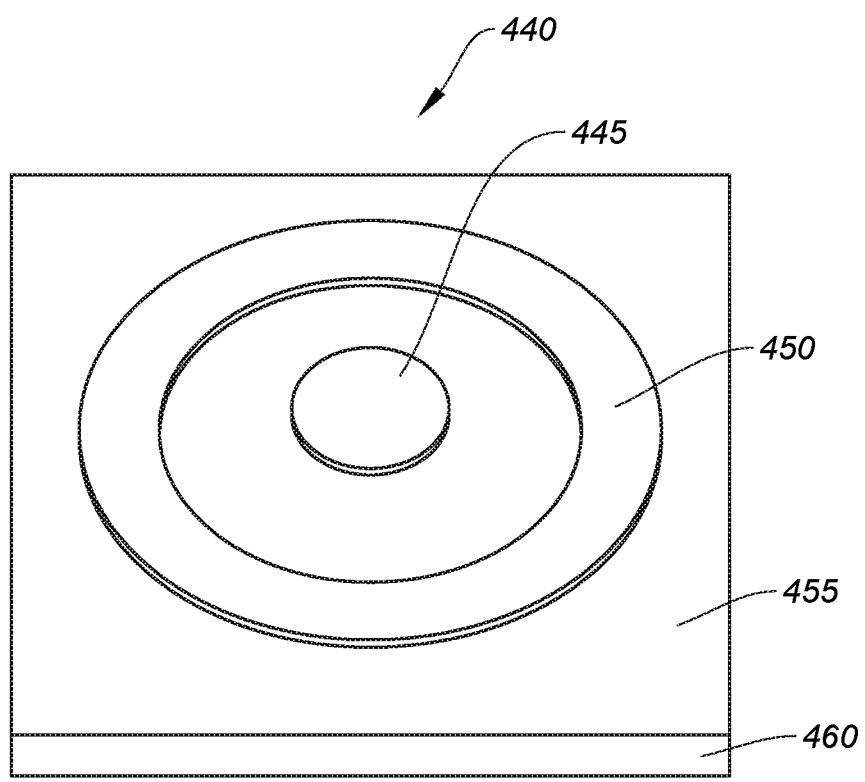
FIG. 45 is a schematic illustration of a composite article having concentric non-electrically-connected co-planar patterned electrodes.

FIG. 45 shows composite article 440 having non-electrically-connected co-planar patterned electrodes 445 and 450 in the shape of concentric circles, disposed on opposing surface 455 of dry PL 460. At least one of non-electrically-connected co-planar patterned electrodes 445 and 450 contains (b) particles.

Figure 46:
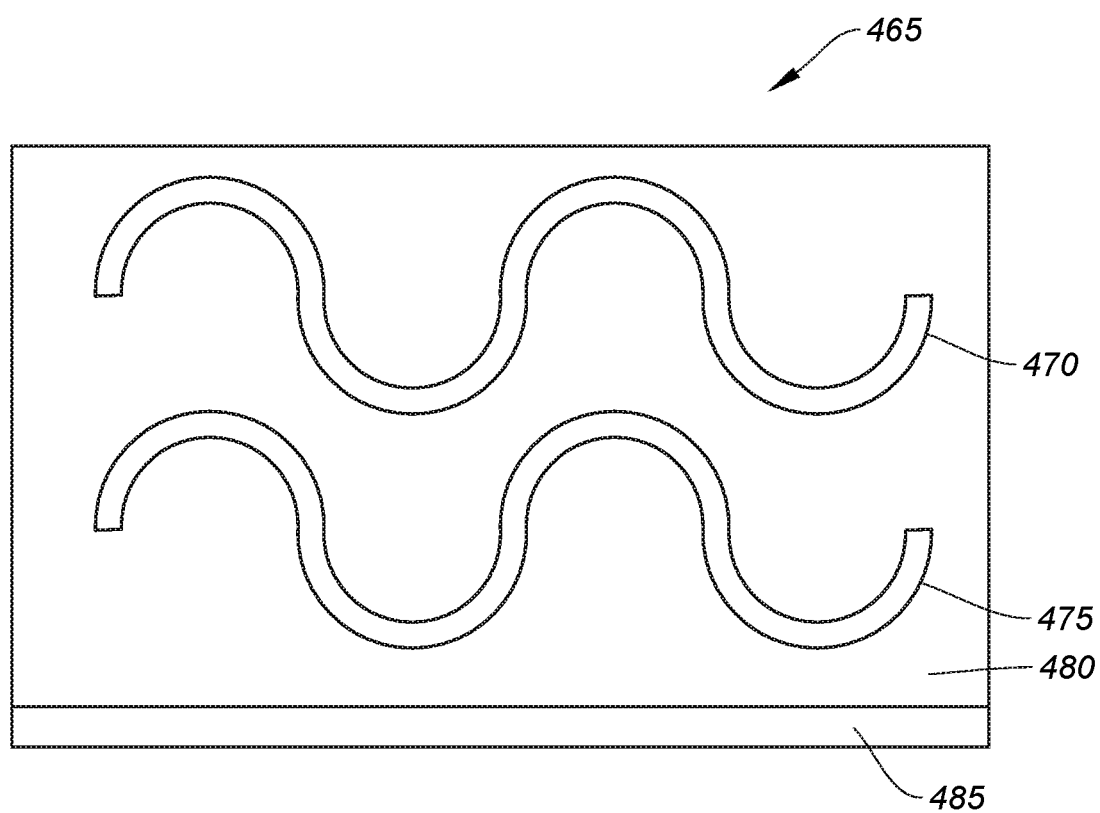
FIG. 46 is a schematic illustration of a composite article having serpentine non-electrically-connected co-planar patterned electrodes.

Similarly, FIG. 46 shows composite article 465 having non-electrically-connected co-planar patterned electrodes 470 and 475 in the serpentine shape, disposed on opposing surface 480 of dry PL 485. At least one of non-electrically-connected co-planar patterned electrodes 470 and 475 contains (b) particles.

As described herein, the basic composite article according to the present invention comprises a PL in combination with an ECL-P, DL-P, ECL, or a pair of non-electrically-connected co-planar patterned electrodes containing (b) particles, as long as each basic composite article comprises one of the components containing (b) particles. Such composite article structure represents a basic "unit" that can be incorporated or formed into any of the devices described herein. However, it would be appreciated by one skilled in the art, and as illustrated in several Figures, that a composite article (or corresponding device) according to the present invention could include additional PL's, ECL-P's, ECL's, and pairs of non-electrically-connected co-planar patterned electrodes. Such composite articles can be considered to comprise a "stack" of the requisite layers or electrodes in order to achieve the desired function.

For example, a composite article according to the present invention can comprise a basic stack comprising a PL having first and second opposing surfaces, and first and second electrodes arranged oppositely on the first and second opposing surfaces, wherein at least one of the electrodes is an ECL-P, or comprises at least one pair of non-electrically-connected co-planar patterned electrodes containing (b) particles. This composite article can further comprise a second PL arranged contiguously with one of the electrodes, and a third electrode (for example, an ECL-P, ECL, or pair of non-electrically-connected co-planar electrodes) arranged contiguously on the opposing surface of the PL. Such alternating PL and electrode(s) on the opposing surface can be arranged to any desired number, such as that the number of electrode "layers" in the composite article could be defined as (n+1), wherein n represents the number of PL's. Any or all of the electrode "layers" can be uniform layers (ECL-P's or ECL's) or comprise one or more pairs of non-electrically-connected co-planar electrodes.

Similar composite articles can be designed with one or more DL-P's along as there are a requisite number of PL's and electrode "layers." A large number of different composite article designs can be developed by one skilled in the art.

The present invention provides at least the following embodiments and combinations thereof, but other combinations of features are considered to be within the present invention as a skilled artisan would appreciate from the teaching of this disclosure:

1. A composite article comprising:
1) a first dry piezoelectric layer (first dry PL) comprising a piezoelectric material and having first and second opposing surfaces, and
2) a pair of non-electrically-connected co-planar patterned electrodes that are arranged contiguously with at least one of the first and second opposing surfaces of the first dry PL, each of the pair of non-electrically-connected co-planar patterned electrodes consisting essentially of:
(a) an electrically-conductive material; and
(b) particles distributed within the (a) electrically-conductive material, the (b) particles having a Young's modulus that is different from the Young's modulus of the (a) electrically-conductive material by at least 10%, and which (b) particles have a d50 of at least 500 nm and up to and including 500 µm and a polydispersity coefficient of less than or equal to 3, provided that the weight ratio of the (b) particles to the (a) electrically-conductive material is at least 0.01:1 and up to and including 10:1, provided that the weight ratio of the (b) particles to the (a) electrically-conductive material is at least 0.01:1 and up to and including 10:1;
provided that:
when each of the pair of non-electrically-connected co-planar patterned electrodes is arranged adjacent to an insulating substrate, it exhibits a resistivity of less than 10,000 ohms-cm, and
optionally, each of the pair of non-electrically-connected co-planar patterned electrodes further includes (c) a binder material that is non-electrically-conductive and has a weight average molecular weight of at least 5,000.

2. The composite article of embodiment 1, wherein the (a) electrically-conductive material exhibits an electrical conductivity of at least $2 \times 10^{-4}$ S/m as measured by a Van der Pauw 4 probe method.

3. The composite article of embodiment 1 or 2, wherein the (a) electrically-conductive material comprises particles having a median equivalent spherical volume diameter of at least 1 nm and up to and including 1000 µm and a polydispersity coefficient that is less than or equal to 2.

4. The composite article of any of embodiments 1 to 3, wherein the (a) electrically-conductive material comprises one or more of silver, gold, platinum, palladium, copper, nickel, titanium, and an electrically-conductive form of carbon.

5. The composite article of any of embodiments 1 to 3, wherein the (a) electrically-conductive material is an electrically-conductive organic polymer.

6. The composite article of any of embodiments 1 to 5, wherein the (a) electrically-conductive material consists essentially of silver nanoparticles having a d50 of less than or equal to 60 μm and a d90 of less than or equal to 500 μm and a polydispersity that is less than or equal to 1.

7. The composite article of embodiment 6, wherein the silver nanoparticles have a d50 of at least 1 nm and up to and including 230 nm and a d90 of less than or equal to 300 μm.

8. The composite article of any of embodiments 1 to 7, wherein when each of the pair of non-electrically-connected co-planar patterned electrodes is arranged contiguously with an insulating substrate, it exhibits a resistivity of less than 500 ohm-cm.

9. The composite article of any of embodiments 1 to 8, wherein when each of the pair of non-electrically-connected co-planar patterned electrodes is arranged contiguously with an insulating substrate, it exhibits a resistivity of less than 150 ohm-cm.

10. The composite article of any of embodiments 1 to 9, wherein the (a) electrically-conductive material is present in an amount of at least 2 weight % and up to and including 99 weight %, based on the total weight of each of the pair of non-electrically-connected co-planar patterned electrodes.

11. The composite article of any of embodiments 1 to 10, wherein the (b) particles are composed of one or more polymeric materials.

12. The composite article of any of embodiments 1 to 11, wherein the (b) particles are composed of one or more inorganic materials.

13. The composite article of any of embodiments 1 to 12, wherein the (b) particles are solid and non-compressible.

14. The composite article of any of embodiments 1 to 13, wherein the (b) particles comprise one or more elastomeric polymers.

15. The composite article of any of embodiments 1 to 14, wherein the (b) particles are core-shell particles having a core that is comprised of a material different from the material comprising the shell.

16. The composite article of any of embodiments 1 to 15, wherein the (c) binder material is present and comprises one or more polyurethanes, acrylate polymers, polyvinyl acetals, or polyacrylate precursors to an acrylate polymer.

17. The composite article of any of embodiments 1 to 16, wherein the (c) binder material is present in an amount of at least 0.1 weight % and up to and including 10 weight %, based on the total weight of the at least one dry ECL-P.

18. The composite article of any of embodiments 1 to 17, further comprising an insulating substrate and the pair of non-electrically-connected co-planar patterned electrodes are arranged contiguously between the insulating substrate and the first dry PL.

19. The composite article of embodiment 18, further comprising a first dry electrically-conductive layer containing no (b) particles (first dry ECL), which first dry ECL is arranged contiguously with the second opposing surface of the first dry PL.

20. The composite article of embodiment 19, further comprising a first dry electrically-conductive layer containing (b) particles (first dry ECL-P) that is arranged contiguously with the first dry ECL that is arranged contiguously with the second opposing surface of the first dry PL.

21. The composite article of any of embodiments 1 to 20, further comprising dielectric material arranged in the same plane as and between the pair of non-electrically-connected co-planar patterned electrodes.

22. The composite article of any of embodiments 1 to 21, wherein the (b) particles have a polydispersity coefficient that is less than or equal to 1.5.

23. The composite article of any of embodiments 1 to 22, wherein the (b) particles have a polydispersity coefficient that is less than or equal to 1.25.

24. The composite article of any of embodiments 1 to 23, wherein the first dry PL comprises beta phase polyvinylidene fluoride.

25. The composite article of any of embodiments 1 to 24, further comprising a second dry piezoelectric layer (second dry PL) comprising a piezoelectric material, which is arranged contiguously with an electrically-conductive layer or a pair of non-electrically-connected co-planar patterned electrodes that are arranged between the first dry PL and the second dry PL.

The following Examples are provided to illustrate the practice of this invention and are not meant to be limiting in any manner.

The median spherical volume diameters (d50) and other parameters for various (b) particles used in the Examples provided below are listed in TABLE IV.

TABLE IV

| (b) Particle | PSD D50 (μm) | PSD Mean (μm) | PSD Standard Deviation (μm) | PSD Polydispersity Coefficient |
|---|---|---|---|---|
| Polybead ® 50 (Polysciences, Inc.) | 46.02 | 49.70 | 17.3639 | 0.575 |
| Polybead ® 100 (Polysciences, Inc.) | 91.31 | 106.11 | 55.9391 | 0.867 |
| Polybead ® 200 (Polysciences, Inc.) | 201.43 | 232.42 | 98.7651 | 0.699 |
| MicroTouch ™ 800XF (Micro Powders, Inc.) | 7.75 | 8.09 | 3.4757 | 0.706 |
| MicroTouch ™ 800VF (Micro Powders, Inc.) | 10.74 | 11.37 | 5.3191 | 0.770 |
| MicroTouch ™ 800F (Micro Powders, Inc.) | 21.05 | 25.95 | 25.2926 | 1.603 |
| Ceramic microspheres W-210 | 7.08 | 7.37 | 3.2082 | 0.716 |
| Ceramic microspheres W-410 | 9.43 | 9.98 | 4.3572 | 0.718 |
| Ceramic microspheres W-610 | 10.71 | 11.38 | 5.0809 | 0.734 |
| Nickel powder type 123 | 13.44 | 15.11 | 7.3233 | 0.797 |
| Nickel powder type 525LD | 16.49 | 16.71 | 5.7776 | 0.569 |
| Nickel conductive flake HCA-1 | 34.03 | 66.67 | 72.9515 | 1.800 |
| Nickel flake fine water grade (FWG) | 56.08 | 112.24 | 116.6275 | 1.709 |

The volume weighted frequency distribution of the particle size of samples was measured by methods known to those skilled in the art of particle sizing. Briefly, an amount of a particulate-containing sample was dispersed in water with sonication for 2 minutes and then the volume weighted frequency distribution of the particles in the dispersion was measured using a Horiba Ltd. LA-920 particle size analyzer that obtains a volume weighted frequency distribution of dispersed particles from 0.05 μm to 2000 μm by static light scatter. All presented data are based on volume weighted frequency distributions of the particles and the equivalent spherical diameter model. The term "volume weighted frequency distribution" is used interchangeably here with "particle size distribution" and "PSD."

The polydispersity coefficient for a volume weighted frequency distribution is calculated from the mean particle size of the distribution and the standard deviation (or the square root of the variance) using the following formula:

$$\text{Polydispersity coefficient} = \frac{1.654\sigma}{\langle d \rangle}$$

wherein σ is the standard deviation of the particle size distribution and (d) in this equation is the mean spherical volume diameter of the volume weighted frequency distribution of the particle size. Calculation of the polydispersity coefficient of the volume weighted frequency distribution of each type of particle shown in TABLE IV above. The polydispersity coefficient given in TABLE IV is greater than 0.05 for every particle size distribution measured, indicating that the volume weighted frequency distribution is not monodisperse. A polydispersity coefficient greater than 0.05 indicates that many different particle sizes occur within the particle size distribution and that the observed volume weighted frequency distribution has less than 90% of the size distribution lying within 5% of the median size.

Figure 20:
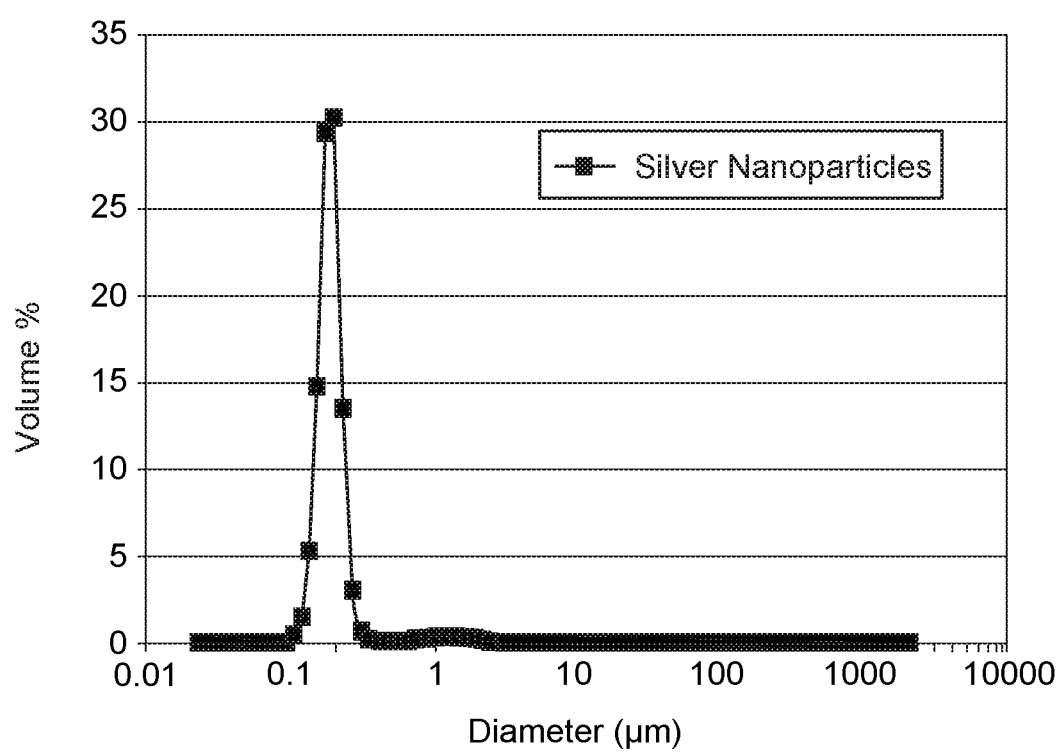
FIG. 20 is a graphical representation of particle size dispersity for the silver nanoparticles used in Comparative Example 1 below.

A typical volume weighted frequency distribution for the particle size of the silver dispersion prepared and used in Comparative Example 1 is shown in FIG. 20. The median particle size of the volume weighted frequency distribution for the silver dispersion used in Comparative Example 1 is 0.1712 μm; the mean value of the frequency distribution is 0.1876 μm; the standard deviation of the frequency distribution is 0.1368 μm; and the polydispersity coefficient of the frequency distribution is 1.2. According to the noted NIST Special Publication 960-3 publication, the particle size distribution of the silver particles indicates that Comparative Example 1 is a colloid and that the particles are nanosized or nanoparticles. The NIST special Publication SP 960-1 (cited above) defines mode as "the value of the variate for which the relative frequency in a series of observations reaches a local maximum." The variate is the equivalent spherical diameter particle size in the volume weighted frequency distribution of the measured particle size. An examination of the different volume weighted frequency distributions for the different particles shows that more than one mode is often present in the frequency distribution. For example, the volume weighted frequency distribution for the ECL Compositions flake morphology (HCA-1 and FWG) for Comparative Examples 2-4 below show two modes in the volume weighted frequency distribution of the particles.

Comparative Example 1: EC Composition Without (b) Particles

This aqueous silver nanoparticle dispersion was prepared as follows:

To a 1000 ml three-neck flask were added at 90° C. and under nitrogen, 40 g of a 50 weight % solution of a polymer derived from acrylic acid and maleic acid (aim 50:50 molar ratio and $M_w$ of 3,000, available from Sigma-Aldrich) and 240 g of a 50% aqueous diethanolamine solution. To this solution, 120 g of a 54.75 weight % aqueous silver nitrate solution was added dropwise over 150 minutes. The resulting reaction dispersion was stirred overnight before being cooled to room temperature. The dispersion was then sonicated for 20 minutes and solids were permitted to settle. After the supernatant was decanted off, the concentrated dispersion of silver nanoparticles was dialyzed overnight and then centrifuged for 2 hours at 7000 rpm. The resulting silver nanoparticle slurry was then re-dispersed in water, sonicated, and filtered through a 1 μm filter. This silver nanoparticle dispersion is also referred to herein as the "silver colloid." The aqueous silver nanoparticle dispersion at >70 weight % was then mixed with 0.5 weight % of Acrysol™ RM-12 W, a polyurethane resin rheology modifier solution in water using a FlackTek Speedmixer™ DAC 150 speedmixer for 1-3 minutes at a speed >1500 rpm to provide the desired aqueous silver nanoparticle dispersion with binder material. Acrysol™ RM-12 W contains 19 weight % of polyurethane resin rheology modifier solids and the polyurethane resin rheology modifier in Acrysol™ RM-12 W was used as a (c) binder material.

A typical volume weighted frequency distribution for the particle size of the silver dispersion prepared and used in Comparative Example 1 is shown in FIG. 20. According to the noted NIST Special Publication 960-3 publication, the particle size distribution of the silver particles indicates that Comparative Example 1 is a colloid and that the particles are nanosized or nanoparticles.

The following "wet" EC-P compositions prepared according to the present invention are described in Invention Examples 1-21. TABLE V below provides details as to the amounts of weight % solids of (a) electrically-conductive material, weight % solids of a water-soluble or water-dispersible (c) polyurethane resin binder material, weight % solids of (b) particles, the weight % of the (d) solvent medium, and the particle d50 in micrometers in the EC-P compositions of Invention Examples 1-20. In addition, TABLE V shows the calculated weight ratio of (b) particles to the (a) silver nanoparticles.

Invention Example 1: EC-P Composition 3 weight % of spherical crosslinked poly(styrene-co-divinyl benzene-co-ethylvinyl benzene) (b) particles (d50 particle size of 46 pin) was added to a weighed amount of the Comparative Example 1 EC composition described above before mixing using the FlackTek Speedmixer™ DAC 150 speedmixer.

Invention Example 2: EC-P Composition 7 weight % of spherical crosslinked poly(styrene-co-divinyl benzene-co-ethylvinyl benzene) (b) particles (d50 particle size of 91 μm) was added to a weighed amount of the Comparative Example 1 EC composition described above before mixing using the FlackTek Speedmixer™ DAC 150 speedmixer.

Invention Example 3: EC-P Composition 7 weight % of spherical crosslinked poly(styrene-co-divinyl benzene-co-ethylvinyl benzene) (b) particles (d50 particle size of 201 μm) was added to a weighed amount of the Comparative Example 1 EC composition described above before mixing using the FlackTek Speedmixer™ DAC 150 speedmixer.

Figure 21:
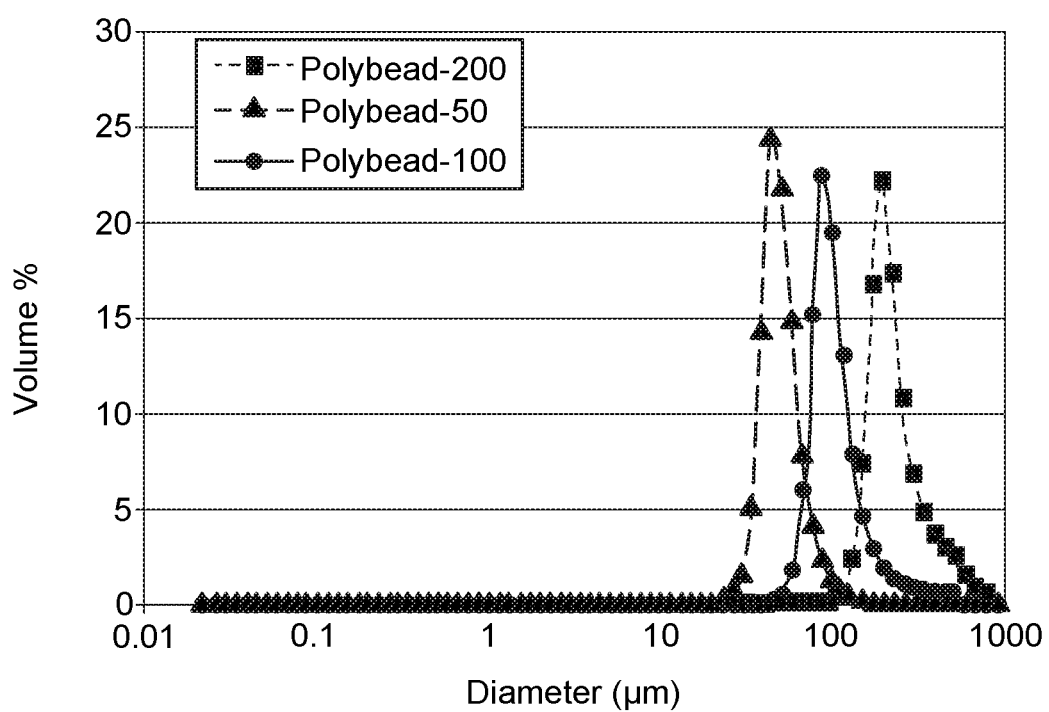
FIG. 21 is a graphical representation of particle size dispersity for the (b) particles used in Invention Examples 1-3 below.

The typical volume weighted frequency distribution for the particle size of crosslinked polystyrene particles used in Invention Examples 1-3 are shown in FIG. 21. The crosslinked polystyrene resin particles are comprised of beads of polystyrene resin (copolymer of styrene and divinylbenzene/ ethylvinyl benzene mixture) as described in U.S. Pat. No. 7,441,717 (Majka et al.) and U.S. Pat. No. 5,478,705 (Caekai et al.) and are notated as Polybead® 50, Polybead® 100, and Polybead® 200 in the TABLE IV above. The preparation of such crosslinked polystyrene particles and other resin particles that are useful in the present invention is described in the noted U.S. Pat. No. 5,478,705 the disclosure of which is hereby incorporated by reference in its entirety.

Invention Example 4: EC-P Composition 7.5 weight % of solid alkali alumino silicate ceramic microsphere (b) particles (3M Ceramic Microspheres White Grade W-210, having a d50 particle size of 7 μm) was added to a weighed amount of the Comparative Example 1 EC composition described above before mixing using the FlackTek Speedmixer™ DAC 150 speedmixer.

Invention Example 5: EC-P Composition 7.5 weight % of solid alkali alumino silicate ceramic microsphere (b) particles (3M Ceramic Microspheres White Grade W-410, having a d50 particle size of 9.4 μm) was added to a weighed amount of the Comparative Example 1 EC composition described above before mixing using the FlackTek Speedmixer™ DAC 150 speedmixer.

Invention Example 6: EC-P Composition 7.5 weight % of solid alkali alumino silicate ceramic microsphere (b) particles (3M Ceramic Microspheres White Grade W-610, having a d50 particle size of 10.7 μm) was added to a weighed amount of the Comparative Example 1 EC composition described above before mixing using the FlackTek Speedmixer™ DAC 150 speedmixer.

Figure 23:
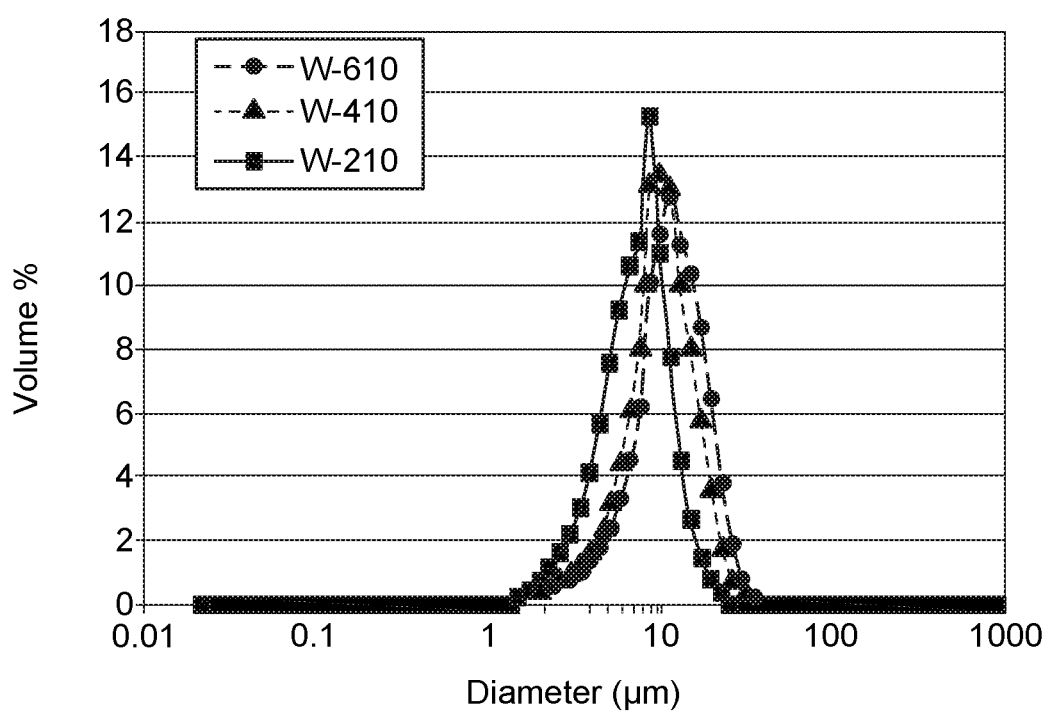
FIG. 23 is a graphical representation of particle size dispersity for the (b) particles used in Invention Examples 4-6 below.

The typical volume weighted frequency distribution for the particle size of spherical alumino-silicate particles used in Invention Examples 4-6 are shown in FIG. 23. The spherical alumino-silicate ceramic particles are commercially available particles (3M ceramic microspheres White Grades W-210, W-410, and W-610) supplied by 3M Energy and Advance Materials Division, St. Paul, Minn.

Invention Example 7: EC-P Composition 1 weight % of spherical crosslinked aliphatic polyurethane (b) particles (Micro Powders, Inc. MicroTouch™ 850 XF with an effective d50 particle size of 7.75 μm) was added to a weighed amount of the Comparative Example 1 EC composition described above before mixing using the FlackTek Speedmixer™ DAC 150 speedmixer.

Invention Example 8: EC-P Composition 2 weight % of spherical crosslinked aliphatic polyurethane (b) particles (Micro Powders, Inc. MicroTouch™ 850 XF with an effective d50 particle size of 7.75 μm) was added to a weighed amount of the Comparative Example 1 EC composition described above before mixing using the FlackTek Speedmixer™ DAC 150 speedmixer.

Invention Example 9: EC-P Composition 7.5 weight % of spherical crosslinked aliphatic polyurethane (b) particles (Micro Powders, Inc. MicroTouch™ 850 XF with an effective d50 particle size of 7.75 μm) was added to a weighed amount of the Comparative Example 1 EC composition described above before mixing using the FlackTek Speedmixer™ DAC 150 speedmixer.

Invention Example 10: EC-P Composition 12.5 weight % of spherical crosslinked aliphatic polyurethane (b) particles (Micro Powders, Inc. MicroTouch™ 850 XF with an effective d50 particle size of 7.75 μm) was added to a weighed amount of the Comparative Example 1 EC composition described above before mixing using the FlackTek Speedmixer™ DAC 150 speedmixer.

Invention Example 11: EC-P Composition 7 weight % of spherical crosslinked aliphatic polyurethane (b) particles (Micro Powders, Inc. MicroTouch™ 800 VF with an effective d50 particle size of 12-16 μm) was added to a weighed amount of the Comparative Example 1 EC composition described above before mixing using the FlackTek Speedmixer™ DAC 150 speedmixer.

Invention Example 12: EC-P Composition 7 weight % of spherical crosslinked aliphatic polyurethane (b) particles (Micro Powders, Inc. MicroTouch™ 800F with an effective d50 particle size of 21 μm) was added to a weighed amount of the Comparative Example 1 EC composition described above before mixing using the FlackTek Speedmixer™ DAC 150 speedmixer.

Figure 22:
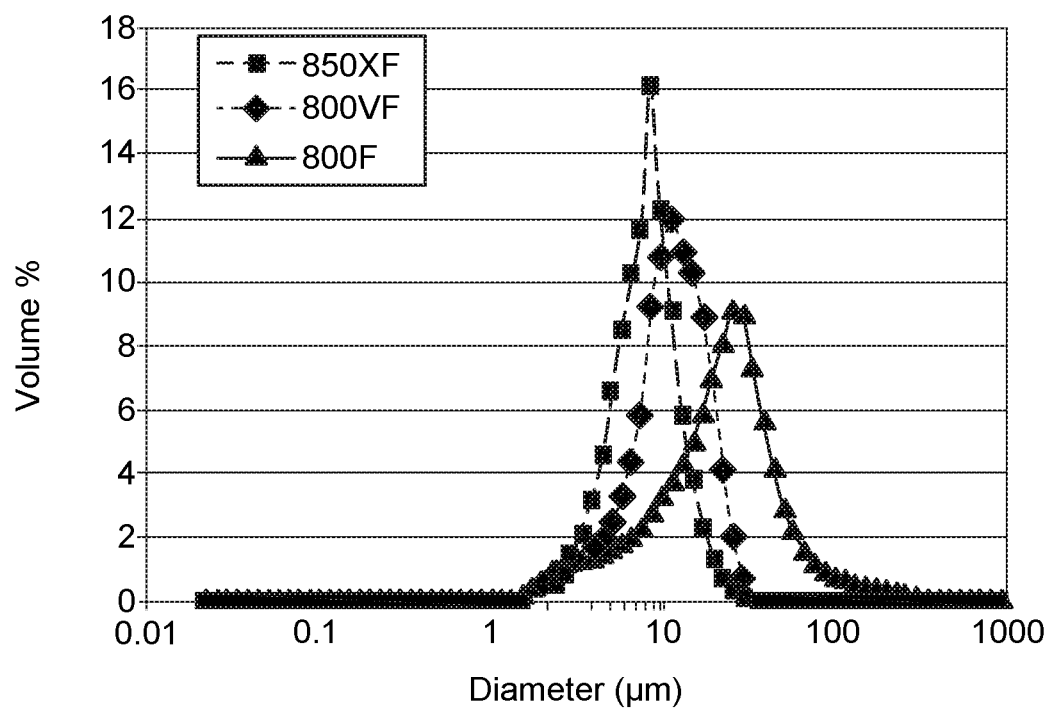
FIG. 22 is a graphical representation of particle size dispersity for the (b) particles used in Invention Examples 7-12 below.

The typical volume weighted frequency distribution for the particle size of spherical crosslinked aliphatic polyurethane particles used in Invention Examples 7-12 are shown in FIG. 22. The spherical crosslinked aliphatic polyurethane particles are commercially available particles (MicroTouch™ 800F, 800VF, and 850XF) supplied by Micro Powders, Inc. Tarrytown, N.Y.

Invention Example 13: EC-P Composition 5 weight % of low density filamentary powder nickel (b) particles (Novamet, Nickel Powder 525LD, with an effective D50 particle size of 16.5 μm in size) was added to a weighed amount of the Comparative Example 1 EC composition described above before mixing using the FlackTek Speedmixer™ DAC 150 speedmixer.

Invention Example 14: EC-P Composition 5 weight % of irregular platelet nickel (b) particles (Novamet, Conductive Nickel Flake HCA-1, with an effective d50 particle size of 34 μm and an aspect ratio approaching 20:1) was added to a weighed amount of the Comparative Example 1 EC composition described above before mixing using the FlackTek Speedmixer™ DAC 150 speedmixer.

Invention Example 15: EC-P Composition 5 weight % of platelet nickel (b) particles (Novamet, Nickel flake-Fine Water Grade with an effective d50 of 56 μm) was added to a weighed amount of the Comparative Example 1 EC composition described above before mixing using the FlackTek Speedmixer™ DAC 150 speedmixer.

Invention Example 16: EC-P Composition 5 weight % of spiky nickel (b) particles (Novamet, Nickel Powder Type 123 with an effective d50 particle size of 13

μm) was added to a weighed amount of the Comparative Example 1 EC composition described above before mixing using the FlackTek Speedmixer™ DAC 150 speedmixer.

Figure 24:
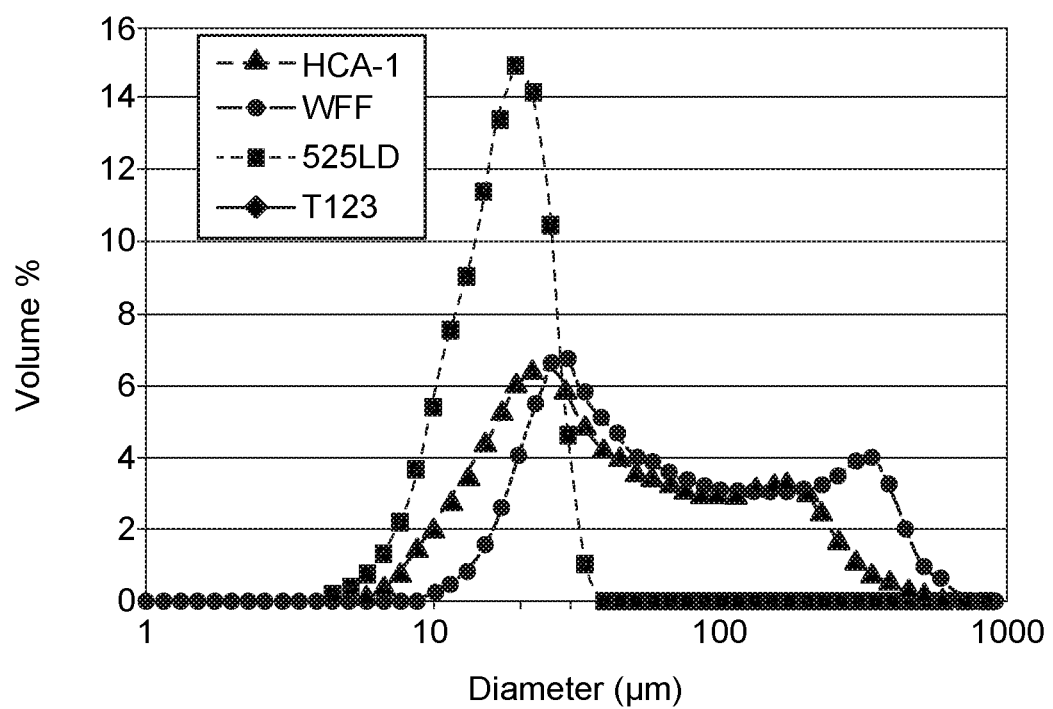
FIG. 24 is a graphical representation of particle size dispersity for the (b) particles used in Invention Examples 13-16 below.

The typical volume weighted frequency distribution for the particle size of different types of nickel containing particles used in Invention Examples 13-16 are shown in FIG. 24. The spherical nickel particles type T123 were commercially available particles manufactured by Vale Canada Limited and supplied by Novamet Specialty Products Corporation, Lebanon, Tenn. The type 525LD nickel particles, the type HCA-1 nickel flake particles and the fine water grade (FWG) nickel flake particles were supplied by Novamet Specialty Products Corporation, Lebanon, Tenn.

Invention Example 17: EC-P Composition

An aqueous silver nanoparticle dispersion with >70 weight % silver nanoparticle solids as described above for Comparative Example 1 (but with no polyurethane added) was mixed with 3.5 weight % of poly(vinyl pyrrolidone) (c) binder material (K30, $M_w$ of 40,000) and 12 weight % of solid alkali alumino silicate ceramic microsphere (b) particles (3M Ceramic Microspheres White Grade W-410 with an effective d50 particle size of 9.4 μm) using the FlackTek Speedmixer™ DAC 150 speedmixer for 1-3 minutes at a speed >1500 rpm.

Invention Example 18: EC-P Composition

An aqueous silver nanoparticle dispersion with >70 weight % silver nanoparticle solids as described above for Comparative Example 1 (but with no polyurethane added) was mixed with 3 weight % of poly(3,4-ethylenedioxythiophene) polystyrene sulfonate (c) binder material (Baytron™ PHC V4) and 7 weight % of solid alkali alumino silicate ceramic microsphere (b) particles (3M Ceramic Microspheres White Grade W-410 with an effective d50 particle size of 9.4 μm) using the FlackTek Speedmixer™ DAC 150 speedmixer for 1-3 minutes at a speed >1500 rpm.

Invention Example 19: EC-P Composition

An aqueous silver nanoparticle dispersion with >70 weight % silver nanoparticle solids as described above for Comparative Example 1 (but with no polyurethane added) was mixed with 2 weight % of a thermoplastic, polyvinyl butyral resin (c) binder material (Butvar™ 76) and 7 weight % of solid alkali alumino silicate ceramic microsphere (b) particles (3M Ceramic Microspheres White Grade W-410 with an effective d50 particle size of 9.4 μm) using the FlackTek Speedmixer™ DAC 150 speedmixer for 1-3 minutes at a speed >1500 rpm.

Invention Example 20: EC-P Composition

An aqueous silver nanoparticle dispersion with >70 weight % silver nanoparticle solids as described above for Comparative Example 1 (but with no polyurethane added) was mixed with 4 weight % of a radiation curable rheology modifier, ethoxylated trimethylolpropane triacrylate (Sartomer SR415) and 0.4 weight % of a free radical initiator, 4,4'-azobis(4-cyanovaleric Acid) (Vazo-68) used to form a (c) binder material, and 6 weight % of solid alkali alumino silicate ceramic microsphere (b) particles (3M Ceramic Microspheres White Grade W-410 with an effective d50 particle size of 9.4 μm) using the FlackTek Speedmixer™ DAC 150 speedmixer for 1-3 minutes at a speed >1500 rpm.

Invention Example 21: EC-P Composition

This invention example demonstrates the ability to use a different (a) electrically-conductive material other than the silver nanoparticles described above in Invention Examples 1-20.

A conductive polymer dispersed in water, poly(3,4-ethylenedioxythiophene) polystyrene sulfonate (Baytron™ PHC V4) was used as the (a) electrically-conductive material. This polymer also served as the (c) binder material and was mixed with ethylene glycol and solid alkali alumino silicate ceramic microsphere particles (3M Ceramic Microspheres White Grade W-410 with an effective d50 particle size of 9.4 μm) using the FlackTek Speedmixer™ DAC 150 speedmixer for 1-3 minutes at >1500 rpm. The ethylene glycol functioned as a co-solvent and secondary rheology modifier in the ECL-P composition. The weight ratio was 83.5:9:7.5 for the poly(3,4-ethylenedioxythiophene) polystyrene sulfonate: ethylene glycol: solid alkali alumino silicate ceramic microsphere particles. The resulting EC-P composition contained about 82.5 weight % water as the (d) solvent medium and the weight ratio of the (b) solid particles to the (a) electrically-conductive polymer was 7:1.

The following comparative examples demonstrate the need for the (a) electrically-conductive material to have a Young's modulus different from that of the (b) particles. In these examples, commercially available "inks" containing silver nanoparticles of various sizes as the (a) electrically-conductive materials were mixed to show the necessity of different Young's modulus, not solely particle size variations. These comparative examples are outside of the present invention.

Comparative Example 2: EC Composition

An aqueous electrically-conductive silver ink, (NovaCentrix HPS-030LV) comprising nanometer-sized (a) electrically-conductive particles was mixed with an aqueous electrically-conductive silver ink (NovaCentrix HPS-021LV) comprising micrometer-sized flake (b) particles in an amount of 1.5 grams of (b) particles to 0.5 grams of (a) electrically-conductive particles to provide a weight ratio of 75:25 (h) to (a) electrically-conductive particles. The NovaCentrix HPS-030LV and HPS-021LV were used as received and no (c) binder material was added to the dispersion. The resulting dispersion was mixed in the FlackTek Speedmixer™ DAC 150 speedmixer for 1-3 minutes at a speed >1500 rpm.

Comparative Example 3: EC Composition

An aqueous electrically-conductive silver ink, (NovaCentrix HPS-030LV) comprising nanometer-sized (a) electrically-conductive particles was mixed with an aqueous electrically-conductive silver ink (NovaCentrix HPS-021LV) comprising micrometer-sized flake (b) particles in an amount of 1 gram of (b) particles to 1 gram of (a) electrically-conductive particles to provide a weight ratio of 50:50 (b) particles to (a) electrically-conductive particles. The NovaCentrix HPS-030LV and HPS-021LV were used as received and no (c) binder material was added to the dispersion. The resulting dispersion was mixed in the FlackTek Speedmixer™ DAC 150 speedmixer for 1-3 minutes at a speed >1500 rpm.

Comparative Example 4: EC Composition

An aqueous electrically-conductive silver ink, (NovaCentrix HPS-030LV) comprising nanometer-sized (a) electrically-conductive particles was mixed with an aqueous electrically-conductive silver ink (NovaCentrix HPS-021LV) comprising micrometer-sized flake (b) particles in an amount of 0.5 gram of (b) particles to 1.5 grams of (a) electrically-conductive particles to provide a weight ratio of 25:75 (b) to (a) particles. The NovaCentrix HPS-030LV and HPS-021LV were used as received and no (c) binder material was added to the dispersion. The resulting dispersion was mixed in the FlackTek Speedmixer™ DAC 150 speedmixer for 1-3 minutes at a speed >1500 rpm.

Figure 25:
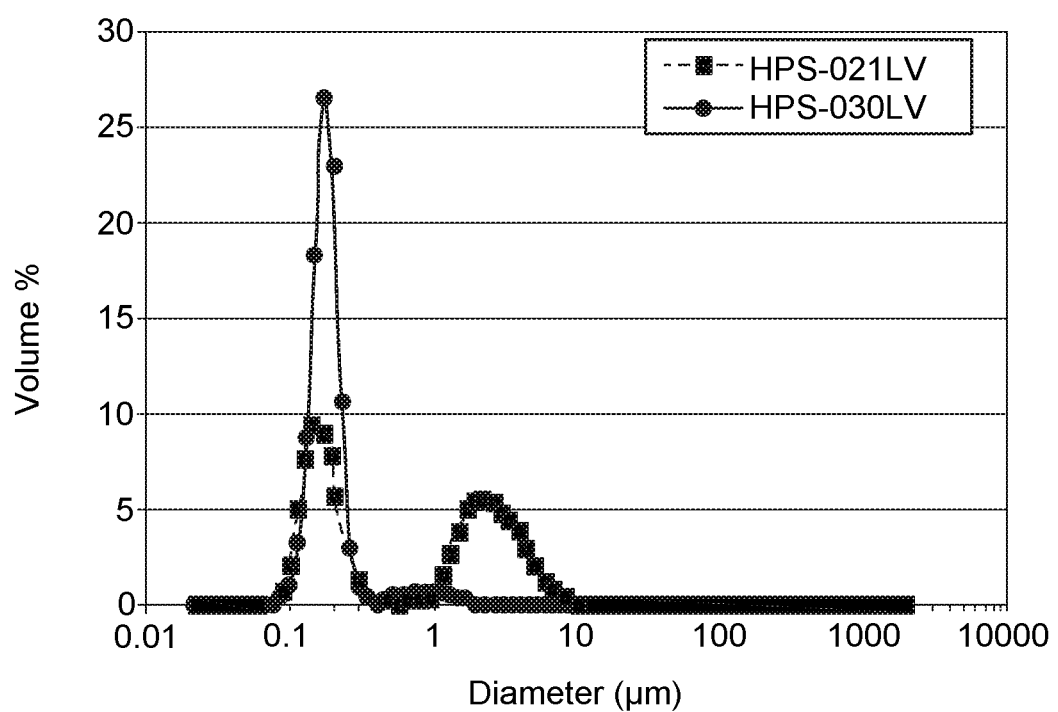
FIG. 25 is a graphical representation of particle size dispersity for the silver nanoparticles used in Comparative Examples 2-4 below.

FIG. 25 shows the volume weighted frequency distribution for the particle size of the two commercially available silver inks produced by Novamet and used in Comparative Examples 2-4. The measured data from the particle size distribution for these silver inks are a median of 0.2918 µm; mean of 1.3452 µm; standard deviation of 1.4826 µm; and a polydispersity coefficient of 1.81 for the HPS-021LV HS ink; and a median of 0.1656 µm; mean of 0.2014 µm; standard deviation of 0.1699 µm; and a polydispersity coefficient of 1.39 for the HPS-030LV HS ink.

The following TABLE V summarizes the compositional features and amounts for the EC-P compositions of Invention Examples 1-21.

TABLE V

| Invention Example | Solid weight % of (a) Silver Nanoparticles or conductive media | Solid weight % of (c) Binder Material | Solid Weight % of (b) Particles | Weight % of (d) Solvent Medium | (b) Particles d50 (µm) | (b) to (a) Weight Ratio | Type of (b) Particles |
|---|---|---|---|---|---|---|---|
| 1 | 72.4 | 0.1 | 3 | 24.5 | 46 | 0.041 | 3 weight % of spherical crosslinked poly(styrene-co-divinyl benzene-co-ethylvinyl benzene (Polybead ® 50), 0.5% Acrysol ™ RM-12W |
| 2 | 69.4 | 0.1 | 7 | 23.5 | 91 | 0.101 | 7 weight % of spherical crosslinked poly(styrene-co-divinyl benzene-co-ethylvinyl benzene (Polybead ® 100), 0.5% Acrysol ™ RM-12W |
| 3 | 69.4 | 0.1 | 7 | 23.5 | 201 | 0.101 | 7 weight % of spherical crosslinked poly(styrene-co-divinyl benzene-co-ethylvinyl benzene (Polybead ® 200), 0.5% Acrysol ™ RM-12W |
| 4 | 69 | 0.1 | 7.5 | 23.4 | 7 | 0.109 | 7.5 weight % of solid alkali alumino silicate ceramic microsphere particles (3M Ceramic Microspheres White Grade W-210), 0.5% Acrysol ™ RM-12W |
| 5 | 69 | 0.1 | 7.5 | 23.4 | 9.4 | 0.109 | 7.5 weight % of solid alkali alumino silicate ceramic microsphere particles (3M Ceramic Microspheres White Grade W-410), 0.5% Acrysol ™ RM-12W |
| 6 | 69 | 0.1 | 7.5 | 23.4 | 10.7 | 0.109 | 7.5 weight % of solid alkali alumino silicate ceramic microsphere particles (3M Ceramic Microspheres White Grade W-610), 0.5% Acrysol ™ RM-12W |
| 7 | 73.9 | 0.1 | 1 | 24.8 | 7.75 | 0.027 | 1 weight % of crosslinked spherical aliphatic polyurethane particles (Micro Powders, Inc. MicroTouch ™ 850XF), 0.5% Acrysol ™ RM-12W |
| 8 | 73 | 0.1 | 2 | 24.8 | 7.75 | 0.027 | 2 weight % of crosslinked spherical aliphatic polyurethane micron-sized particles (Micro Powders, Inc. MicroTouch ™ 850XF), 0.5% Acrysol ™ RM-12W |
| 9 | 68.6 | 0.1 | 7.5 | 23.8 | 7.75 | 0.109 | 7.5 weight % of crosslinked spherical aliphatic polyurethane particles (Micro Powders, Inc. MicroTouch ™ 850XF), 0.5% Acrysol ™ RM-12W |
| 10 | 64.9 | 0.1 | 7 | 23.9 | 7.75 | 0.108 | 12.5 weight % of crosslinked spherical aliphatic polyurethane particles (Micro Powders, Inc. MicroTouch ™ 850XF), 0.5% Acrysol ™ RM-12W |
| 11 | 69 | 0.1 | 7 | 23.9 | 10.7 | 0.101 | 7 weight % of crosslinked spherical aliphatic polyurethane particles (Micro Powders, Inc. MicroTouch ™ 800VF), 0.5% Acrysol ™ RM-12W |
| 12 | 69 | 0.1 | 7 | 23.9 | 21 | 0.101 | 7 weight % of cross-linked spherical aliphatic polyurethane particles (Micro Powders, Inc. MicroTouch ™ 800F), 0.5% Acrysol ™ RM-12W |
| 13 | 70.5 | 0.1 | 5 | 24.4 | 16.5 | 0.071 | 5 weight % of low density filamentary powder nickel particles (Novamet, Nickel Powder 525LD), 0.5% Acrysol ™ RM-12W |
| 14 | 70.5 | 0.1 | 5 | 24.4 | 34 | 0.071 | 5 weight % of irregular platelet nickel particles (Novamet, Conductive Nickel Flake HCA-1), 0.5% Acrysol ™ RM-12W |
| 15 | 70.5 | 0.1 | 5 | 24.4 | 56 | 0.071 | 5 weight % of platelet nickel particles (Novamet, Nickel flake Fine Water), 0.5% Acrysol ™ RM-12W |
| 16 | 70.5 | 0.1 | 5 | 24.4 | 13 | 0.071 | 5 weight % of spiky nickel particles (Novamet, Nickel Powder Type 123), 0.5% Acrysol ™ RM-12W |
| 17 | 63 | 1.05 | 12 | 24 | 9.4 | 0.190 | 3.5 weight % of a (d) poly(vinyl pyrrolidone) K30, $M_w$ of 40,000) and 12 weight % of solid alkali alumino silicate ceramic microsphere particles (3M Ceramic Microspheres White Grade W-410) |

TABLE V-continued

| Invention Example | Solid weight % of (a) Silver Nanoparticles or conductive media | Solid weight % of (c) Binder Material | Solid Weight % of (b) Particles | Weight % of (d) Solvent Medium | (b) Particles d50 (μm) | (b) to (a) Weight Ratio | Type of (b) Particles |
|---|---|---|---|---|---|---|---|
| 18 | 67.5 | 0.036 | 7 | 24.6 | 9.4 | 0.103 | 3 weight % of (d) poly(3,4-ethylenedioxythiophene) polystyrene sulfonate (Baytron ™ PHC V4) and 7 weight % of solid alkali alumino silicate ceramic microsphere particles (3M Ceramic Microspheres White Grade W-410) |
| 19 | 68.25 | 0.2 | 7 | 24.6 | 9.4 | 0.103 | 2 weight % of a (d) thermoplastic, poly(vinyl butyral) resin (Butvar ™ 76) and 7 weight % of solid alkali alumino silicate ceramic microsphere particles (3M Ceramic Microspheres White Grade W-410) |
| 20 | 89.6 | 4.4 | 6 | 4 | 9.4 | 0.067 | 4 weight % of a radiation curable ethoxylated trimethylolpropane triacrylate (Sartomer SR415)) and 0.4 weight % of initiator, 4,4'-azobis(4-cyanovaleric acid (Vazo-68) to form (d) polymer and 6 weight % of solid alkali alumino silicate ceramic microsphere particles (3M Ceramic Microspheres White Grade W-410) |
| 21 | 1 | 9 | 7.5 | 82.5 | 9.4 | 7.5 | 7.5 weight % of solid alkali alumino silicate ceramic microsphere particles (3M Ceramic Microspheres White Grade W-410) |

The EC and EC-P compositions described above were used to form electrically-conductive layers in multilayer composite articles. The amounts of the components in those layers are shown in TABLE VI below.

The multilayer composite articles were prepared in the following Examples to have a dry piezoelectric layer (dry PL) (as shown in TABLE VII below) and one or more electrically-conductive layers as "electrodes," one of which layers was prepared using an EC-P composition also identified in TABLE VII below. In Comparative Examples 5-8 and Invention Examples 23-43, the dry PL already had a preformed electrically-conductive layer (electrode) on it before the EC-P composition was applied. The poly(vinylidene fluoride) PL was secured on a coating block while the specific EC or EC-P composition was applied using a pipette and the droplet(s) were spread evenly on the dry PL planar surface using a Meyer rod to provide a wet coverage of 22 μm to 86 μm. For Invention Example 44, a nickel electrode layer was preformed on the lead zirconium titanate ceramic planar surface by sputtering. Invention Example 44 was prepared by securing the ceramic on a coating block while the specific EC-P composition was applied using a pipette and the droplet(s) were spread evenly on the PL planar surface using a Meyer rod to provide a wet coverage of 22 μm.

TABLE VI

| Invention Example | Solid weight % of (a) Silver Nanoparticles or conductive media | Solid weight % of (c) Polymer | Solid Weight % of (b) Particles | (b) Particles d50 (μm) | Type of (b) Particles |
|---|---|---|---|---|---|
| 1 | 96 | 0.1 | 3.9 | 46 | 3 weight % of spherical crosslinked poly(styrene-co-divinyl benzene-co-ethylvinyl benzene (Polybead-50), 0.5% Acrysol ™ RM-12W |
| 2 | 90.7 | 0.1 | 9.2 | 91 | 7 weight % of spherical crosslinked poly(styrene-co-divinyl benzene-co-ethylvinyl benzene (Polybead-100), 0.5% Acrysol ™ RM-12W |
| 3 | 90.7 | 0.1 | 9.2 | 201 | 7 weight % of spherical crosslinked poly(styrene-co-divinyl benzene-co-ethylvinyl benzene (Polybead-200), 0.5% Acrysol ™ RM-12W |
| 4 | 90.1 | 0.1 | 9.8 | 7 | 7.5 weight % of solid alkali alumino silicate ceramic microsphere particles (3M Ceramic Microspheres White Grade W-210), 0.5% Acrysol ™ RM-12W |
| 5 | 90.1 | 0.1 | 9.8 | 9.4 | 7.5 weight % of solid alkali alumino silicate ceramic microsphere particles (3M Ceramic Microspheres White Grade W-410), 0.5% Acrysol ™ RM-12W |
| 6 | 90.1 | 0.1 | 9.8 | 10.7 | 7.5 weight % of solid alkali alumino silicate ceramic microsphere particles (3M Ceramic Microspheres White Grade W-610), 0.5% Acrysol ™ RM-12W |
| 7 | 98.9 | 0.1 | 1 | 7.75 | 1 weight % of crosslinked spherical aliphatic polyurethane particles (Micro Powders, Inc. MicroTouch ™ 850XF), 0.5% Acrysol ™ RM-12W |
| 8 | 97.4 | 0.1 | 2.5 | 7.75 | 2 weight % of crosslinked spherical aliphatic polyurethane micron-sized particles (Micro Powders, Inc. MicroTouch ™ 850XF), 0.5% Acrysol ™ RM-12W |

TABLE VI-continued

| Invention Example | Solid weight % of (a) Silver Nanoparticles or conductive media | Solid weight % of (c) Polymer | Solid Weight % of (b) Particles | (b) Particles d50 (μm) | Type of (b) Particles |
|---|---|---|---|---|---|
| 9 | 90.9 | 0.1 | 9.8 | 7.75 | 7.5 weight % of crosslinked spherical aliphatic polyurethane particles (Micro Powders, Inc. MicroTouch ™ 850XF), 0.5% Acrysol ™ RM-12W |
| 10 | 83.9 | 0.1 | 16 | 7.75 | 12.5 weight % of crosslinked spherical aliphatic polyurethane particles (Micro Powders, Inc. MicroTouch ™ 850XF), 0.5% Acrysol ™ RM-12W |
| 11 | 90.7 | 0.1 | 9.2 | 10.7 | 7 weight % of crosslinked spherical aliphatic polyurethane particles (Micro Powders, Inc. MicroTouch ™ 800VF), 0.5% Acrysol ™ RM-12W |
| 12 | 90.7 | 0.1 | 9.2 | 21 | 7 weight % of cross-linked spherical aliphatic polyurethane particles (Micro Powders, Inc. MicroTouch ™ 800F), 0.5% Acrysol ™ RM-12W |
| 13 | 93.3 | 0.1 | 6.6 | 16.5 | 5 weight % of low density filamentary powder nickel particles (Novamet, Nickel Powder 525LD), 0.5% Acrysol ™ RM-12W |
| 14 | 93.3 | 0.1 | 6.6 | 34 | 5 weight % of irregular platelet nickel particles (Novamet, Conductive Nickel Flake HCA-1), 0.5% Acrysol ™ RM-12W |
| 15 | 93.3 | 0.1 | 6.6 | 56 | 5 weight % of platelet nickel particles (Novamet, Nickel flake Fine Water), 0.5% Acrysol ™ RM-12W |
| 16 | 93.3 | 0.1 | 6.6 | 13 | 5 weight % of spiky nickel particles (Novamet, Nickel Powder Type 123), 0.5% Acrysol ™ RM-12W |
| 17 | 83.3 | 1.0 | 15.7 | 9.4 | 3.5 weight % of a (d) poly(vinyl pyrrolidone) K30, $M_w$ of 40,000) and 12 weight % of solid alkali alumino silicate ceramic microsphere particles (3M Ceramic Microspheres White Grade W-410) |
| 18 | 90.5 | 0.036 | 9.4 | 9.4 | 3 weight % of (d) poly(3,4-ethylenedioxythiophene) polystyrene sulfonate (Baytron ™ PHC V4) and 7 weight % of solid alkali alumino silicate ceramic microsphere particles (3M Ceramic Microspheres White Grade W-410) |
| 19 | 90.5 | 0.2 | 9.3 | 9.4 | 2 weight % of a (d) thermoplastic, poly(vinyl butyral) resin (Butvar ™ 76) and 7 weight % of solid alkali alumino silicate ceramic microsphere particles (3M Ceramic Microspheres White Grade W-410) |
| 20 | 89.6 | 4.4 | 6 | 9.4 | 4 weight % of a radiation curable ethoxylated trimethylolpropane triacrylate (Sartomer SR415)) and 0.4 weight % of initiator, 4,4'-azobis(4-cyanovaleric acid (Vazo-68) to form (d) polymer and 6 weight % of solid alkali alumino silicate ceramic microsphere particles (3M Ceramic Microspheres White Grade W-410) |
| 21 | 5.7 | 51.4 | 42.9 | 9.4 | 7.5 weight % of solid alkali alumino silicate ceramic microsphere particles (3M Ceramic Microspheres White Grade W-410) |

TABLE VII

| Example | EC or EC-P Composition | TABLE I Composition | PL Material | ECL or ECL-P Wet Thickness (μm) |
|---|---|---|---|---|
| Comparative 5 | Silver nanoparticles; Acrysol ™ RM-12W; water [no (b) particles] | Comparative 1 | 28 μm PVDF; Ag-electroded (1-1004346-0 TE Connectivity) | 22 |
| Invention 22 | Silver nanoparticles; Acrysol ™ RM-12W; d50 of 46 μm crosslinked polystyrene particles; water | Invention 1 | 28 μm PVDF; Ag-electroded (1-1004346-0 TE Connectivity) | 22 |
| Invention 23 | Silver nanoparticles; Acrysol ™ RM-12W; d50 of 91 μm crosslinked polystyrene particles; water | Invention 2 | 28 μm PVDF; Ag-electroded (1-1004346-0 TE Connectivity) | 86 |
| Invention 24 | Silver nanoparticles; Acrysol ™ RM-12W; d50 of 201 μm crosslinked polystyrene particles; water | Invention 3 | 28 μm PVDF; Ag-electroded (1-1004346-0 TE Connectivity) | 86 |
| Invention 25 | Silver nanoparticles; Acrysol ™ RM-12W; d50 of 7 μm alumino silicate ceramic microspheres; water | Invention 4 | 28 μm PVDF; Ag-electroded (1-1004346-0 TE Connectivity) | 22 |
| Invention 26 | Silver nanoparticles; Acrysol ™ RM-12W; d50 of 9.4 μm alumino silicate ceramic microspheres; water | Invention 5 | 28 μm PVDF; Ag-electroded (1-1004346-0 TE Connectivity) | 22 |
| Invention 27 | Silver nanoparticles; Acrysol ™ RM-12W; d50 of 10.4 μm alumino silicate ceramic microspheres; water | Invention 6 | 28 μm PVDF; Ag-electroded (1-1004346-0 TE Connectivity) | 22 |
| Invention 28 | Silver nanoparticles; Acrysol ™ RM-12W; 1 weight % d50 of 7.75 μm crosslinked aliphatic polyurethane microspheres; water | Invention 7 | 28 μm PVDF; Ag-electroded (1-1004346-0 TE Connectivity) | 22 |

TABLE VII-continued

| Example | EC or EC-P Composition | TABLE I Composition | PL Material | ECL or ECL-P Wet Thickness (μm) |
|---|---|---|---|---|
| Invention 29 | Silver nanoparticles; Acrysol ™ RM-12W; 2 weight % d50 of 7.75 μm crosslinked aliphatic polyurethane microspheres; water | Invention 8 | 28 μm PVDF; Ag-electroded (1-1004346-0 TE Connectivity) | 22 |
| Invention 30 | Silver nanoparticles; Acrysol ™ RM-12W; 7.5 weight % d50 of 7.75 μm crosslinked aliphatic polyurethane microspheres; water | Invention 9 | 28 μm PVDF; Ag-electroded (1-1004346-0 TE Connectivity) | 22 |
| Invention 31 | Silver nanoparticles; Acrysol ™ RM-12W; 12.5 weight % d50 of 7.75 μm crosslinked aliphatic polyurethane microspheres; water | Invention 10 | 28 μm PVDF; Ag-electroded (1-1004346-0 TE Connectivity) | 22 |
| Invention 32 | Silver nanoparticles; Acrysol ™ RM-12W; d50 of 10.7 μm crosslinked aliphatic polyurethane microspheres; water | Invention 11 | 28 μm PVDF; Ag-electroded (1-1004346-0 TE Connectivity) | 22 |
| Invention 33 | Silver nanoparticles; Acrysol ™ RM-12W; d50 of 21 μm crosslinked aliphatic polyurethane microspheres; water | Invention 12 | 28 μm PVDF; Ag-electroded (1-1004346-0 TE Connectivity) | 22 |
| Invention 34 | Silver nanoparticles; Acrysol ™ RM-12W; d50 of 16 μm of low density filamentary nickel powder; water | Invention 13 | 28 μm PVDF; Ag-electroded (1-1004346-0 TE Connectivity) | 22 |
| Invention 35 | Silver nanoparticles; Acrysol ™ RM-12W; d50 of 34 μm of irregular platelet nickel particles; water | Invention 14 | 28 μm PVDF; Ag-electroded (1-1004346-0 TE Connectivity) | 22 |
| Invention 36 | Silver nanoparticles; Acrysol ™ RM-12W; d50 of 56 μm fine flake nickel platelets; water | Invention 15 | 28 μm PVDF; Ag-electroded (1-1004346-0 TE Connectivity) | 22 |
| Invention 37 | Silver nanoparticles; Acrysol ™ RM-12W; d50 of 13 μm spiky nickel particles; water | Invention 16 | 28 μm PVDF; Ag-electroded (1-1004346-0 TE Connectivity) | 22 |
| Invention 38 | Silver nanoparticles; poly(vinyl pyrrolidone) K30; d50 of 9.4 μm alumino silicate ceramic microspheres; water | Invention 17 | 28 μm PVDF; Ag-electroded (1-1004346-0 TE Connectivity) | 22 |
| Invention 39 | Silver nanoparticles; poly(3,4-ethylenedixoythiophene) polystyrene sulfonate; d50 of 9.4 μm alumino silicate ceramic microspheres; water | Invention 18 | 28 μm PVDF; Ag-electroded (1-1004346-0 TE Connectivity) | 22 |
| Invention 40 | Silver nanoparticles; thermoplastic poly(vinyl butyral) resin; d50 of 9.4 μm alumino silicate ceramic microspheres; water | Invention 19 | 28 μm PVDF; Ag-electroded (1-1004346-0 TE Connectivity) | 22 |
| Invention 41 | Silver nanoparticles; ethoxylated trimethylolpropane triacrylate; 4,4'-azobis(4-cyanovaleric acid); d50 of 9.4 μm alumino silicate ceramic microspheres; water | Invention 20 | 28 μm PVDF; Ag-electroded (1-1004346-0 TE Connectivity) | 22 |
| Invention 42 | Poly(3,4-ethylenedixoythiophene) polystyrene sulfonate; ethylene glycol; d50 of 9.4 μm alumino silicate ceramic microspheres; water | Invention 21 | 28 μm PVDF; Ag-electroded (1-1004346-0 TE Connectivity) | 22 |
| Comparative 6 | NovaCentrix HPS-021LV:HPS-030LV (75:25 weight ratio) | Comparative 2 | 28 μm PVDF; Ag-electroded (1-1004346-0 TE Connectivity) | 22 |
| Comparative 7 | NovaCentrix HPS-021LV:HPS-030LV (50:50 weight ratio) | Comparative 3 | 28 μm PVDF; Ag-electroded (1-1004346-0 TE Connectivity) | 22 |
| Comparative 8 | NovaCentrix HPS-021LV:HPS-030LV (25:75 weight ratio) | Comparative 4 | 28 μm PVDF; Ag-electroded (1-1004346-0 TE Connectivity) | 22 |
| Invention 43 | Silver nanoparticles; Acrysol ™ RM-12W; d50 of 9.4 μm alumino silicate ceramic microspheres; water | Invention 5 | 110 μm PVDF; Ag-electroded (3-1004347-0 TE Connectivity) | 22 |
| Invention 44 | Silver nanoparticles; Acrysol ™ RM-12W; d50 of 9.4 μm alumino silicate ceramic microspheres; water | Invention 5 | Lead Zirconate Titanate (type 5H; Navy Type VI) | 22 |

Measurement of Electrical Properties of Composite Electrodes:

To characterize the range of useful electrical properties for the composite articles described above, the electrical resistivity of composite electrodes prepared using the EC or EC-P compositions described above were measured using the known Van der Pauw technique. This technique was typically carried out for each EC or EC-P composition after it had been coated onto a printed circuit board (PCB) substrate and dried to form an article comprising a thin continuous solid layer of an electrode. The PCB substrate had 4 electrode pads on its planar surface that were evenly spaced around the circumference of a circle. Each EC or EC-P composition was coated onto the PCB planar surface so that the edge of the coated region contacted the electrode pads on the PCB substrate, thus providing a solid continuous planar electrode region whose electrical properties could be measured. The ohmic behavior of each electrical contact between the electrode and the 4 electrode pads was verified before measurement of electrical resistivity by examining the current-voltage (I-V) characteristics of the contacts to ensure that the I-V characteristics were linear across the voltage range used in the subsequent electrical measurements. The thickness of the electrode on the PCB substrate was measured using a Mitotoyo model LGB2-0105L gauge head with a model EF-PH display. The current for the electrical measurements was supplied by a Keithley model 224 programmable current source and voltages were measured using a Keithley model 2100 6 1/2 digital multimeter. The electrical resistivity of each formed electrode was calculated from the measured current and voltages as described by L. J. Van der Pauw in *Phillips Technical Review* volume 20(8), pages 220-224, 1958/1959.

d33 Measurements:

The composite articles of Comparative Example 5-9 and Inventive Examples 22 through 46 were placed in an experimental apparatus to determine the $d_{33}$ piezoelectric charge coefficient. Measurement of $d_{33}$ of each composite article and devices with composite electrodes was performed according to the Berlincourt method as described by Stewart and Cain (M. G. Cain (ed.), *Characterisation of Ferroelectric Bulk Materials and Thin Films*, 37, Springer Series in Measurement Science and Technology 2, DOI: 10.1007/978-1-4020-9311-1_3, © Queen's Printer and Controller of HMSO 2014 Chapter 2 pp 37-64). The electronic charge generated by each composite article when it was subjected to an oscillating stress was collected using a pair of 12.5 mm diameter cylindrical steel electrodes that were in contact with opposing surfaces of the composite article and connected to an electrometer (Keithley 617) that was used to measure the electronic charge generated by the composite article in units of coulombs and the output of the electrometer was connected to a digital oscilloscope (Tektronix 2024B) for data recording. The oscillating stress on the composite article was applied by an insulating anvil that was connected to a piezoelectric ceramic stack. The oscillating displacement of the piezoelectric stack used to generate the oscillating stress on the composite article was produced by driving the piezoelectric stack with a programmable DC power supply (Keithley model 230) using either triangular, square, or sinusoidal waveforms with a frequency between 5 and 50 Hz. In practice, a triangular waveform was used to produce a triangular voltage waveform of 0-100V at 10 Hz that was applied to the piezoelectric stack to produce a 10 Hz oscillation of the piezoelectric stack with a total displacement magnitude of approximately 6 µm. The piezoelectric stack used to apply oscillating force to each composite article was attached to a stage that allowed the composite article to be preloaded with a known force during measurement. The range of preloaded force could be varied from 0.1 N to 10 N. Thus, the oscillating force from the piezoelectric stack was superimposed upon a known force preloaded during measurement. The force applied to the composite article during measurement was measured using a force sensitive resistor (Flexiforce model A201) in contact with one of the stainless-steel electrodes of the fixture. The response of the force sensitive resistor was calibrated in units of Newtons of force before use by means of a top loading balance. During each measurement, the preloaded force, the oscillating force peak-to-peak magnitude, and the peak-to-peak magnitude of the oscillating coulombic charge generated by the composite article during measurement was simultaneously recorded as a function of time. The peak-to-peak magnitude of the oscillating charge from the composite article was determined. The peak-to-peak magnitude of the oscillating force applied to the composite article was determined. The ratio of the magnitude of the oscillating charge to the magnitude of the oscillating force was calculated and taken as the experimental piezoelectric charge coefficient of the composite article. In all measurements reported herein, the oscillating force and preloaded force on the piezoelectric layer under test was applied parallel to the direction in which the piezoelectric layer under test was poled. This is the measurement configuration that those skilled in the art recognize as the measurement configuration for the piezoelectric charge coefficient designated as $d_{33}$ or $d_T$. The piezoelectric charge coefficient $d_{33}$ has units of picocoulombs per Newton (pC/N) and is a measurement of how much electronic charge a piezoelectric layer or device containing a piezoelectric layer will generate under stress. For many applications, like energy harvesting and sensor design, larger values of $d_{33}$ are desirable, regardless of the type of piezoelectric material employed. For the present invention, when relative composite article response is given, the piezoelectric response of the piezoelectric layer under test is taken as the ratio of the piezoelectric charge coefficient of the composite article under test to the piezoelectric coefficient determined for a chosen reference article under similar or identical condition.

TABLE VIII below shows the $d_{33}$ values measured at a given force oscillation (the force oscillation being measured as a delta force value) in comparison to a reference article. All reported measurements were carried out at a preloaded force of less than 2 Newtons (N). Those skilled in the art of piezoelectric material characterization will recognize that it is generally accepted that a preloaded force less than 2 Newtons is recommended for reliable measurement of piezoelectric coefficients with Berlincourt type measurement instruments.

The reference article used for evaluating the composite articles of Comparative Examples 5-9 and Invention Examples 22 to 43, 45-46 was a commercially available, silver-electroded, electrically poled, poly(vinylidene fluoride) membrane (part number 1-1004346-0 from TE Connectivity). The reference article used for evaluating the composite article of Invention Example 44 was a piece of nickel-electroded lead zirconate titanate (type 5H; Navy Type VI) piezoelectric ceramic. The following TABLE VIII provides the values for the magnitude of the oscillating force (Delta F in Newtons) during measurement, $d_{33}$ of each composite article, $d_{33}$ of the reference article ("$d_{33}$-ref"), and the ratio of the composite article $d_{33}$ value to the $d_{33}$-ref value. When this ratio was greater than 1.15, the piezoelectric response of the composite article was greater than the response of the reference article under the measurement conditions. The $d_{33}$ values reported in TABLE VIII demonstrate large increases in the $d_{33}$ piezoelectric coefficient when an electrically-conducting layer (ECL-P) prepared according to the present invention was arranged on the noted PL and preloaded force of 2N or less was present.

TABLE VIII

| Example | Dry PL Material | EC or EC-P Composition | Delta F (N) | $d_{33}$ | $d_{33}$-ref | Ratio |
|---|---|---|---|---|---|---|
| Comparative 5 | 28 µm PVDF; Ag-electroded (1-1004346-0 TE Connectivity) | Silver nanoparticles; Acrysol ™ RM-12W; water | 0.55 | 36.17 | 31.83 | 1.13 |
| Invention 22 | 28 µm PVDF; Ag-electroded (1-1004346-0 TE Connectivity) | Silver nanoparticles; Acrysol ™ RM-12W; d50 of 46 µm crosslinked polystyrene particles; water | 0.75 | 100.11 | 20.00 | 5.01 |
| Invention 23 | 28 µm PVDF; Ag-electroded (1-1004346-0 TE Connectivity) | Silver nanoparticles; Acrysol ™ RM-12W; d50 of 91 µm crosslinked polystyrene particles; water | 0.62 | 84.35 | 46.72 | 1.81 |

TABLE VIII-continued

| Example | Dry PL Material | EC or EC-P Composition | Delta F (N) | $d_{33}$ | $d_{33}$-ref | Ratio |
|---|---|---|---|---|---|---|
| Invention 24 | 28 μm PVDF; Ag-electroded (1-1004346-0 TE Connectivity) | Silver nanoparticles; Acrysol ™ RM-12W; d50 of 201 μm crosslinked polystyrene particles; water | 0.84 | 49.96 | 41.87 | 1.19 |
| Invention 25 | 28 μm PVDF; Ag-electroded (1-1004346-0 TE Connectivity) | Silver nanoparticles; Acrysol ™ RM-12W; d50 of 7 μm alumino silicate ceramic microspheres; water | 0.76 | 83.25 | 44.26 | 1.88 |
| Invention 26 | 28 μm PVDF; Ag-electroded (1-1004346-0 TE Connectivity) | Silver nanoparticles; Acrysol ™ RM-12W; d50 of 9.4 μm alumino silicate ceramic microspheres; water | 0.78 | 99.60 | 23.62 | 4.22 |
| Invention 27 | 28 μm PVDF; Ag-electroded (1-1004346-0 TE Connectivity) | Silver nanoparticles; Acrysol ™ RM-12W; d50 of 10.7 μm alumino silicate ceramic microspheres; water | 0.74 | 94.42 | 29.30 | 3.22 |
| Invention 28 | 28 μm PVDF; Ag-electroded (1-1004346-0 TE Connectivity) | Silver nanoparticles; Acrysol ™ RM-12W; 1 weight % of d50 7.75 μm crosslinked aliphatic polyurethane microspheres; water | 0.78 | 56.70 | 50.52 | 1.12 |
| Invention 29 | 28 μm PVDF; Ag-electroded (1-1004346-0 TE Connectivity) | Silver nanoparticles; Acrysol ™ RM-12W; 2 weight % of d50 7.75 μm crosslinked aliphatic polyurethane microspheres; water | 0.74 | 50.88 | 54.67 | 0.93 |
| Invention 30 | 28 μm PVDF; Ag-electroded (1-1004346-0 TE Connectivity) | Silver nanoparticles; Acrysol ™ RM-12W; 7.5 weight % of d50 7.75 μm crosslinked aliphatic poly-urethane microspheres; water | 0.86 | 27.30 | 15.73 | 1.74 |
| Invention 31 | 28 μm PVDF; Ag-electroded (1-1004346-0 TE Connectivity) | Silver nanoparticles; Acrysol ™ RM-12W; 12.5 weight % of d50 7.75 μm crosslinked aliphatic poly-urethane microspheres; water | 0.74 | 56.34 | 55.25 | 1.02 |
| Invention 32 | 28 μm PVDF; Ag-electroded (1-1004346-0 TE Connectivity) | Silver nanoparticles; Acrysol ™ RM-12W; d50 of 10.7 μm crosslinked aliphatic polyurethane microspheres; water | 0.53 | 102.47 | 28.42 | 3.60 |
| Invention 33 | 28 μm PVDF; Ag-electroded (1-1004346-0 TE Connectivity) | Silver nanoparticles; Acrysol ™ RM-12W; d50 of 21 μm crosslinked aliphatic polyurethane microspheres; water | 0.97 | 25.14 | 21.43 | 1.17 |
| Invention 34 | 28 μm PVDF; Ag-electroded (1-1004346-0 TE Connectivity) | Silver nanoparticles; Acrysol ™ RM-12W; d50 of 16.5 μm low density filamentary nickel powder; water | 0.63 | 105.01 | 36.06 | 2.91 |
| Invention 35 | 28 μm PVDF; Ag-electroded (1-1004346-0 TE Connectivity) | Silver nanoparticles; Acrysol ™ RM-12W; d50 of 34 μm irregular platelet nickel particles; water | 0.44 | 43.54 | 34.47 | 1.26 |
| Invention 36 | 28 μm PVDF; Ag-electroded (1-1004346-0 TE Connectivity) | Silver nanoparticles; Acrysol ™ RM-12W; d50 of 56 μm fine flake nickel platelets; water | 0.65 | 15.95 | 43.54 | 0.36 |
| Invention 37 | 28 μm PVDF; Ag-electroded (1-1004346-0 TE Connectivity) | Silver nanoparticles; Acrysol ™ RM-12W; d50 of 13 μm spiky nickel particles; water | 0.63 | 40.71 | 35.63 | 1.14 |
| Invention 38 | 28 μm PVDF; Ag-electroded (1-1004346-0 TE Connectivity) | Silver nanoparticles; poly(vinyl pyrrolidone) K30; d50 of 9.4 μm alumino silicate ceramic microspheres; water | 0.73 | 22.39 | 17.49 | 1.28 |
| Invention 39 | 28 μm PVDF; Ag-electroded (1-1004346-0 TE Connectivity) | Silver nanoparticles; poly(3,4-ethylenedixoythiophene) polystyrene sulfonate; d50 of 9.4 μm alumino silicate ceramic microspheres; water | 0.80 | 92.36 | 53.71 | 1.72 |
| Invention 40 | 28 μm PVDF; Ag-electroded (1-1004346-0 TE Connectivity) | Silver nanoparticles; thermoplastic poly(vinyl butyral) resin; d50 of 9.4 μm alumino silicate ceramic microspheres; water | 0.82 | 92.20 | 51.93 | 1.78 |
| Invention 41 | 28 μm PVDF; Ag-electroded (1-1004346-0 TE Connectivity) | Silver nanoparticles; ethoxylated trimethylol-propane triacrylate; 4,4'-azobis(4-cyanovaleric acid); d50 of 9.4 μm alumino silicate ceramic microspheres; water | 0.50 | 68.98 | 21.66 | 3.19 |
| Invention 42 | 28 μm PVDF; Ag-electroded (1-1004346-0 TE Connectivity) | Poly(3,4-ethylenedixoy-thiophene) polystyrene sulfonate; ethylene glycol; d50 of 9.4 μm alumino silicate ceramic microspheres; water | 0.78 | 47.27 | 17.47 | 2.71 |
| Comparative 6 | 28 μm PVDF; Ag-electroded (1-1004346-0 TE Connectivity) | NovaCentrix HPS-021LV:HPS-030LV (75:25 weight ratio) | 0.55 | 46.56 | 32.01 | 1.45 |

TABLE VIII-continued

| Example | Dry PL Material | EC or EC-P Composition | Delta F (N) | $d_{33}$ | $d_{33}$-ref | Ratio |
|---|---|---|---|---|---|---|
| Comparative 7 | 28 μm PVDF; Ag-electroded (1-1004346-0 TE Connectivity) | NovaCentrix HPS-021LV:HPS-030LV (50:50 weight ratio) | 0.80 | 28.13 | 25.62 | 1.10 |
| Comparative 8 | 28 μm PVDF; Ag-electroded (1-1004346-0 TE Connectivity) | NovaCentrix HPS-021LV:HPS-030LV (25:75 weight ratio) | 0.63 | 32.81 | 28.39 | 1.16 |
| Invention 43 | 110 um PVDF; Ag-electroded (3-1004347-0 TE Connectivity) | Silver nanoparticles; Acrysol ™ RM-12W; d50 of 9.4 μm alumino silicate ceramic microspheres; water | 0.83 | 43.53 | 35.79 | 1.22 |
| Invention 44 | Lead Zirconate Titanate (type 5H; Navy Type VI) | Silver nanoparticles; Acrysol ™ RM-12W; d50 of 9.4 μm alumino silicate ceramic microspheres; water | 0.67 | 775.17 | 626.10 | 1.24 |
| Comparative 9 | 28 μm PVDF; no ECL (1-1003352-0 TE Connectivity) | Bare PVDF with no ECL (for measurement purposes the steel anvils were used as electrodes) | 0.65 | 18.68 | 20.52 | 0.91 |

Figure 26:
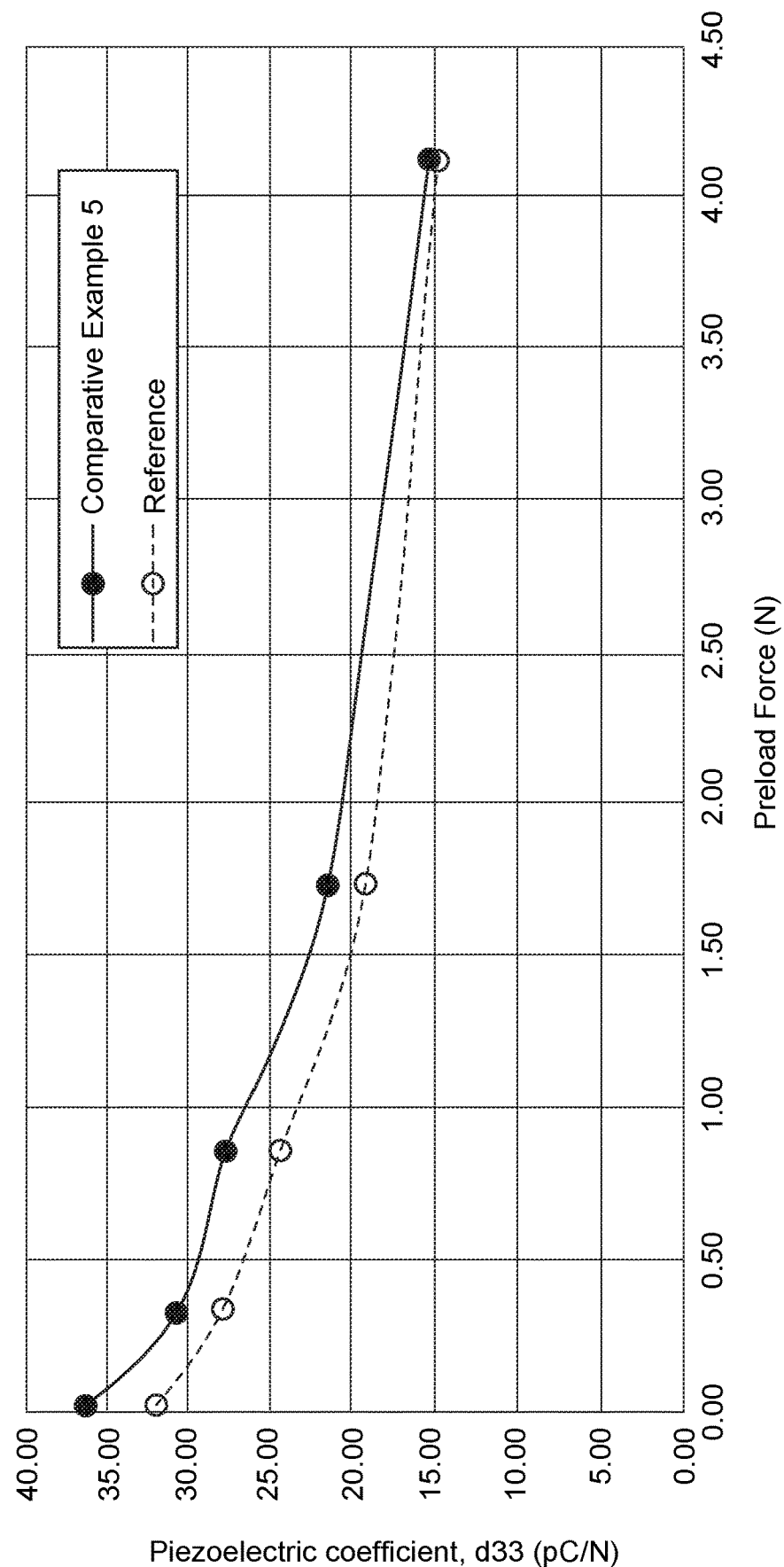
FIG. 26 is a graphical representation of $d_{33}$ piezoelectric charge coefficients as a function of preloaded force (Newtons) for Comparative Example 5.
Figure 27:
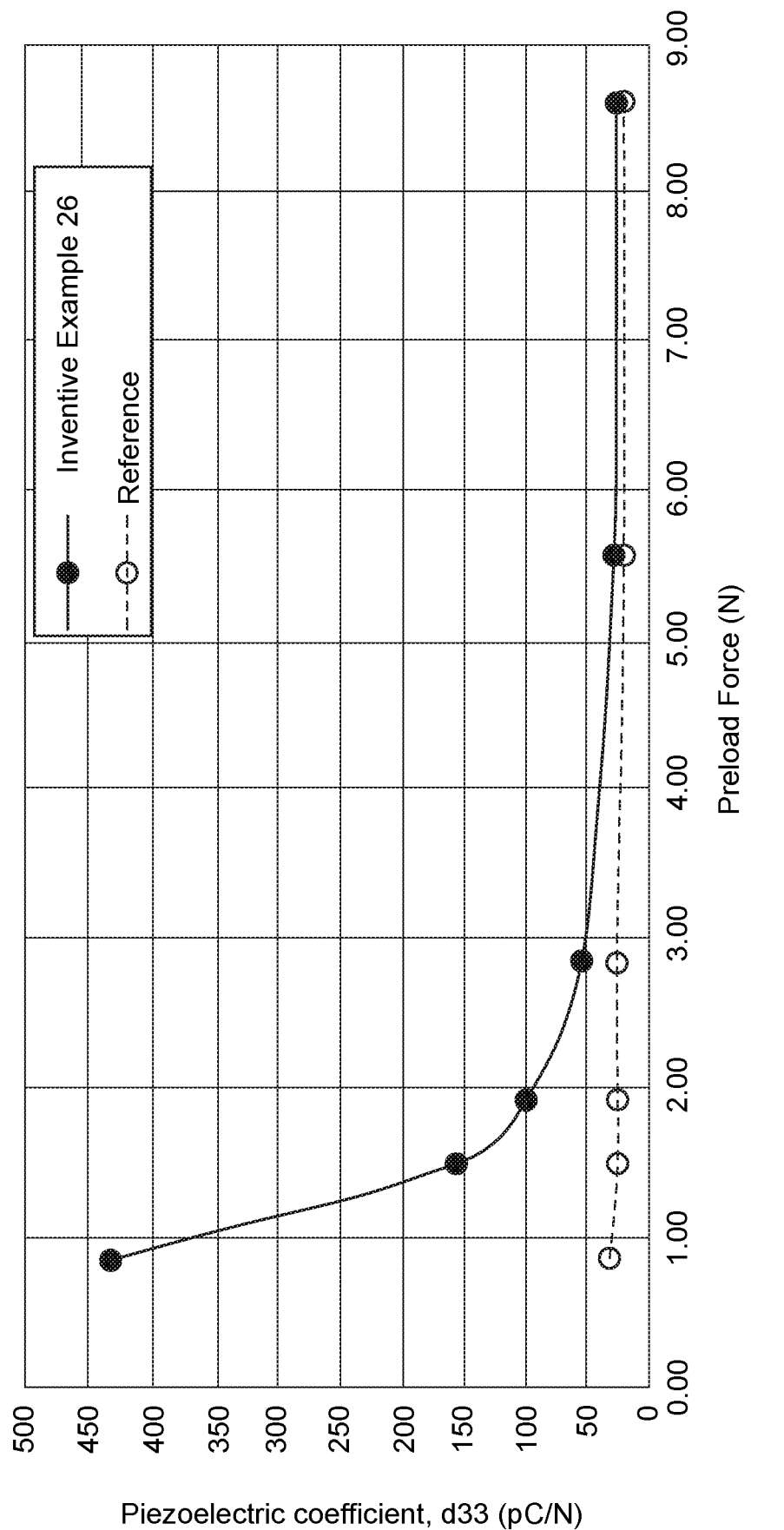
FIG. 27 is a graphical representation of $d_{33}$ piezoelectric charge coefficients as a function of preloaded force (Newtons) for Invention Example 26.

FIGS. 26 and 27 are graphical representations of the $d_{33}$ piezoelectric charge coefficients determined for use of a particular piezoelectric layer with and without different types of EC or EC-P compositions as a function of applied preload force. The trend lines illustrating the trends in the different data sets that are plotted in the graphical representations shown in FIGS. 26 and 27 are intended only as a guide for the reader. In both FIGS. 26 and 27, the reference article comprised a silver-electroded, electrically poled, poly(vinylidene fluoride) membrane (obtained from TE Connectivity, 1-1004346-0). The reference article data are represented by data points around the lower graphical trend lines in each of FIGS. 26 and 27.

FIG. 26 compares the $d_{33}$ response as a function of preloaded force of the reference article to the response of the composite article prepared for Comparative Example 5 described above, comprising a PL that is identical with that of the reference article and having a silver nanoparticle dry ECL (electrode) prepared using the Comparative Example 1 EC composition described above [that is, no (b) particles are present] that is overlying and in contact both physically and electrically with one surface of the PL. FIG. 26 demonstrates that a dry ECL (electrode) with a uniform Young's modulus that is applied to the dry PL has a $d_{33}$ response that is identical with that of the reference article. In other words, the composite article of Comparative Example 5 shows the same piezoelectric response as the reference article within the limit of the measurement method. The ratio of the $d_{33}$ values of the composite article of Comparative Example 5 to that of the reference article was always less than 1.15 in the preloaded region 0 and 5 N. That is, the d33 value of the composite article of Comparative Example 5 is always within 15% of the $d_{33}$ value of the reference article in the force preloaded region between 0 N and 5 N.

FIG. 27 compares the $d_{33}$ response as a function of preloaded force of the reference article to the response of the composite article prepared for Invention Example 26 that comprised a dry PL identical to that of the reference article, but also comprised a dry ECL-P (electrode) prepared using the EC-P composition of Invention Example 5 overlying and in contact both physically and electrically with the surface of the dry PL. The Invention Example 5 EC-P composition comprised 7.5% by weight of the d50 of 9.4 μm alumino silicate ceramic microspheres as the (b) particles along with silver nanoparticles as the (a) electrically-conductive material. The additional composite article dry ECL-P of Invention Example 26 exhibits a non-uniform and spatially varying Young's modulus when it is measure at different physical locations on the dry ECL-P. The non-uniform and spatially varying Young's modulus is attributed to the presence of the alumino-silicate ceramic microsphere (b) particles whose Young's modulus is different from that of the surrounding (a) electrically-conductive material. The alumino-silicate ceramic microsphere (b) particles used in Invention Example 26 are electrical insulators.

The data shown in FIG. 27 demonstrate that a composite article according to the present invention having a dry ECL-P containing (b) particles exhibits significantly larger $d_{33}$ response than the reference article in which the dry ECL contains no (b) particles, within the limit of the measurement method. The ratio of the d33 values for Invention Example 26 can be as large as 14 in the region of preloaded force between 0 and 3 N. FIG. 27 also illustrates that the use of a composite article according to the present invention provides enhanced response of a dry PL particularly at low applied forces in the region of applied force that is useful for haptic applications such as the design of tactile force sensitive electrical interfaces that are responsive to human touch. FIG. 27 further demonstrates that the use of composite articles according to the present invention exhibit enhanced response of a dry PL at low applied forces so that it approaches that of piezoelectric ceramic materials as shown by the comparison of the data from FIG. 27 with the data for the composite article for Invention Example 44 shown above in TABLE VIII and comparison of the data from FIG. 27 with the data for the nickel electroded lead zirconate titanate (type 5H; Navy Type VI) reference article with no dry ECL-P shown above in TABLE VIII. Dry PL's in composite articles like those of Invention Example 26 that exhibit an enhanced $d_{33}$ response as shown in FIG. 27 are also useful in a variety of elements such as energy harvesters of vibrational energy and as elements within physical force sensors comprised of piezoelectric transducers where a generation of a voltage signal in response to vibration or force is desired.

Effect from the Presence of (b) Particles:

The results from the composite articles prepared in Comparative Example 5 and Invention Example 22 utilizing the ECL and ECL-P compositions of Comparative Example 1 and Invention Example 1, respectively, demonstrate that the presence of the (b) particles provides an enhanced effect on the piezoelectric charge coefficient $d_{33}$. The resistivity of the dry ECL of Comparative Example 5 was 0.015 ohm-cm while that of the composite article of Invention Example 22 was 0.7 ohm-cm. Note that the higher resistivity material provided a high $d_{33}$ response (see TABLE VIII), demonstrating that the measured $d_{33}$ is not directly predictable from electrical properties of the dry ECL in the composite article.

Effect of (b) Particle Loading:

The results from the composite articles prepared for Invention Examples 28-31 using the EC-P compositions of Invention Examples 7-10, respectively, where the aliphatic crosslinked polyurethane particles were added as (b) particles at 1 weight %, 2 weight %, 7.5 weight %, and 12.5 weight %, respectively, demonstrate the effect of (b) particle loading on the piezoelectric charge coefficient $d_{33}$. The $d_{33}$ effect was greater at (b) particle loadings of 1 weight % or more. The resistivity of the EC-P composition provided for Invention Example 9 was 0.07 ohm-cm.

Effect of High Modulus (b) Particle Size:

The results from the composite articles prepared for Invention Examples 22-24 using the EC-P compositions of Invention Example 1-3, respectively, containing crosslinked polystyrene micrometer-sized (b) particles of d50 of 46, 91, or 201 µm in size, respectively, demonstrate the effect of (b) particle size on $d_{33}$ (see TABLE VIII). The data show that there is an increase in $d_{33}$ due to the presence of particles over the entire tested range of (b) particle sizes.

The results from the composite articles prepared for Invention Examples 34-37 using the EC-P compositions of Invention Examples 13-16, respectively, containing high modulus (b) particles that contained electrically-conductive nickel, also demonstrate that the use of electrically-conductive (b) particles can provide an enhanced $d_{33}$ piezoelectric charge coefficient in the composite article. It should be noted that comparison of Invention Examples 34-37 with Invention Examples 22-24 demonstrates that both magnetic and non-magnetic particles can be used in the EC-P to enhance $d_{33}$ of the dry PL.

Effect of Low Modulus (b) Particle Size:

The results from the composite articles prepared for Example 30, 32, and 33 using the EC-P compositions of Invention 9, 11, and 12, respectively, containing low modulus (b) particles having a d50 of 7.75 µm, 10.7 µm, and 21 µm, respectively, demonstrate the $d_{33}$ increase that was observed across the noted range of such (b) particle sizes of crosslinked aliphatic polyurethane particles.

Effect of Differing (b) Particle Sizes of the Same Young's Modulus:

The results from the composite articles prepared for Comparative Examples 6-8 using the ECL compositions of Comparative Examples 2-4, respectively, where the (b) particles are of the same Young's modulus as the (a) electrically-conductive material, silver, but having 2 distinct or bimodal distributions, in the nanometer and micrometer range, show the lack of enhanced $d_{33}$ over the (b) particle size range. These Comparative Examples demonstrate the necessity for the (b) particles to have a Young's modulus different from that of the (a) electrically-conductive material.

Effect of PL Composition:

The results from composite article prepared for Invention Example 26 using the EC-P composition of Invention Example 5 and a PL comprising poly(vinylidene fluoride) and from the composite article prepared for Invention Example 44 using the EC-P composition of Invention Example 5 and a lead zirconium titanate ceramic sheet as the PL demonstrate that an enhanced $d_{33}$ piezoelectric charge coefficient can be achieved according to the present invention for a variety of PL materials. Thus, the present invention and its advantages can be achieved using a variety of dry PL materials regardless of the Young's modulus of the PL layer.

Effect of (c) Binder Material:

The results from composite articles prepared for Invention Examples 26 and 38-41 using the EC-P compositions of Invention Examples 5 and 17-20, respectively, demonstrate the usefulness of a variety of rheology modifiers as (c) binder materials for making inventive EC-P compositions for preparing inventive composite articles. The resistivity of the EC-P composition used for making the composite article in Example 41 of 116 ohm-cm is a useful value.

Effect of Various (a) Electrically-Conductive Materials:

The results from composite articles prepared according to Invention Examples 26 and 42 using the EC-P compositions of Invention Examples 5 and Example 21, respectively, demonstrate the ability of using various (a) electrically-conductive materials into which the (b) particles are dispersed. To characterize the range of electrical properties that are useful for the composite articles according to the present invention, the electrical resistivity of composite articles prepared from the EC-P compositions of Invention Examples 5 and 21 were measured. The resistivity of the composite article prepared for Invention Example 42 was 80 ohm-cm and resistivity of the composite article prepared for Invention Example 26 was 0.015 ohm-cm. It is desirable for the electrical resistivity of a composite article according to the present invention to be less than 10,000 ohm-cm, less than 500 ohm-cm, or more particularly, less than 150 ohm-cm.

Invention Examples 45-46

These examples demonstrate that the (a) electrically conducting material employed in the composite articles according to the present invention is not limited to the silver nanoparticle-containing formulations described above for Invention Examples 1-20. Silver inks purchased from NovaCentrix were used as the (a) electrically-conductive component in a dry ECL-P while additional (b) particles, Polybead-50 (50 µm), were added to form the EC-P composition. Invention Example 45 included the use of HPS-021LV silver ink (NovaCentrix d50=0.29 µm silver particles with a bimodal distribution including micrometer-sized particles) as the (a) electrically-conductive material, and Invention Example 46 included the use of HPS-030LV silver ink (NovaCentrix d50=0.16 µm silver particles) as the (a) electrically-conductive material. The (b) particles were added to a weighed amount of the (a) electrically-conductive material in a container and mixed with a FlackTek Speedmixer™ DAC 150 speedmixer to provide each EC-P composition.

Inventive Examples 45 and 46 were prepared by similar methods disclosed above. The dry PL, a Ag-electroded PVDF membrane (1-1004346-0 TE Connectivity), was secured onto a coating block while each EC-P composition was applied using a pipette and the droplet(s) were spread evenly on the dry PL planar surface using a Meyer rod to provide a wet coverage of 22 µm.

TABLES IX, X, XI, and XII below provide additional information and results for these Invention Examples.

TABLE IX

| Invention Example | (a) Silver Particles Solid weight % | (c) Binder Material Solid weight % | (b) Particles Solid Weight % | (d) Solvent Medium Weight % | (b) Particles d50 (μm) | (b) to (a) Weight Ratio | Type of (b) Particles |
|---|---|---|---|---|---|---|---|
| 45 | 71.25 | 5.05 | 5 | 18.7 | 46 | 0.07 | 5 weight % of spherical crosslinked poly(styrene-co-divinyl benzene-co-ethylvinyl benzene (Polybead-50) |
| 46 | 71.25 | 5.05 | 5 | 18.7 | 46 | 0.07 | 5 weight % of spherical crosslinked poly(styrene-co-divinyl benzene-co-ethylvinyl benzene (Polybead-50) |

TABLE X

| Invention Example | Solid weight % of (a) Silver particles | Solid weight % of (c) Polymer | Solid Weight % of (b) Particles | (b) Particles d50 (μm) | Type of (b) Particles |
|---|---|---|---|---|---|
| 45 | 87.6 | 6.2 | 6.2 | 46 | 5 weight % of spherical crosslinked poly(styrene-co-divinyl benzene-co-ethylvinyl benzene (Polybead-50) |
| 46 | 87.6 | 6.2 | 6.2 | 46 | 5 weight % of spherical crosslinked poly(styrene-co-divinyl benzene-co-ethylvinyl benzene (Polybead-50) |

TABLE XI

| Example | EC or EC-P Composition | TABLE IX Composition | Dry PL Material | ECL or ECL-P Wet Thickness (μm) |
|---|---|---|---|---|
| 47 | 5 weight % of spherical crosslinked poly(styrene-co-divinyl benzene-co-ethylvinyl benzene (Polybead ® 50) | 45 | 28 μm PVDF; Ag-electroded (1-1004346-0 TE Connectivity) | 22 |
| 48 | 5 weight % of spherical crosslinked poly(styrene-co-divinyl benzene-co-ethylvinyl benzene (Polybead ® 50) | 46 | 28 μm PVDF; Ag-electroded (1-1004346-0 TE Connectivity) | 22 |

TABLE XII

| Example | PL Material | EC or EC-P Composition | Delta F (N) | d33 | d33-ref | Ratio |
|---|---|---|---|---|---|---|
| 47 | 28 μm PVDF; Ag-electroded (1-1004346-0 TE Connectivity) | 5 weight % of spherical crosslinked poly(styrene-co-divinyl benzene-co-ethylvinyl benzene (Polybead ® 50) | 0.51 | 58.6 | 22.6 | 2.59 |
| 48 | 28 μm PVDF; Ag-electroded (1-1004346-0 TE Connectivity) | 5 weight % of spherical crosslinked poly(styrene-co-divinyl benzene-co-ethylvinyl benzene (Polybead ® 50) | 0.49 | 49.9 | 26.3 | 1.90 |

The $d_{33}$ piezoelectric charge coefficient ratio shown in TABLE XI above demonstrates that composite articles can be prepared according to the present invention using an EC-P composition that was formulated using commercially available materials. Thus, the inventive EC-P compositions have wide compositional breadth.

Invention Example 47

The EC composition of Comparative Example 1 above was used but with the addition of 5 weight % solids of alkali alumino silicate ceramic microsphere particles (3M Ceramic Microspheres White Grade W-410, effective d50 particle size of 9.4 μm %) and 0.25 weight % of Dynol™ 810 fluorosurfactant in a FlackTek Speedmixer™ DAC 150 speedmixer for 1-3 minutes at a speed >1500 rpm to create an inventive EC-P composition.

A composite article according to the present invention was prepared in the following manner. A non-electroded (1-1003352-0 TE Connectivity) dry piezoelectric layer material (dry PL) in the form of a sheet or web was secured on a coating block and the EC-P composition was applied to the open PL surface by a pipette drop. The EC-P composition described above was spread evenly onto the dry PL by rod-coating techniques using Meyer rods to provide a wet lay-down of at least 22 μm and up to 86 μm.

Invention Example 48

An EC-P composition was prepared and a composite article was prepared using a non-electroded (1-1003352-0 TE Connectivity) piezoelectric material (dry PL) in the form of a sheet or web as described in Invention Example 47 to form a first dry ECL-P on one side of the dry PL, followed by drying. A second dry ECL-P was formed by applying the same EC-P composition onto the opposite second supporting surface of the PL by a pipette drop, followed by drying. The second EC-P composition was spread evenly by rod-coating techniques using Meyer rods to provide a wet lay-down of at least 22 μm and up to 86 followed by drying.

Further details about the EC-P compositions used in Invention Examples 47 and 48 are provided in the following TABLES XIII and XIV.

TABLE XIII

| Example | EC-P Composition | Dry PL | ECL Wet Thickness (μm) |
|---|---|---|---|
| Invention 47 | Silver nanoparticles; Acrysol ™ RM-12W; d50 of 9.4 μm alumino silicate ceramic microspheres; Dynol ™ 810; water | 28 μm PVDF (no commercial electrodes); (1-1003352-0 TE Connectivity) | 22 |
| Invention 48 | Silver nanoparticles; Acrysol ™ RM-12W; d50 of 9.4 μm alumino silicate ceramic microspheres; Dynol ™ 810; water | 28 μm PVDF (no commercial electrodes); (1-1003352-0 TE Connectivity) | 22 |

TABLE XIV

| Invention Example | Weight % (a) Silver Nanoparticles | Weight % (c) Binder Material | Weight % (b) Particle | (b) Particles D50 (μm) | (b) Particles Type |
|---|---|---|---|---|---|
| 47 | 94.4 | 0.125 | 5 | 9.4 | solid alkali alumino silicate ceramic microsphere particles (3M Ceramic Microspheres White Grade W-410) |
| 48 | 94.4 | 0.125 | 5 | 9.4 | solid alkali alumino silicate ceramic microsphere particles (3M Ceramic Microspheres White Grade W-410) |

Figure 28:
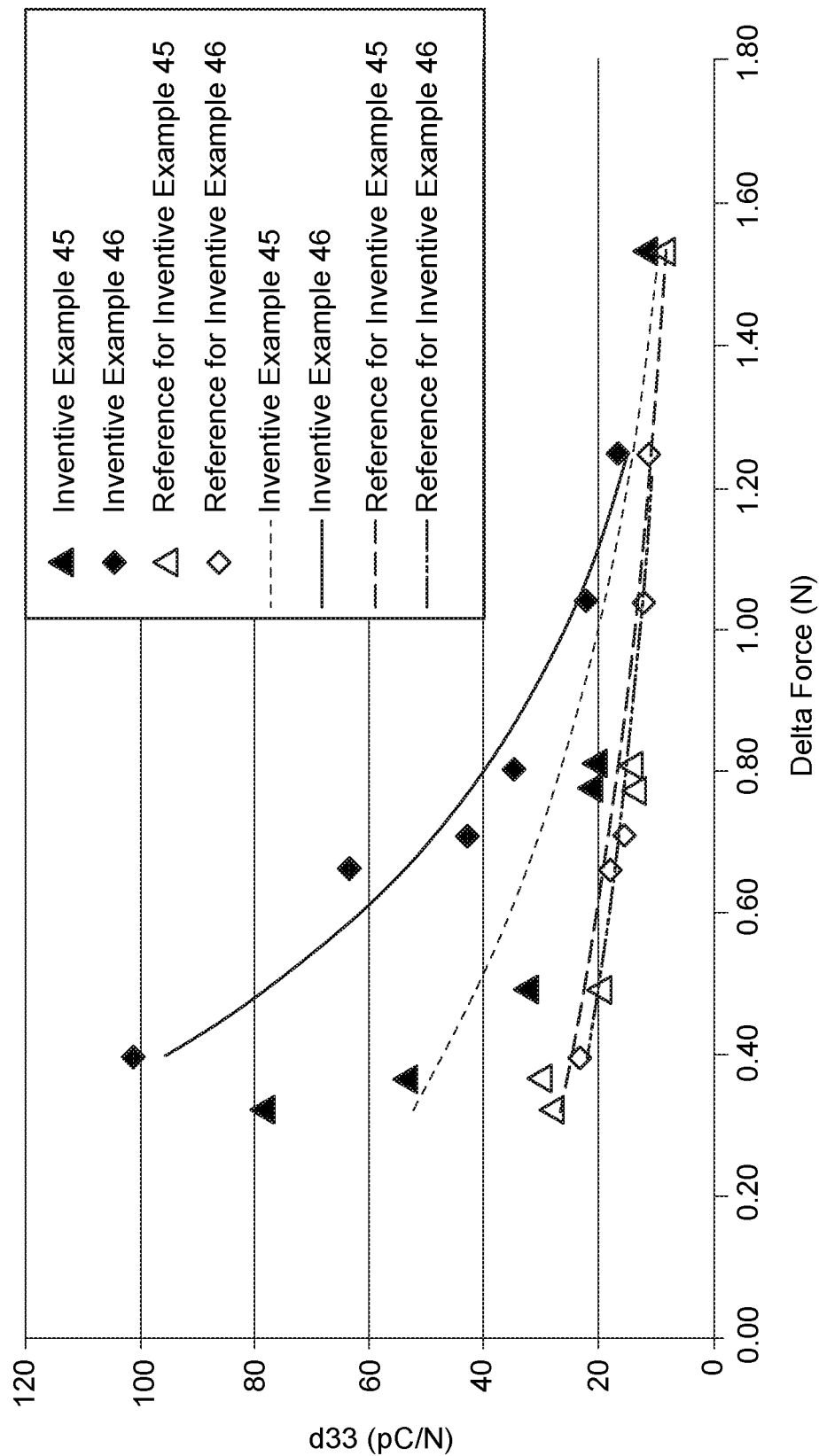
FIGS. 28 and 29 are graphical representations of $d_{33}$ piezoelectric charge coefficients as a function of delta force (Newtons) and preloaded force (Newtons), respectively, for Invention Examples 45 and 46 below.

The evaluation of the piezoelectric charge coefficient $d_{33}$ for the composite article of Invention Example 47, the electrode on one side of the dry PL was the prepared dry ECL-P, and the electrode on the opposite side of the dry PL was a 12.5 mm diameter cylindrical steel electrode. The following TABLE XV provides the evaluation data for both Invention Examples 47 and 48, similarly to that shown in TABLE XII above.

article of Invention Example 48 that comprise a dry ECL-P on both sides of the dry PL. The trend lines illustrating the trends in the data sets that are plotted in the graphical representation of FIG. 28 are intended only as a guide for the observer.

Figure 29:
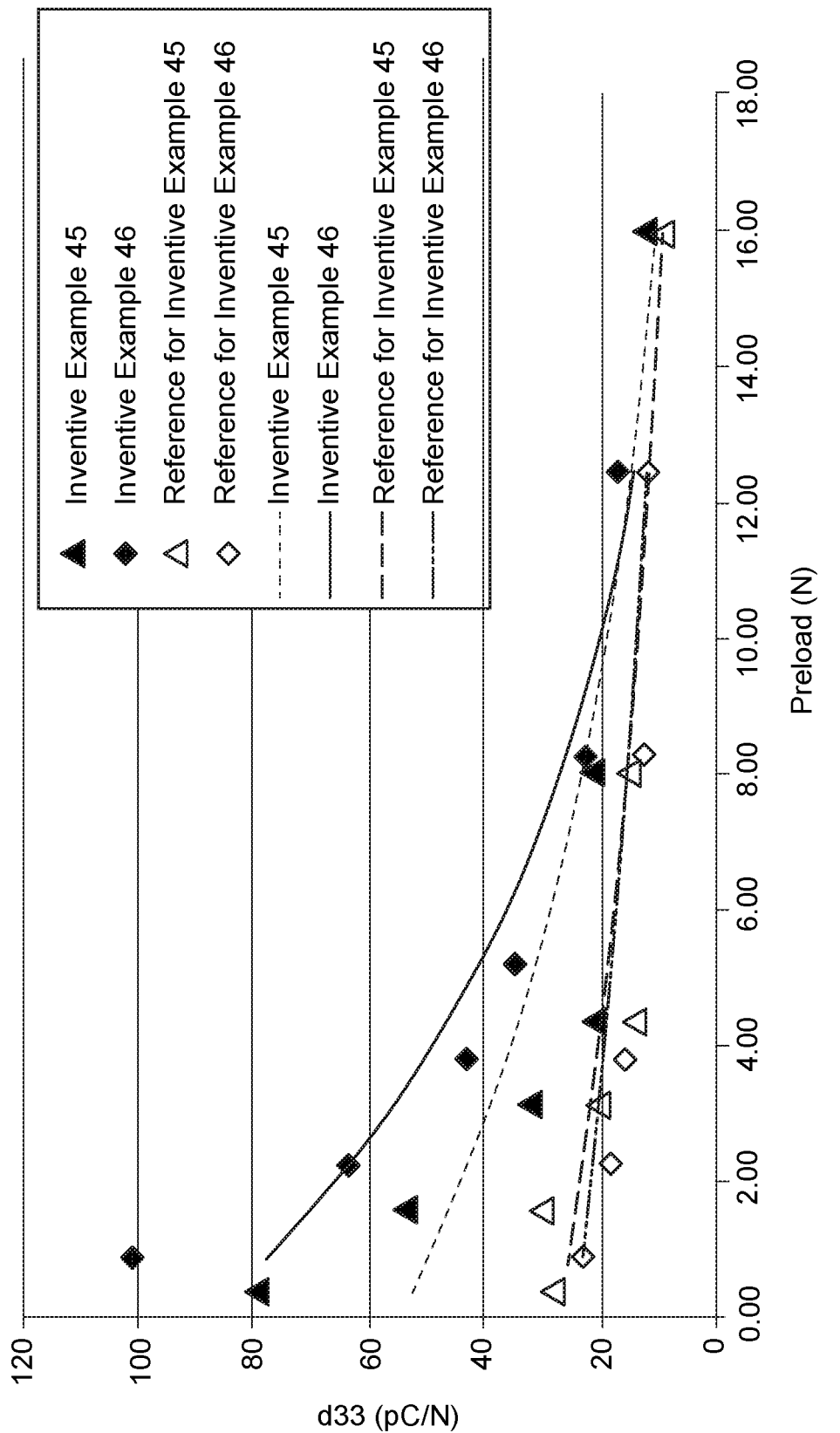

FIG. 29 depicts the significant enhancement of $d_{33}$ as the preloaded force was reduced to less than 5 N, for both the composite article of Invention Example 47 having a dry ECL-P on one side of the dry PL only, and for the composite article of Invention Example 48 that comprise a dry ECL-P on both sides of the dry PL. The trend lines illustrating the trends in the data sets that are plotted in the graphical representation of FIG. 29 are intended only as a guide for the observer.

The following examples demonstrate the preparation and evaluation of composite articles according to the present invention which contain at least one dry DL-P in place of a dry ECL-P.

TABLE XV

| Invention Example | Dry PL | ECL-P Description | @ Delta F (N) | $d_{33}$ | $d_{33}$-ref | Ratio |
|---|---|---|---|---|---|---|
| 47 | 28 μm PVDF (no commercial electrodes); (TE 1-1003352-0); 1 fabricated electrode with (b) particles | Silver nanoparticles; Acrysol ™ RM-12W; water; Dynol ™ 810; solid alkali alumino silicate ceramic microsphere particles (3M Ceramic Microspheres White Grade W-410) with an effective d50 of 9.4 μm | 0.78 | 21.66 | 14.4 | 1.5 |
| 48 | 28 μm PVDF (no commercial electrodes); (TE 1-1003352-0); 2 fabricated electrodes with (b) particles | Silver nanoparticles; Acrysol ™ RM-12W; water; Dynol ™ 810; solid alkali alumino silicate ceramic microsphere particles (3M Ceramic Microspheres White Grade W-410) with an effective d50 of 9.4 μm | 0.66 | 63.6 | 18.2 | 3.5 |

FIG. 28 illustrates the significant enhancement of $d_{33}$ as the oscillating force was reduced to less than 1 N for both the composite article of Invention Example 47 having a dry ECL-P on one side of the dry PL only, and for the composite

Invention Examples 49-50

As described above, composite articles according to the present invention can also be designed with a dielectric material that includes (b) particles with a d50 larger than 1 µm wherein the (b) particles are organic or inorganic. The dielectric material can be arranged as a dry DL-P that is spatially located at any suitable location in a composite article also comprising one or more dry ECL's and a dry PL according to the present invention. Alternatively, the dielectric material containing (b) particles can be discontinuous but in the same plane. That is, there can be gaps in the dielectric material in the plane, for example, containing non-electrically-connected co-planar patterned electrodes, with or without the same or different (b) particles. In addition, the dielectric material containing (b) particles can also function as an outermost dry protective layer that can be discontinuous or continuous.

Figure 43:
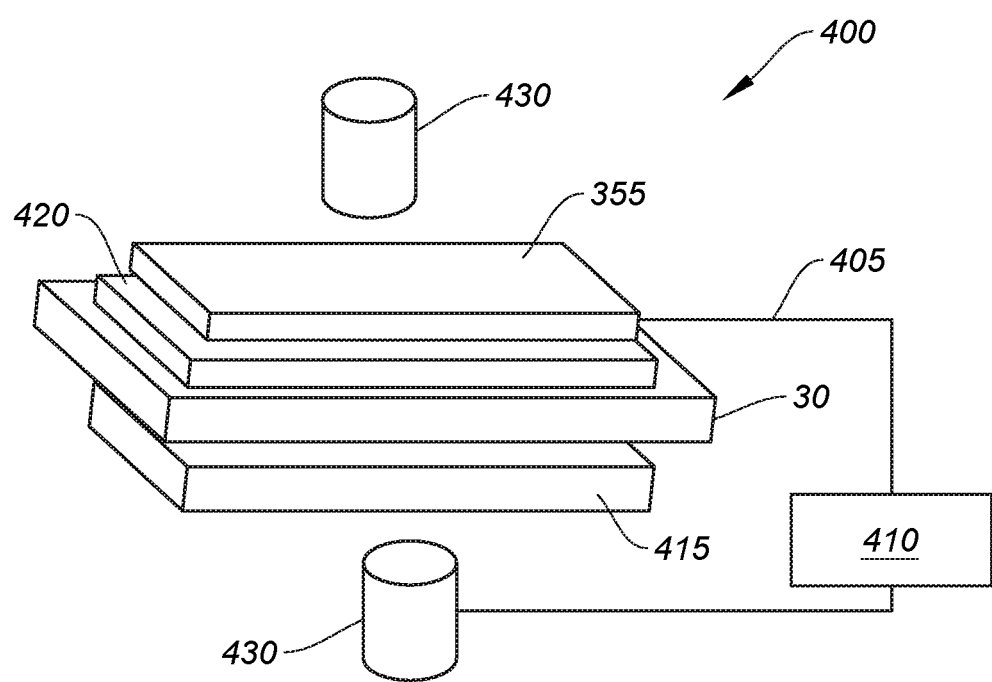
FIG. 43 is a schematic illustration of the use of a composite article described below in Invention Example 49 comprising a dry DL-P arranged over a dry ECL, where electrical contact is made to a first dry ECL by a platinum wire in electrical contact with the dry ECL and to a second dry ECL on an opposing surface of a dry PL.

FIG. 43 shows composite article 400 comprised of first dry ECL 415 that is contiguous with a planar surface (not shown) of dry PL 30; second dry ECL 420 that is contiguous with an opposing planar surface (not shown) of dry PL 30; and dry DL-P 355 that is contiguous with Ag electrode (second dry ECL) 420.

In Invention Example 49 (illustrated in FIG. 43), (b) particles (not shown) were incorporated into dielectric material composition to form a D-P composition that was applied contiguously to form dry PL 30 to provide dry DL-P 355 in the following manner.

Polybead-50 was added to provide (b) particles at 5 weight % to a solution of Butvar™ 76, 14 weight %, dissolved in ethyl alcohol. The resulting D-P composition was coated as described in other Inventive Examples contiguous to the Ag-electroded commercial PVDF dry PL 30 at a wet thickness of 22 µm. Small diameter platinum lead wire 405 was placed between Ag electrode (second dry ECL) 420 and dry DL-P 355 to provide electrical communication from Ag electrode (second dry ECL) 420 to external measurement system 410 for making measurements. Small platinum lead wire 405 allowed the collection of the generated charge from the surface of dry PL 30. Electrical continuity between small platinum lead wire 405 and Ag electrode 420 was verified by a resistance meter.

In Invention Example 50 illustrated in FIG. 44, composite article 425 has the same layer arrangement as composite article 400 illustrated in FIG. 43, but external measurement system 410 was differently arranged as described below.

TABLE XVI below provides the weight % composition of dry DL-P 355. TABLE XVII below provides the dry weight % composition of dry DL-P 355 after formation on first dry ECL 415. TABLE XVIII below defines the composite article layer stack as dry DL-P/dry ECL/dry PL/dry ECL (reference numbers 355/420/30/415).

TABLE XVI

| Invention Example | Solid weight % of (a) Silver particles | Solid weight % of dielectric material | Solid Weight % of (b) Particles | Weight % of (d) Solvent Medium | (b) Particles d50 (µm) | (b) to (a) Weight Ratio | Type of (b) Particles |
|---|---|---|---|---|---|---|---|
| 49 | 0 | 14.2 | 0.75 | 85 | 46 | 0.07 | 5 weight % of spherical crosslinked poly(styrene-co-divinyl benzene-co-ethylvinyl benzene (Polybead-50) |

TABLE XVII

| Invention Example | Solid weight % of (a) Silver particles | Solid weight % of dielectric material | Solid Weight % of (b) Particles | (b) Particles d50 (µm) | Type of (b) Particles |
|---|---|---|---|---|---|
| 49 | 0 | 95 | 5 | 46 | 5 weight % of spherical crosslinked poly(styrene-co-divinyl benzene-co-ethylvinyl benzene (Polybead® 50) |

TABLE XVIII

| Invention Example | D-P Composition | TABLE XVI Composition | Dry ECL/dry PL/dry ECL Material | DL-P Wet Thickness (µm) |
|---|---|---|---|---|
| 50 | 5 weight % of spherical crosslinked poly(styrene-co-divinyl benzene-co-ethylvinyl benzene (Polybead® 50) in Butvar™ 76 | 49 | 28 µm PVDF; Ag-electroded (1-1004346-0 TE Connectivity) | 22 |

The piezoelectric charge constant $d_{33}$ of composite article 400 in Invention Example 49 (FIG. 43) was measured using the Berlincourt method by making electrical contact with small platinum lead wire 405 that was contiguous with second dry ECL 420 and dry DL-P 355, and a second electrical contact was made on first dry ECL 415 that was contiguous with the opposing surface (not shown) of dry PL 30 using one of two stainless steel anvils 430 in a Berlincourt apparatus. These connections allowed direct collection of the charge generated in dry PL 30 by electrical contact with first dry ECL 415 and second dry ECL 420 that was in electrical communication with small platinum lead wire 405 where charge was collected at the surface of the Ag-electroded (second dry ECL 420) PVDF PF 30.

In Invention Example 50 (FIG. 44), the piezoelectric charge constant $d_{33}$ of composite article 425 was measured using the Berlincourt method by making electrical contact with dry DL-P 355 using both stainless steel anvils 430. Electrical contact was made on the opposing surface (not shown) of dry PL 30 by a second of stainless steel anvils 430 in the measurement apparatus. There was no electrical contact to small platinum lead wire 405.

Data obtained from these measurements are recorded below in TABLE XIX.

TABLE XIX

| Invention Example | Dry ECL/dry PL/dry ECL Material | D-P Composition | Measurement configuration | Delta F (N) | d33 | d33-ref | Ratio |
|---|---|---|---|---|---|---|---|
| 49 | 28 μm PVDF; Ag-electroded (1-1004346-0 TE Connectivity) | 5 weight % of spherical crosslinked poly(styrene-co-divinyl benzene-co-ethylvinyl benzene (Polybead ® 50) in Butvar ™ 76 | FIG. 43 | 0.28 | 75.3 | 29.0 | 2.6 |
| 50 | 28 μm PVDF; Ag-electroded (1-1004346-0 TE Connectivity) | 5 weight % of spherical crosslinked poly(styrene-co-divinyl benzene-co-ethylvinyl benzene (Polybead ® 50) in Butvar ™ 76 | FIG. 44 | 0.22 | 46.6 | 34.1 | 1.37 |

Composite article 400 of Invention Example 49 (FIG. 43) having dry DL-P 355 showed enhanced $d_{33}$ response. Dry DL-P 355 was spatially positioned like an outermost dry protective overcoat. However, in other embodiments, a dry DL-P can be spatially located at any location wherein it is contiguous with at least one layer within the composite article. The discussion provided above along with various illustrations in the various figures provide guidance as to other suitable arrangements of a dry DL-P according to the present invention.

Figure 44:
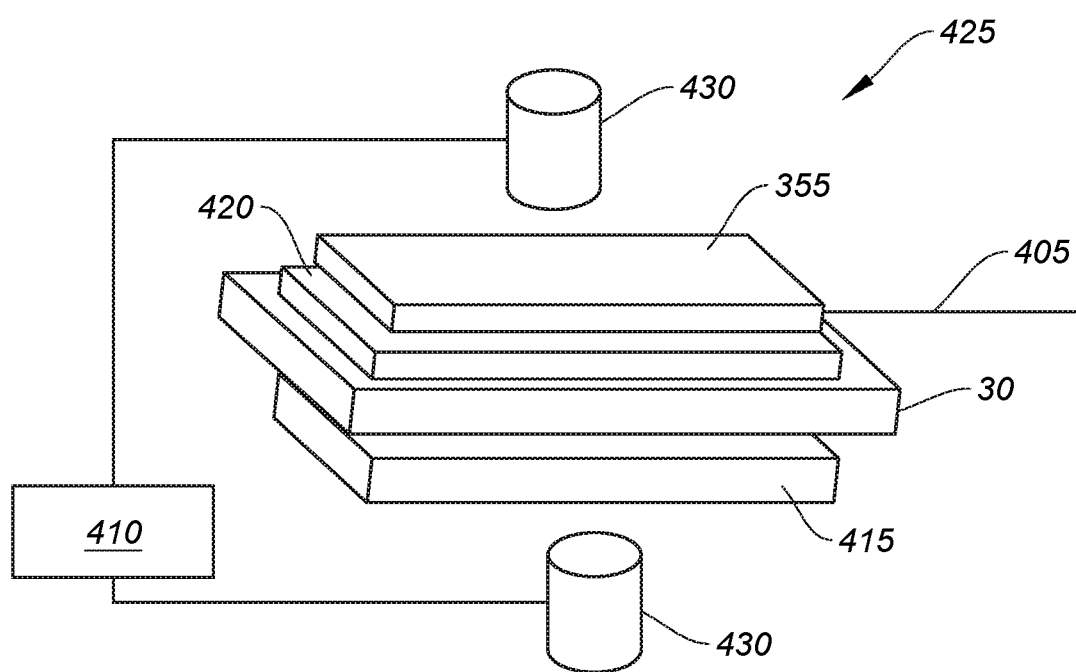
FIG. 44 is a schematic illustration of the use of a composite article described below in Invention Example 50 comprising a dry DL-P arranged over a first dry ECL, where a complete circuit is made by contacting the dry DL-P on one surface and on a surface of a second dry ECL.

Surprisingly, the composite article of Invention Example 50 where the $d_{33}$ response was measured through dry DL-P 355 as illustrated in the configuration shown in FIG. 44, exhibited an enhanced $d_{33}$ response. Without wishing to be bound by theory, the unexpected enhancement in the $d_{33}$ response of composite article 425 of Invention Example 50 suggests that useful image charges can be generated in the dry DL-P.

The enhanced $d_{33}$ responses of a composite article according to the present invention, measured in the two different measurement configurations shown in FIGS. 43 and 44 demonstrate that the position of a dry DL-P is not limited.

Another method can be used to provide non-uniformity in mechanical strain at a PL and its surface including patterning or printing onto the surface of the PL discrete features of a material having a Young's modulus different from that of the PL itself. This method can be carried out using patterns of either conductive materials or non-conductive materials to form a desirable composite article. In the embodiments where conductive materials are patterned, the conductive materials can be the necessary electrical contact to have electrical communication with the PL if they are patterned in a way that is consistent with electrical continuity as understood by someone skilled in the art of electrode design. In the embodiments where non-conductive materials or dielectric materials are used, it would then be necessary to also include an ECL or ECL-P in the article or device to provide electrical communication with the PL for utility. When no (b) particles are present, such as in an ECL, the ECL Young's modulus is different from that of the patterned material by ±10% (as defined above). In addition, the Young's modulus of the PL is different from that of the patterned material by ±10% (as defined above). However, the ECL and PL can have the same or different Young's moduli.

Figure 47B:
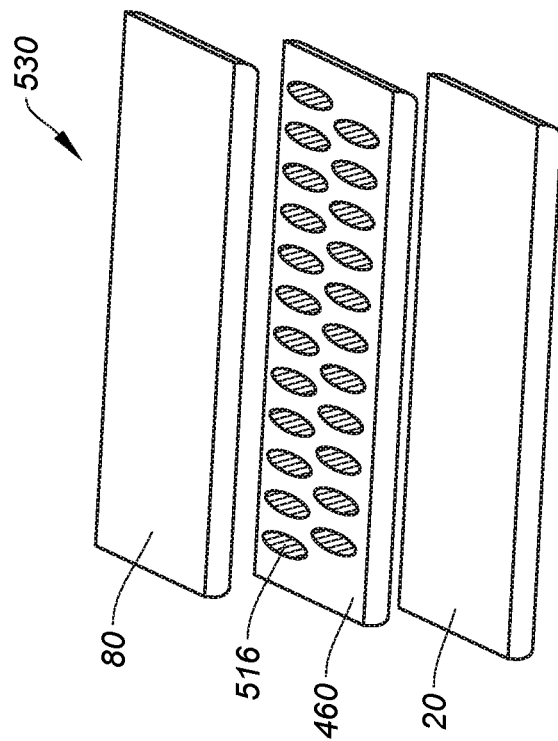
FIGS. 47A and 47B are schematic illustrations of articles described below having patterned dielectric layers that are contiguous with a PL and ECL.
Figure 47A:
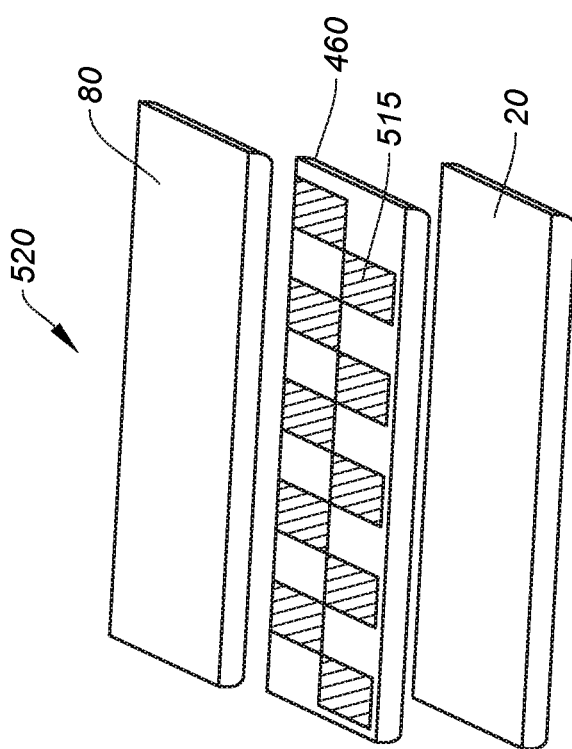

Two exemplary embodiments of such a composite article are shown in FIGS. 47A and 47B wherein different exemplary dielectric patterns are contiguous with a PL and an ECL. In FIG. 47A, composite article 520 is shown with one side or surface of PL 460 disposed contiguously with patterned dielectric layer 515 that is illustrated as a checkerboard pattern comprised of squares with dimensions on the order of 20×20 μm with a height of 1 μm, but the same or different patterns can have different area and height dimensions. Patterned dielectric layer 515 is also contiguous with second ECL 80. Additionally, exposed areas (areas having no patterned material) of PL 460 can be optionally contiguous with second ECL 80. The opposing side or surface of PL 460 is contiguous and in contact with ECL 20.

In FIG. 47B, composite article 530 is shown with one side of surface of PL 460 disposed contiguously with patterned dielectric layer 516 that is illustrated as a pattern of ellipses with dimensions on the order of 14×54 μm with a height of 1 μm. The pitch of the ellipses within a row is 96 μm and the pitch between the two rows of ellipses is 60 μm. The ellipses in each row are offset by 38 μm to form a two-dimensional cubic close packed pattern. This pattern is, of course, illustrative only, and other similar patterns of different dimensions and arrangements can be disposed on a PL. Patterned dielectric layer 516 is contiguous with second ECL 80. Additionally, exposed areas (areas having no patterned material) of PL 460 can be optionally contiguous with second ECL 80. The opposing side or surface of PL 460 is contiguous and in contact with ECL 20.

Without wishing to be bound to a particular theory, it is believed that a patterned dielectric layer as illustrated in FIGS. 47A and 47B can function similarly to the b) particles as described above for the several inventive composite articles. When the Young's modulus of a patterned dielectric layer that is disposed contiguously with a PL is different from the Young's modulus of the PL itself, then non-uniform stress can be generated in the PL upon application of an external force. Additionally, the Young's modulus of the patterned dielectric layer must be different from that of each ECL in order to generate non-uniform stress at the PL. The Young's modulus of the patterned dielectric layer should be different independently from that of the PL and each ECL by at least 10%.

While such embodiments are not explicitly illustrated herein, it is also possible to use one or more ECL-P's in such composite articles containing a patterned dielectric layer in place of one or more ECL's.

Examples 51 and 52

Composite articles using the patterned dielectric layers shown in FIGS. 47A and 47B were prepared in the following manner:

A relief image was created in a commercially available Flexcel NX printing plate using standard conditions and processing chemistry, for example as described in U.S. Pat. No. 8,034,540B2 (Zwadlo) and U.S. Pat. No. 9,250,527 (Kidnie), the disclosures of both of which is incorporated herein by reference, for use to print a desired pattern of dielectric material. The checkerboard pattern illustrated in FIG. 47A and the ellipse pattern illustrated in FIG. 47B were printed using suitable relief images in such flexographic printing plates. A commercially available flexographic printer (IGT Printability Tester from IGT Testing Systems) was used to print each patterned layer of photopolymerizable monomer composition onto a commercially available poled PVDF substrate as the PL (1-1003352-0 TE Connectivity) using methods familiar to those skilled in the art of flexographic printing. The photopolymerizable monomer composition contained, by weight, 58.5% of pentaerythritol tetraacrylate, 29.2% of hexanediol diacrylate, 5.3% of IRGACURE® 907, 5.3% of IRGACURE® 184, and 1.8% of DAROCUR® TPO (Ciba, 2,4,6-trimethylbenzoyl-diphenyl-phosphineoxide) as described for example, in U.S. Patent Application Publications 2015/0322280 A1 (Jin et al.) and 2014/0327452 A1 (Petcavich et al.), the disclosures of both of which are incorporated herein by reference.

Each printed pattern of photopolymerizable monomer composition was photocured using a commercially available UV curing station (Fusion UV Curing, Systems Corp. Model MC6R) to form a patterned dielectric layer comprised of a clear UV-crosslinked acrylate polymer.

The composite article of Example 51 comprised a poled PVDF substrate and a flexographically printed checkerboard patterned dielectric layer of photopolymerized acrylate polymer disposed thereon. The composite article of Example 52 comprised a poled PVDF substrate with a patterned dielectric layer of photopolymerized acrylate polymer comprised of arranged rows of ellipses disposed thereon. In both Examples 51 and 52 the feature size of the patterned dielectric layer was 10-200 µm having a height of approximately 1 µm. The Young's modulus of the bare PVDF and the Young's modulus of the dry photopolymerized acrylate polymer composition was measured using nanoindentation methods to determine the hardness. Thus, the hardness of the flexographically printed photopolymerized acrylate polymer was 0.929±0.143 GPa and the hardness of the bare pre-poled PL comprised essentially of PVDF was 0.550±0.071 GPa.

The piezoelectric coefficients for the composite articles of Examples 51 and 52 were determined using the previously described Berlincourt measurement system and the same methods employed for evaluating Inventive Example 50. The $d_{33}$ piezoelectric charge coefficients determined by the Berlincourt measurement method were 108 pC/N at a delta force of 0.75 N for Example 51 having the checker board patterned dielectric layer 515, and 196 pC/N at a delta force of 0.51 N for Example 52 for the ellipses-containing patterned dielectric layer 516. The calculated ratio of the measured $d_{33}$ value over the reference d33 value was 2.55 and 4.2, respectively, for Examples 51 and 52.

The patterns that can be provided in such composite articles can include, but are not limited to, circles, squares, checker board, ellipses, stars, concentric circles, lines, crossed lines as in a grid pattern, crossed lines as in a hashed pattern, and any shapes or combination of shapes and lines that can be desired and applied by those skilled in the art of applying patterns to surfaces. Patterns can be applied using various printing articles and methods for their use, including, but are not limited to, flexographic printing plates and flexographic methods; lithographic printing plates and lithographic methods, and other deposition apparatus, articles, and methods that would be readily apparent to one skilled in the art (including articles and methods utilizing photolithographic masks). Correspondingly, the patterned features of, for example, UV-cured photopolymerized polymer compositions can include, but are not limited to, flexographic printing, gravure printing, ink jet printing, screen printing, and lithographic patterning or printing techniques. Those skilled in the art of applying patterns imagewise to surfaces will recognize that suitable patterns of materials meeting the modulus requirements for the dielectric layer described above can be formed by many different methods. A non-exhaustive exemplary list of such means includes the use of patterned thermally curable materials, compression molding of patterned layers, stamping of patterned layers and similar applique methods, photolithographic processes, and stenciling of patterned layers. Thus, although Examples 51 and 52 demonstrate the use flexographic printing plates to provide patterned dielectric layers comprised of photopolymerized polymers for generating non-uniform stress in a PL, the novel concept of providing non-uniform stresses in the PL is not limited to the use of dielectrics and other materials can be used to form the patterned layer providing that the material has suitable mechanical properties when compared with the PL and any electrically conductive layers that are present whether ECL or ECL-P.

Figure 48A:
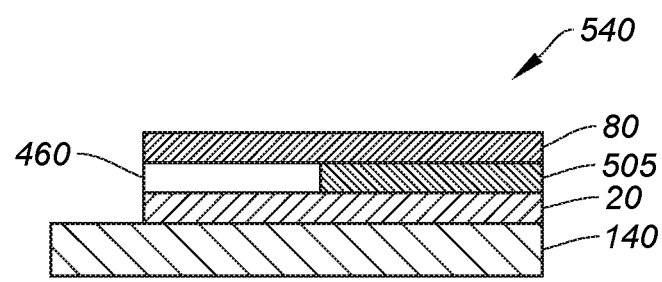
FIGS. 48A, 48B, and 48C are cross-sectional views of unimorph cantilever beams (devices) described below in Examples 51 and 52.

FIG. 48A is a cross-sectional view of a simple reference unimorph (or monomorph) cantilever beam 540 that is comprised of substrate 140, ECL 20, PL 460, insulator (or insulating layer) 505 and second ECL 80. Second ECL 80 is disposed over and in contact with one side of PL 460 and insulator 505. ECL 20 is in contact and contiguous with both substrate 140 and PL 460 as well as insulator 505. Insulator 505 and PL 460 are contiguous. The function of insulator 505 is to ensure that there is no electrical contact between ECL 20 and second ECL 80, and it can be composed of any material having suitable electrically insulating properties having a resistance greater than 1E7 ohms (10 Megaohms). Suitable insulating layers include inorganic insulators such as silicon oxide (made using CVD or PECVD with TEOS), silicon oxide based glasses, and organic insulators like Kapton polymers or Teflon based polymers. Other suitable materials include glass-ceramic composites, fiberglass composites, non-conductive epoxies, and insulating imagable materials such as epoxies photoresists like SU-8, polyimide photoresists and other materials that would be readily apparent to one skilled in the art from this teaching.

Figure 48B:
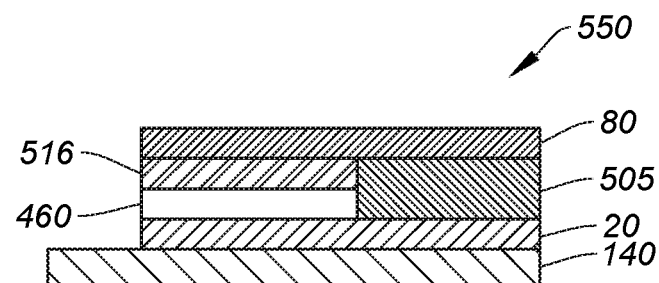

FIG. 48B is a cross-sectional view of a novel unimorph (or monomorph) cantilever beam 550 that is comprised of substrate 140, ECL 20, PL 460, patterned dielectric layer of ellipses 516 (see FIG. 47B) insulator 505, and second ECL 80. Second ECL 80 is disposed over and in contact with one side of patterned dielectric layer 516 and insulator 505. Patterned dielectric layer 516 is disposed over, contiguous to, and in contact with PL 460. ECL 20 is in contact with and contiguous to both substrate 140 and PL 460 as well as insulator 505. Insulator 505, patterned dielectric layer 516, and PL 460 are contiguous and proximate to one another. The function of insulator 505 is to ensure that there is no electrical contact between ECL 20 and second ECL 80.

Figure 48C:
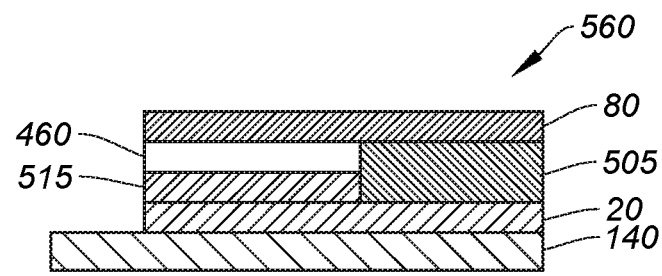

FIG. 48C is a cross-sectional view of inventive unimorph (or monomorph) cantilever beam 560 that is comprised of substrate 140, ECL 20, PL 460, checkerboard patterned dielectric layer 515 (see FIG. 47A), insulator 505, and second ECL 80. Second ECL 80 is disposed over and in contact with one side of PL 460 and insulator 505. Patterned dielectric layer 515 is disposed under, contiguous to, and in contact with PL 460. ECL 20 is in contact and contiguous with both substrate 140 and patterned dielectric layer 515 as well as insulator 505. Insulator 505, dielectric layer 515, and PL 460 are contiguous and proximate to one another. The function of insulator 505 is to ensure that there is no electrical contact between ECL 20 and second ECL 80.

Reference unimorph cantilever beam 540 and the unimorph cantilever beams 550 and 560 of Examples 53 and 54, respectively, all as inertial devices, were constructed using silver filled epoxy to form both ECL 20 and second ECL 80 and a commercially available glass cover slide (Corning Cover Glass, GlassWorks, 24 mm×60 mm) as shown in FIGS. 48A-C. PL 460 was comprised of poled PVDF. The combination of the PL 460 with either patterned dielectric layer 515 or 516 each of which is continuous with and in proximate to PL 460 was prepared according to Examples 51 and 52.

Reference unimorph cantilever beam 540 was prepared according to the layer cross-section shown in FIG. 48A. Support 140 was composed of a glass material over which ECL 20 was disposed and comprised of a thin coating of electrically conductive silver-based epoxy (MG Chemicals, Silver Conductive Epoxy 8331), with a hardness of 0.248±0.170 Gpa, that had been applied by blade coating; over which PL 460 was placed. The electrically-conductive silver-based epoxy was cured with the PL 460 in place. A layer of insulating Kapton film was applied in the area of exposed electrically-conductive silver-based epoxy to form insulator 505. Second ECL 80 comprised of a second layer of silver-based epoxy was then applied to PL 460 and insulator 505, and cured. Electrical contacts are made by securing electrical leads to each layer of electrically conductive silver-based epoxy.

Unimorph cantilever beam 550 of Example 53 was prepared according to the illustration of FIG. 48B in the same manner as reference unimorph cantilever beam 540 except that a combination of PL 460 with patterned dielectric layer 516 from Example 51 was used in place of PL 460 alone. Patterned dielectric layer 516 was positioned on PL 460 so that it was contiguous with PL 460, which is contiguous with ECL 20, that in this example, was an electrically-conductive silver-based epoxy, which in turn, is contiguous with substrate 140. In other words, patterned dielectric layer 516 was disposed to be facing towards second ECL 80 and to also face outwards and away from support 140. As noted above, printed dielectric layer 516 was a pattern of ellipses with dimensions on the order of 14×54 µm with a height of 1 µm.

Unimorph cantilever beam 560 of Example 54 was prepared according to the layer cross-section shown in FIG. 48C in the same manner as reference unimorph cantilever beam 540 except that a combination of PL 460 with dielectric layer 515 from Example 52 was used in place of PL 460 alone. Patterned dielectric layer 515 was positioned on PL 460 so that it was contiguous with PL 460, which is contiguous with second ECL 80 that in this example, was an electrically-conductive silver-based epoxy. In other words, patterned dielectric layer 515 was disposed to be facing towards ECL 20 and to also face inwards and towards support 140. As noted above, patterned dielectric layer 515 was a checker board pattern comprised of squares with dimensions on the order of 20×20 µm with a height of 1 µm.

The capacitance and resistance for unimorph cantilever beams 550 and 560 for Examples 53 and 54, respectively, and reference unimorph cantilever beam 540 was measured at 1 kHz with a Fluke PM6303A LCR meter and a Sencore LC102 Capacitor Inductor Analyzer as a low frequency measurement as described in more detail below, with the values provided below in TABLE XX.

Unimorph cantilever beam 540 and unimorph cantilever beams 550 and 560 described above in Example 53 and 54, respectively, were each brought into mechanical communication with a support like support 230 shown in FIG. 31B to form inertial piezoelectric devices and each unimorph cantilever beam structure was vibrated while measuring the electrical output of the respectively PL. The measurement system for characterizing the electrical characteristics of each unimorph cantilever beam was comprised of electrically insulating mounting block that is mechanically equivalent to support 230 of FIG. 31B, which was used to hold the beam that was mechanically fastened to a speaker cone driven by a voice coil (Parts Express model LW150-4). The electrical leads from each unimorph cantilever beam being tested were connected to binding post terminals to allow the charge generated by the respective PL to be measured by various instruments during vibrational excitation. The voice coil attached to the speaker cone was driven by an audio amplifier (Carver Professional model PT-2400) that was used to amplify the waveform from a waveform generator (Agilent model 33220A). The gain of the audio amplifier was held constant during all measurements and the amplitude and frequency of vibrational stimulus applied to each unimorph cantilever beam was controlled through the waveform applied to the amplifier. All waveforms used were symmetric sinusoidal waveforms with a 50% duty cycle. The measurement system was equipped with a camera and appropriate optics to allow observation of the oscillating motion of the beam as the voice coil was driven with sinusoidal waveforms.

Figure 49:
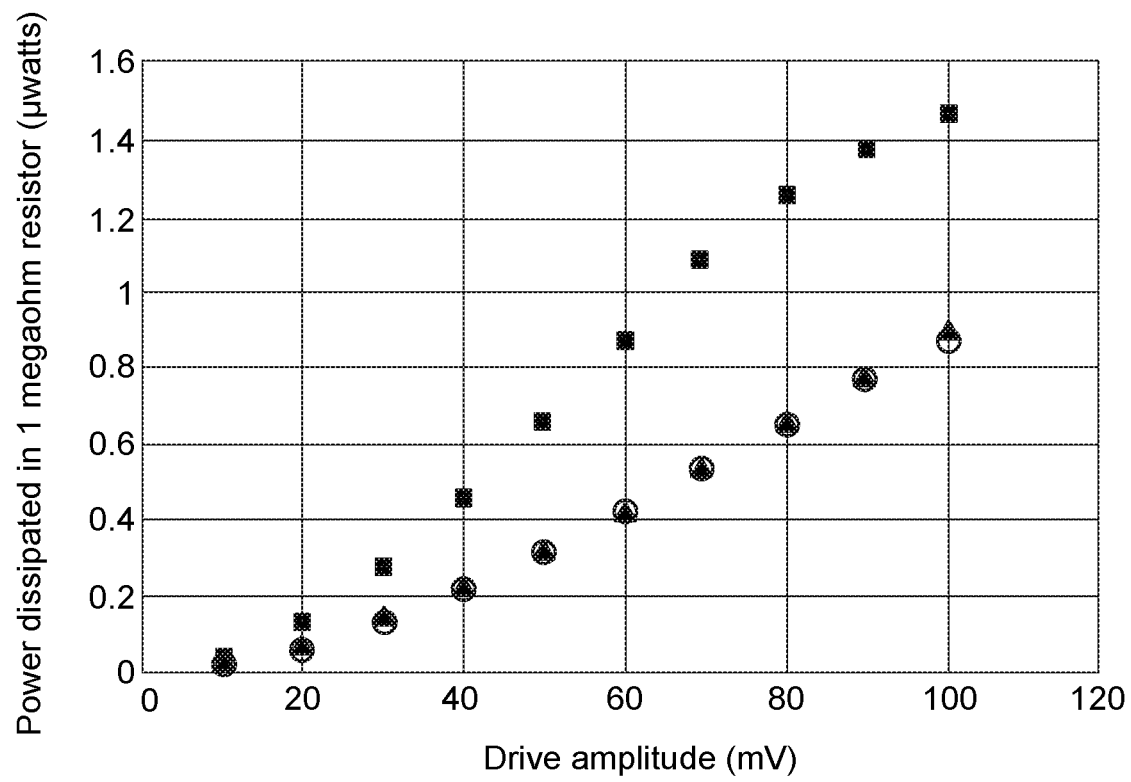
FIGS. 49, 50, and 51 are graphical representations of data obtained by evaluating the reference and novel unimorph cantilever beams (devices) according to Examples 51 and 52.
Figure 50:
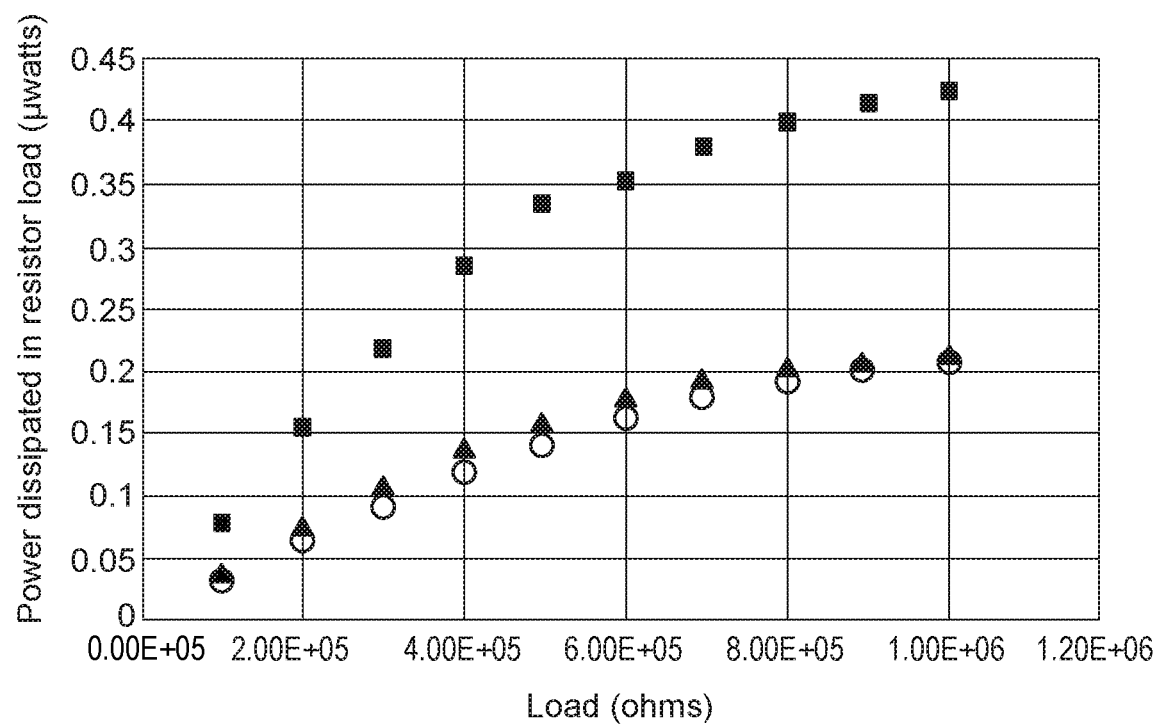

The resonance frequency of each unimorph cantilever beam was determined by two different measurements: 1) measurement of the maximum open circuit voltage as a function of voice coil drive frequency at constant amplitude of the driving waveform; and 2) the optical observation of maximum displacement amplitude of each unimorph cantilever beam as a function of voice coil drive frequency at constant amplitude of the driving waveform. The open circuit voltage generated by the vibrating beam was measured as a true RMS voltage using a digital volt meter with an impedance of 1 Megaohm (HP 3458A multimeter). The open circuit voltage at resonant frequency of reference unimorph cantilever beam 540, unimorph cantilever beam 550 of Example 51, and unimorph cantilever beam 560 of Example 52 at 100 mV drive amplitude were 0.871 $V_{rms}$, 1.34 $V_{rms}$, and 0.857 $V_{rms}$, respectively. The peak to peak output voltage of each unimorph cantilever beam under vibrational excitation was either calculated from the measured $V_{rms}$ or measured directly using a high impedance 1:1 amplifier (CoreTech Differential Isolation Amplifier model ISO-20-1V/V) and a digital storage oscilloscope (Tektronix TDS 2024B). The electrical power that can be extracted from the each unimorph cantilever beam during excitation was measured by connecting the output of each to a known resistive load and measuring the voltage drop across the load using a digital storage oscilloscope and a high impedance 1:1 amplifier. The mean power dissipated into the resistive load of the circuit is calculated by taking the mean value of the waveform of the instantaneous power derived from the voltage waveform using the relationship $P=V^2/R$ where V is the measured mean voltage across the resistive load. The unimorph cantilever beam response at the beam resonant frequency was characterized by measuring electrical power at a constant resistive load as a function of voice coil drive amplitude and additionally by measuring the electrical power at constant drive amplitude as a function of resistive load magnitude, as shown in FIGS. 49 and 50, respectively, wherein data for reference unimorph cantilever beam 540 are shown with dark triangles; data for unimorph cantilever beam 550 are shown with squares; and data for unimorph cantilever beam 560 are shown with circles.

Figure 51:
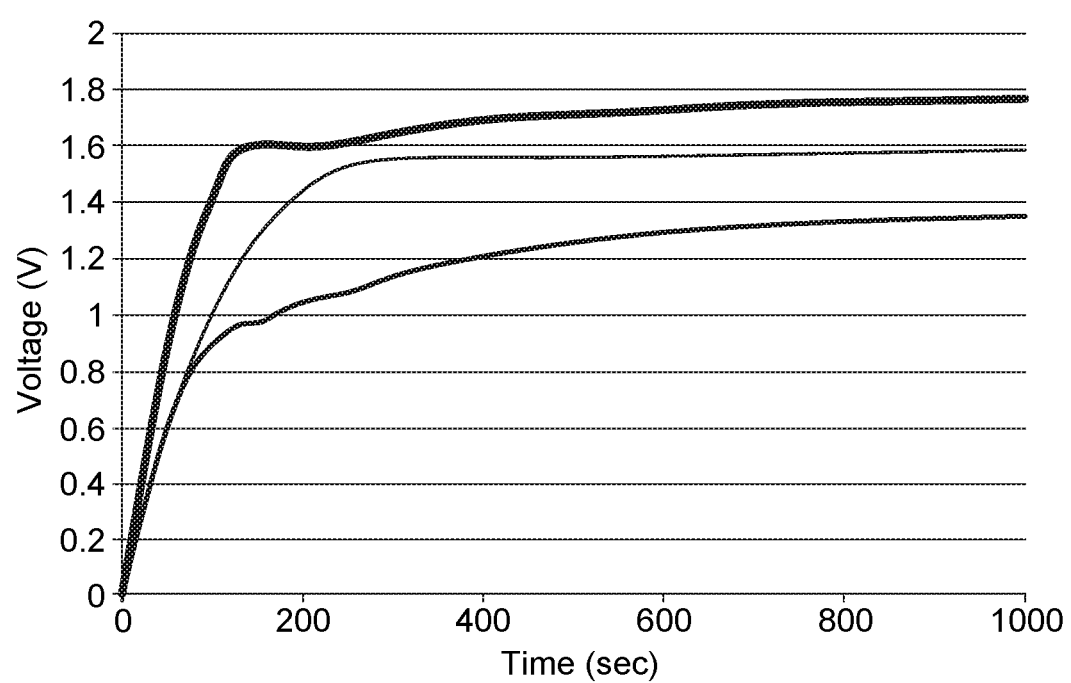

The performance of each unimorph cantilever beam for vibrational energy harvesting with capacitive energy storage was assessed by measuring a capacitor charging curve using a VS148 full wave rectifying diode bridge circuit and a known capacitance of 47 μfarads according to the methods described by Mao et al (*Adv. Energy Mater.* 2014, 1301624). The capacitor charging curve was obtained using the following method: the AC electrical output of each vibrating unimorph cantilever beam at mechanical resonance was applied to the input of the full wave rectifier bridge and the rectified DC electrical output was applied to a known capacitor that stored the generated electrical energy. The voltage across the capacitor as a function of time was measured with a high impedance preamplifier and a data acquisition system to acquire the capacitor charging curve as a function of time, and is shown in FIG. 51 for each of reference unimorph cantilever beam 540 (data shown with dark line), 550 for Example 53 (data shown with wide dark line), and 560 for Example 54 (data shown with light grey line). The maximum instantaneous power stored in the capacitor is related to the maximum slope of the capacitor voltage as a function of time curve and was determined by calculating the maximum value of the derivative of the capacitor charging curve. An improved cantilever beam vibrational energy harvester would show at least one of the following characteristics relative to reference uniform cantilever beam 540: 1) a larger voltage measured across the capacitor when the capacitor circuit has reached a steady state indicating that more energy has been stored in the capacitor; or 2) a decrease in the amount of time required to charge the capacitor to a given voltage indicating that the amount of energy per unit time stored in the capacitor has increased.

The previously described maximum instantaneous power in units of microwatts was taken as a relative measure of the amount of energy per unit time that was generated by unimorph cantilever beams 550 and 560 of Examples 53 and 54, respectively. TABLE XX below shows that unimorph cantilever beams 550 and 560 that performed as energy harvester inertial devices, exhibited improved performance relative to reference unimorph cantilever beam 540 as shown either by the superior open circuit voltage or superior instantaneous power generation.

Without wishing to be bound by theory, it is thought that the improved performance of the unimorph cantilever beams 550 and 560 used as energy harvesting inertial devices is attributed to the non-uniform strain generated by patterned dielectric layers 515 and 516, respectively, applied to PL 460 upon application of force, where the Young's modulus of the material comprising the each patterned dielectric layer was different from that of the PL by at least 10% (meaning 10% or more) and also different from that of the Young's modulus of each ECL by at least 10%. Those skilled in the art of cantilever beam vibrational energy harvesters will recognize that the results presented here demonstrate that the composite articles described in FIGS. 47A and 47B show novel and unexpected improvements in $d_{31}$ in addition to the improvement of $d_{33}$ as measured using the Berlincourt method. Thus, the use of patterned layers with different Young's modulus provides a method of improving both $d_{33}$ and $d_{31}$ piezoelectric charge coefficients of piezoelectric layers.

Those skilled in the art of vibrational energy harvesters will recognize that such useful patterned dielectric layers applied to piezoelectric layers can be easily generated on cantilever beam MEMS structures using known photolithographic methods employing suitable photosensitive resists such as, for example, SU-8 epoxy based resists, polyimide-based resists, and acrylate-based resists. The examples of energy harvesters, both inertial and kinetic that have been disclosed herein are intended to be non-restrictive. Further contemplated applications of patterned layers on a PL are contemplated to fall within the inventive scope of this disclosure.

The capacitance and resistance for unimorph cantilever beams 550 and 560 for Examples 53 and 54, respectively, and reference unimorph cantilever beam 540 were measured at 1 kHz with a Fluke PM6303A Automatic RCL meter and a Sencore LC102 Capacitor Inductor Analyzer as a low frequency measurement. As those skilled in the art of electrical measurements understand, the RCL meter automatically determines the dominant electrical behavior exhibited by the device under test and calculates the electrical parameters for the appropriate series or parallel arrangement of capacitive and resistive elements. All the unimorph cantilever beams exhibited the same RCL behavior when tested at 1 kHz with the Automatic RCL meter and the RCL values for each unimorph cantilever beam device under test were determined using an equivalent circuit model comprised of a capacitor and resistor in parallel. The values of the parallel capacitance and parallel resistance for each sample tested at 1 kHz are denoted in TABLE XX by the parameters Cp in units of picofarads (pF) and Rp in units of ohms (ohms), respectively. In TABLE XX below, the low frequency capacitance is given in units of picofarads (pF).

TABLE XX

|  | Sencore Analyzer Capacitance | Fluke PM6303A LCR Meter (Calculated Electrical Parameters at 1 kHz) | | Instant-aneous Power | Open Circuit Voltage |
| --- | --- | --- | --- | --- | --- |
|  | pF | Cp (pF) | Rp (ohms) | (μW) | ($V_{rms}$) |
| Example 53 | 1051 | 1001 | $6.37 \times 10^6$ | 0.62 | 1.34 |
| Example 54 | 751 | 716 | $8.10 \times 10^6$ | 0.31 | 0.857 |
| Reference | 1157 | 1104 | $6.40 \times 10^6$ | 0.27 | 0.871 |

The indentation modulus and indentation hardness of a patterned dielectric layer comprised of photopolymerized acrylate polymer, the PVDF piezoelectric polymer layer, and the silver filled epoxy layer used in Examples 53 and 54 were measured by nanoindentation methods. The nanoindentation behavior of each sample was studied using an MTS Nanoindenter XP produced by MTS Systems Cooperation, (Oak Ridge, Tenn.). Each sample was conditioned for 24 hours at 23° C./50% RH prior to testing. After this conditioning period, ten replicate load-displacement curves were generated for each sample using a Berkovich indenter obtained from MTS. A maximum load of 0.1 mN and a loading/unloading rate of 0.007 mN/second were used in all cases. A 30-second hold time was incorporated into the loading profile prior to unloading in order to allow time for the sample being tested to approach equilibrium. After each indentation experiment was completed, the Oliver and Pharr analysis method was used to determine an average indentation modulus and hardness value for each sample.

The silver-based epoxy and photopolymerized acrylate polymer (SPOC1) samples were coated on glass, and thus no additional sample preparation steps were necessary. The free-standing film of bare PVDF sample was glued to a quartz slide using a cyanoacrylate adhesive prior to measurement. Those skilled in the art of micromechanical characterization of materials recognize that the indentation modulus measured here is the elastic modulus or Young's modulus of a film as measured using nanoindentation techniques as described above.

TABLE XXI below presents a summary of the indentation modulus and the indentation hardness values obtained for the three noted samples. The data in TABLE XXI demonstrate that the average value of the Young's modulus of the polymer used to prepare the patterned dielectric layer in Examples 53 and 54 measured by a nanoindentation method is at least 10% different from the average value of the Young's modulus of the silver filled epoxy material used as the ECL in Examples 53 and 54 when all materials are measured by the same method. Additionally, the data in TABLE XXI demonstrate that the average value of the Young's modulus of the polymer used to prepare the patterned dielectric layer in Examples 53 and 54 measured by a nanoindentation method is at least 10% different from the average value of the Young's modulus of the PVDF PL used in Examples 53 and 54 when all materials are measured by the same nanoindentation method.

TABLE XXI

| Material Layer | Indentation Modulus (GPa) | Indentation Hardness (GPa) |
| --- | --- | --- |
| Silver-based Epoxy | 9.07 +/− 4.53 | 0.248 +/− 0.170 |
| Photopolymerized Acrylate Polymer (SPOC1) | 14.87 +/− 1.38 | 0.929 +/− 0.143 |
| Bare PVDF Film | 8.27 +/− 0.60 | 0.550 +/− 0.071 |

Composite articles according to such description illustrated in Examples 53 and 54 can be defined at least as comprising:

1) a first dry piezoelectric layer (first dry PL) comprising a piezoelectric material and having first and second opposing surfaces, and 2) one or more dry additional layers arranged contiguously with at least one of the first and second opposing surfaces of the first dry PL, wherein at least one dry additional layer is a patterned dry additional layer that has a Young's modulus that is different from the Young's modulus of the first dry piezoelectric layer by at least 10%.

In some embodiments, one or more dry additional layers are electrically-conductive dry additional layers (such as ECL's as described above), and the Young's modulus of the patterned dry additional layer can also be different from the Young's modulus of each electrically-conductive dry additional layer. First and second ECUs can be present in some embodiments, one or both being contiguous with the patterned dry additional layer.

Moreover, any of the one or more electrically-conductive dry additional layers can be an ECL-P as described above, comprising (b) particles as described above.

One or more of the dry additional layers can be electrically insulating, and comprise a dielectric material such as in an DL or DL-P as described above.

Such composite articles can further comprise a support as such materials as described above.

Each patterned dry additional layer can be disposed on at least one surface of the PL using suitable patterning means including but not limited to flexographic printing using suitable flexographic printing plates having relief images; or by using lithographic printing plates in lithographic printing methods. Any type of pattern can be provided as along as it provides non-uniform stress to the PL when physical force is applied.

The invention has been described in detail with particular reference to certain preferred embodiments thereof, but it will be understood that variations and modifications can be effected within the spirit and scope of the invention.

PARTS LIST 10 composite article
15 composite article
20 dry electrically-conductive layer (dry ECL)
25 dry electrically-conductive layer dry (ECL-P)
30 dry piezoelectric layer (dry PL)
35 (b) particles
40 composite article
45 composite article
50 second dry electrically-conductive layer (second dry ECL-P)
55 (b) particles
60 composite article
65 composite article
70 composite article
75 composite article
80 second dry electrically-conductive layer (second dry ECL)
85 composite article
90 composite article
95 composite article
100 composite article
105 composite article
110 composite article
115 composite article
120 composite article
125 composite article
130 outermost dry protective layer
135 composite article
140 substrate
145 composite article
150 dry dielectric layer (dry DL-P)
155 second dry dielectric layer (second dry DL-P)
159 electromechanical model
160 spring
165 dashpot
170 piezoelectric material
175 support
180 electrodes
185 mass
190 external electrical circuit load 195 kinetic (or kinematic) piezoelectric device
200 direct applied force
205 inertial piezoelectric device
210 secondary inertial applied force
215 mechanical assembly
220 inertial piezoelectric device
225 tip mass
230 support means
235 inertial piezoelectric device
240 clamping mechanism support
245 piezoelectric capacitor
250 electrical communication means
255 diode bridge
260 diode
265 diode
270 diode
275 diode
280 energy storage device
285 energy storing rectifying circuit
290 electrical switches
300 force-sensitive touch display
305 capacitive touch sensor
310 force sensing backplane
315 signal processing electronics
320 resistive touch sensor
325 force-sensitive touch display
330 composite article
335 non-electrically-connected co-planar patterned electrodes
340 non-electrically-connected co-planar patterned electrodes
345 substrate
350 piezoelectric layer (dry PL)
355 dry dielectric layer (dry DL-P)
360 opposing surface
365 composite article
370 planar surface
375 dielectric material
378 opposing surface
380 composite article
385 opposing planar surface
390 non-electrically-connected co-planar electrode with (b) particles
395 non-electrically-connected co-planar electrode with (b) particles
400 composite article
405 small platinum lead wire
410 external measurement system
415 first dry electrically-conductive layer (first dry ECL)
420 second dry electrically-conductive layer (second dry ECL)
425 composite article
430 stainless steel anvils
440 composite article
445 non-electrically-connected co-planar patterned electrode
450 non-electrically-connected co-planar patterned electrode
455 opposing surface
460 dry piezoelectric layer (dry PL)
465 composite article
470 non-electrically-connected co-planar patterned electrode
475 non-electrically-connected co-planar patterned electrode
480 opposing surface
485 dry piezoelectric layer (dry PL)
505 insulator (or insulating layer)
515 patterned dielectric layer (having checker board pattern)
516 patterned dielectric layer (having pattern of ellipses)
520 composite article
530 composite article
540 reference unimorph cantilever beam
550 unimorph cantilever beam
560 unimorph cantilever beam

The invention claimed is:

1. A composite article comprising:
   1) a first dry piezoelectric layer (first dry PL) comprising a piezoelectric material and having first and second opposing surfaces, and
   2) a pair of non-electrically-connected co-planar patterned electrodes that are arranged contiguously with at least one of the first and second opposing surfaces of the first dry PL, each of the pair of non-electrically-connected co-planar patterned electrodes consisting essentially of:
      (a) an electrically-conductive material; and
      (b) particles distributed within the (a) electrically-conductive material, the (b) particles having a Young's modulus that is different from the Young's modulus of the (a) electrically-conductive material by at least 10%, and which (b) particles have a d50 of at least 500 nm and up to and including 500 μm and a polydispersity coefficient of less than or equal to 3, provided that the weight ratio of the (b) particles to the (a) electrically-conductive material is at least 0.01:1 and up to and including 10:1, and
   provided that:
   when each of the pair of non-electrically-connected co-planar patterned electrodes is arranged adjacent to an insulating substrate, it exhibits a resistivity of less than 10,000 ohms-cm, and
   optionally, each of the pair of non-electrically-connected co-planar patterned electrodes further includes (c) a binder material that is non-electrically-conductive and has a weight average molecular weight of at least 5,000.

2. The composite article of claim 1, wherein the (a) electrically-conductive material comprises particles having a median equivalent spherical volume diameter of at least 1 nm and up to and including 1000 μm and a polydispersity coefficient that is less than or equal to 2.

3. The composite article of claim 1, wherein the (a) electrically-conductive material comprises one or more of silver, gold, platinum, palladium, copper, nickel, titanium, and an electrically-conductive form of carbon.

4. The composite article of claim 1, wherein the (a) electrically-conductive material is an electrically-conductive organic polymer.

5. The composite article of claim 1, wherein the (a) electrically-conductive material consists essentially of silver nanoparticles having a d50 of less than or equal to 60 gm and a d90 of less than or equal to 500 μm and a polydispersity that is less than or equal to 1.

6. The composite article of claim 1, wherein when each of the pair of non-electrically-connected co-planar patterned electrodes is arranged contiguously with an insulating substrate, it exhibits a resistivity of less than 500 ohm-cm.

7. The composite article of claim 1, wherein the (a) electrically-conductive material is present in an amount of at least 2 weight % and up to and including 99 weight %, based on the total weight of each of the pair of non-electrically-connected co-planar patterned electrodes.

8. The composite article of claim 1, wherein the (b) particles are composed of one or more polymeric materials.

9. The composite article of claim 1, wherein the (b) particles are composed of one or more inorganic materials.

10. The composite article of claim 1, wherein the (c) binder material is present and comprises one or more polyurethanes, acrylate polymers, polyvinyl acetals, or polyacrylate precursors to an acrylate polymer.

11. The composite article of claim 1, wherein the (c) binder material is present in an amount of at least 0.1 weight % and up to and including 10 weight %, based on the total weight of the at least one dry ECL-P.

12. The composite article of claim 1, further comprising an insulating substrate and the pair of non-electrically-connected co-planar patterned electrodes are arranged contiguously between the insulating substrate and the first dry PL.

13. The composite article of claim 12, further comprising a first dry electrically-conductive layer containing no (b) particles (first dry ECL), which first dry ECL is arranged contiguously with the second opposing surface of the first dry PL.

14. The composite article of claim 13, further comprising a first dry electrically-conductive layer containing (b) particles (first dry ECL-P) that is arranged contiguously with the first dry ECL that is arranged contiguously with the second opposing surface of the first dry PL.

15. The composite article of claim 1, further comprising dielectric material arranged in the same plane as and between the pair of non-electrically-connected co-planar patterned electrodes.

16. The composite article of claim 1, wherein the (b) particles have a polydispersity coefficient that is less than or equal to 1.5.

17. The composite article of claim 1, wherein the (b) particles have a polydispersity coefficient that is less than or equal to 1.25.

18. The composite article of claim 1, wherein the first dry PL comprises beta phase polyvinylidene fluoride.

19. The composite article of claim 1, further comprising a second dry piezoelectric layer (second dry PL) comprising a piezoelectric material, which is arranged contiguously with an electrically-conductive layer or a pair of non-electrically-connected co-planar patterned electrodes that are arranged between the first dry PL and the second dry PL.

* * * * *